US008448097B2

(12) United States Patent
Dai et al.

(10) Patent No.: US 8,448,097 B2
(45) Date of Patent: May 21, 2013

(54) HIGH PERFORMANCE DRC CHECKING ALGORITHM FOR DERIVED LAYER BASED RULES

(75) Inventors: Zuo Dai, Ottawa (CA); Dick Liu, Saratoga, CA (US); Ming Su, Nepean (CA)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 13/211,211

(22) Filed: Aug. 16, 2011

(65) Prior Publication Data

US 2012/0144349 A1 Jun. 7, 2012

Related U.S. Application Data

(63) Continuation-in-part of application No. 12/960,086, filed on Dec. 3, 2010, now Pat. No. 8,352,887.

(51) Int. Cl.
*G06F 17/50* (2006.01)
*G06F 9/455* (2006.01)

(52) U.S. Cl.
USPC .............................. 716/52; 716/53; 716/112

(58) Field of Classification Search
USPC ............................................ 716/52, 53, 112
See application file for complete search history.

(56) References Cited

U.S. PATENT DOCUMENTS

| | | | |
|---|---|---|---|
| 4,599,722 A | 7/1986 | Mortimer | |
| 4,997,786 A | 3/1991 | Kubota et al. | |
| 6,285,957 B1 | 9/2001 | Tanaka et al. | |
| 6,330,704 B1 | 12/2001 | Ljung et al. | |
| 6,353,801 B1 | 3/2002 | Sercu et al. | |
| 6,606,586 B1 | 8/2003 | Ishikawa | |
| 6,826,517 B2 | 11/2004 | Okada et al. | |
| 6,895,344 B2 | 5/2005 | Ramaswamy | |
| 6,895,372 B1 | 5/2005 | Knebel et al. | |
| 7,124,069 B2 | 10/2006 | Meuris et al. | |
| 7,149,666 B2 | 12/2006 | Tsang et al. | |
| 7,197,729 B2 | 3/2007 | Batterywala | |
| 7,260,797 B2 | 8/2007 | Batterywala et al. | |

(Continued)

OTHER PUBLICATIONS

Pending U.S. Appl. No. 13/211,211, filed Aug. 16, 2011, High Performance DRC Checking Algorithm for Derived Layer Based Rules, Zuo Dai et al.
A. Kuehlmann, Basic Geometry Processing and LVS, Slides for EECS 244, University of California at Berkeley (2005) 31pp.
Silvaco, Application of Scan Line Methodology to Perform Metric Operations in DRC, The Simulation Standard, vol. 8 No. 12 (1997) pp. 7-9.

(Continued)

*Primary Examiner* — Suresh Memula
(74) *Attorney, Agent, or Firm* — Haynes Beffel & Wolfeld LLP; Warren S. Wolfeld

(57) ABSTRACT

Roughly described, a design rule data set includes rules on derived layers. The rules are checked by traversing the corners of physical shapes, and for each corner, populating a layout topology database with values gleaned from that corner location, including values involving derived layers. After the layout topology database is populated, the values are compared to values in the design rule data set to detect any design rule violations, including violations of design rules defined on derived layers. Violations are reported in real time during manual editing of the layout. Preferably corner traversal is performed using scan lines oriented perpendicularly to edge orientations, scanning in the direction of the edge orientations. Scans stop only at corner positions on physical layers, and populate the layout topology database with what information can be gleaned based on the current scan line, including information about derived layers. The scans need not reach corners simultaneously.

77 Claims, 28 Drawing Sheets

U.S. PATENT DOCUMENTS

| | | | |
|---|---|---|---|
| 2002/0002683 A1 | 1/2002 | Benson et al. | |
| 2002/0040466 A1 | 4/2002 | Khazei | |
| 2002/0142149 A1 | 10/2002 | Nakashima et al. | |
| 2004/0268287 A1 | 12/2004 | Toh | |
| 2005/0120316 A1 | 6/2005 | Suaya et al. | |
| 2005/0198599 A1 | 9/2005 | Sercu et al. | |
| 2005/0251771 A1* | 11/2005 | Robles | 716/5 |
| 2006/0053394 A1 | 3/2006 | Batterywala et al. | |
| 2008/0005713 A1* | 1/2008 | Singh et al. | 716/11 |

OTHER PUBLICATIONS

Pending U.S. Appl. No. 12/609,996, filed Oct. 30, 2009, Method and Apparatus for Legalizing a Portion of a Circuit Layout, Shabbir H. Batterywala et al.

Pending related U.S. Appl. No. 12/960,086, filed Dec. 3, 2010, High Performance Design Rule Checking Technique, Zuo Dai et al.

* cited by examiner

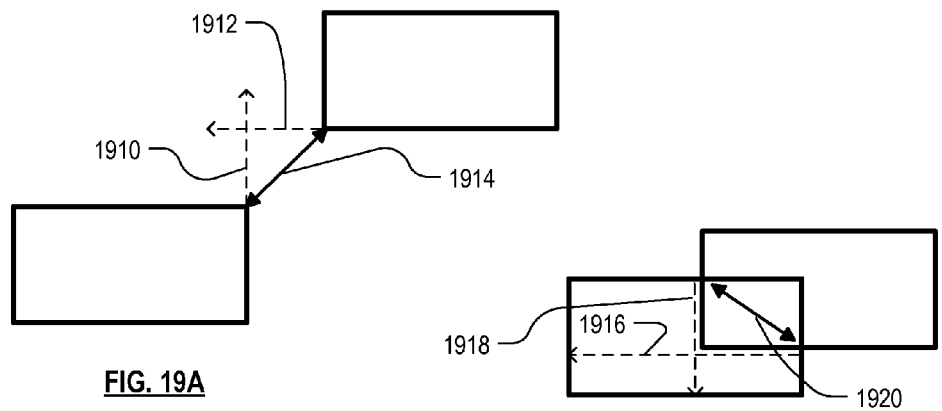
FIG. 19A
FIG. 19B
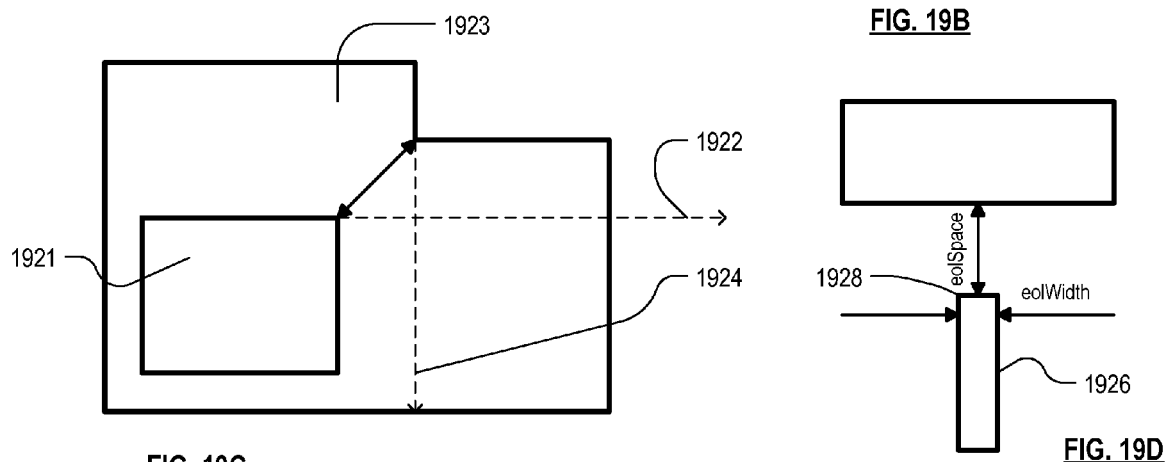
FIG. 19C
FIG. 19D
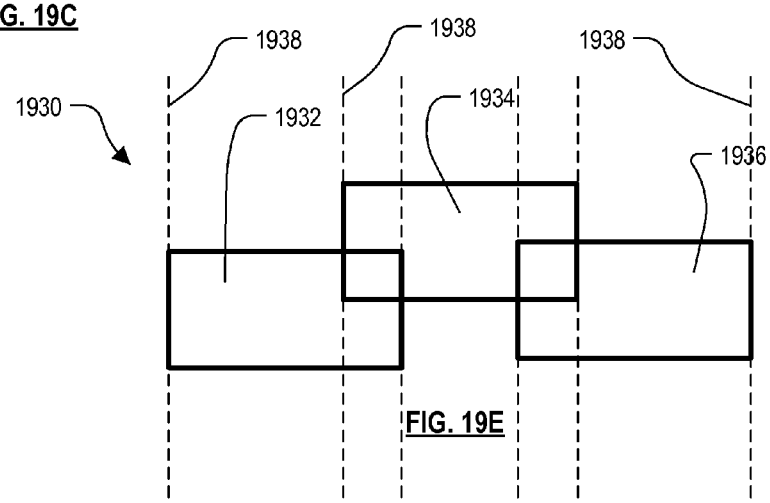
FIG. 19E

HIGH PERFORMANCE DRC CHECKING ALGORITHM FOR DERIVED LAYER BASED RULES

CROSS-REFERENCE TO OTHER APPLICATIONS

This is a Continuation-in-Part of U.S. application Ser. No. 12/960,086, filed 3 Dec. 2010, entitled High Performance Design Rule Checking Technique. The parent application is incorporated herein by reference in its entirety.

BACKGROUND

The invention relates to electronic design automation, and more particularly, to methods and apparatuses for rapid checking of design rules in a circuit layout.

Advancements in process technology have impacted integrated circuit manufacturing in at least two key ways. First, scaling of device geometry achieved through sub-wavelength lithography has facilitated packing more devices on a chip. Second, different process recipes have enabled manufacturing of heterogeneous devices with different threshold and supply voltages on the same die. A consequence of these improvements, however, has been an explosion in the number of design rules that need to be obeyed in the layout. Instead of simple width and spacing rules, modern fabrication technologies prescribe complex contextual rules that have to be obeyed for manufacturability.

The increase in the number of rules has complicated the task of creating design rule clean layouts, i.e., layouts that do not have design rule violations, Creating design rule clean layouts for digital circuit designs can be facilitated by the use of standard cell layouts as building blocks, and placement and routing tools that are extended to address the design rules.

Unfortunately, this approach usually does not work for analog. RF and custom circuit designs. Layouts for such designs are typically created manually using layout editors, and because of the number and complexity of the design rules, checking them was a laborious process.

A conventional design rule check (DRC) system requires a powerful two-dimensional geometry engine which supports geometric operations such as Boolean operations like AND, OR, NOT, XOR; sizing operations like grow/shrink horizontal/vertical/diagonal; other operations like merge, shift, flip, cut, smooth; as well as all-angle geometry for true Euclidean distance calculations. Individual rules are typically checked individually over an entire layout region. This is also true of individual rule values of same rule (e.g. a check against the minimum value for a rule, and another check against a preferred value for the same rule). Each check basically runs an independent sequence of geometry operations, and numerous passes through the layout region are required.

For example, a conventional series of operations to check a minimum spacing rule in a Manhattan only layout, might include steps of
Merge all same layer shapes into separate islands;
Grow all islands by half the minimum spacing value;
Perform an AND (intersection) operation among the islands; and
Draw DRC violation markers based on the resulting shapes of the AND operation.
As another example, a conventional series of operations to check a minimum width rule in a Manhattan only layout, might include steps of
Merge all same layer shapes into separate islands;
Shrink all islands by (half the minimum width value epsilon)
Eliminate all resulting islands of zero area;
Grow back the resulting islands by (half the minimum width value+epsilon);
Perform a NOT operation between the original merged islands and grown back islands; and
Draw DRC violation markers based on the shapes resulting from the NOT operation.

So long as a good geometry engine is available, the conventional DRC techniques are simple to code, at least for simple rules. They are also flexible and powerful if the geometry engine has a scripting API for relevant geometry operations, and it is relatively straightforward to massively parallelize the DRC process among numerous CRUs.

On the other hand, it can be seen that checking even simple design rules like those above is extremely expensive computationally. Massive parallelization usually is possible only for offline checks, which typically are performed only between layout iterations. Even then they often can require hours to complete. The conventional approach also suffers from roughly linear growth of the total run time with respect to the number of rules to be checked, with multiple values for a rule counted as separate rules. This makes it very hard to reduce the total run time without turning off selected rules. The conventional approach also suffers from linear growth of run time for individual rule checks, with respect to the length of the geometry operation sequence, i.e., the complexity of the rule. The conventional approach also involves separate checks for Euclidean measurements, and also requires extensive education and training in order to optimize the performance of the customer scripts.

The conventional approach becomes even more intensive at more advanced technology nodes, where many design rules are partially or fully defined on derived layers. Derived layers are not part of the layout itself, but rather are virtual layers defined by the design rule data set in order to simplify the statement of certain design rules. The design rule data set typically contains a derivation operator for each derived layer, that defines how to derive the shapes in the derived layer from the shapes in one or more parent layers. Derived layers are calculated by the design rule checker as part of the process of checking the design rules that reference them. Derived layers can even be defined recursively (i.e. one or more parent layers are themselves derived layers), rendering design rule checking at these technology nodes even more computationally intensive.

The manual layout editing process could be drastically facilitated if design rule checking could be performed in real time, that is, immediately after each geometric manipulation made by the designer. While some layout editors are able to do this, the checking can be sluggish and usually works only when some of the design rules are turned off.

SUMMARY

A need therefore exists for a robust solution to the problem of rapid checking of design rules during a layout editing process.

Most design rules defined on derived layers can be checked based only on corner positions of ancestor physical layers. Therefore, roughly described, a design rule data set which includes rules defined on derived layers is developed offline based on the design rules of a target fabrication process. A design rule checking method then involves traversing the corners of physical shapes in a subject layout region, and for each physical corner, populating a layout topology database with values that depend on the respective corner locations, including values involving derived layers. After the layout topology database has been populated, the values are compared to values in the design rule data set, including values in design rules defined on derived layers, to detect any violations of design rules. Any violations can be reported to a user in real time, while the user is manually editing the layout.

Preferably corner traversal is performed using scan lines oriented perpendicularly to edge orientations, and scanning in the direction of the edge orientations. Scans stop only at physical corner positions and populate the layout topology database with what information can be gleaned based on the current scan line, including information about derived layers. The different scans need not reach each corner simultaneously.

The above summary of the invention is provided in order to provide a basic understanding of some aspects of the invention. This summary is not intended to identify key or critical elements of the invention or to delineate the scope of the invention. Its sole purpose is to present some concepts of the invention in a simplified form as a prelude to the more detailed description that is presented later. Particular aspects of the invention are described in the claims, specification and drawings.

BRIEF DESCRIPTION OF THE DRAWINGS

The invention will be described with respect to specific embodiments thereof, and reference will be made to the drawings, in which:

FIGS. 19A, 19B and 19C illustrate certain corner relationships between layout shapes.

FIG. 19D illustrates two layout shapes for the purpose of a particular design rule check.

FIG. 19E illustrates three layout shapes together forming an island.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not intended to be limited to the embodiments shown, but is to be accorded the widest scope consistent with the principles and features disclosed herein.

Overall Design Process Flow

Figure 1:
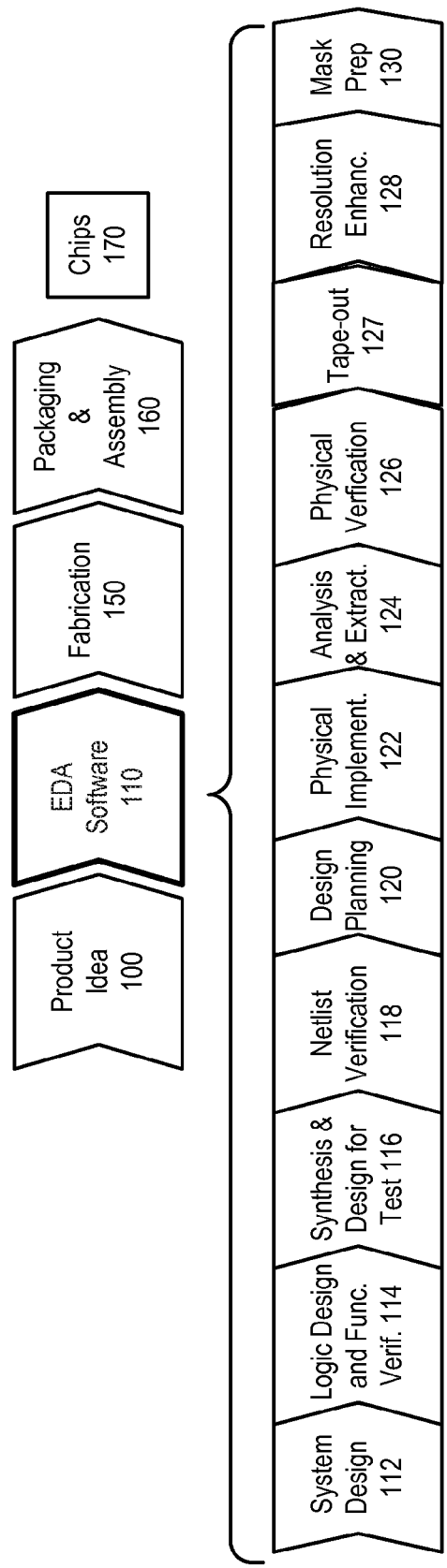
FIG. 1 shows a simplified representation of an illustrative digital integrated circuit design flow.

FIG. 1 shows a simplified representation of an illustrative digital integrated circuit design flow. At a high level, the process starts with the product idea (step 100) and is realized in an EDA (Electronic Design Automation) software design process (step 110). When the design is finalized, it can be taped-out (step 127). At some point after tape out, the fabrication process (step 150) and packaging and assembly processes step 160) occur resulting, ultimately, in finished integrated circuit chips (result 170).

The EDA software design process (step 110) is itself composed of a number of steps 112-130, shown in linear fashion for simplicity. In an actual integrated circuit design process, the particular design might have to go back through steps until certain tests are passed. Similarly, in any actual design process, these steps may occur in different orders and combinations. This description is therefore provided by way of context and general explanation rather than as a specific, or recommended, design flow for a particular integrated circuit.

A brief description of the component steps of the EDA software design process (step 110) will now be provided.

System design (step 112): The designers describe the functionality that they want to implement, they can perform what-if planning to refine functionality, check costs, etc. Hardware-software architecture partitioning can occur at this stage. Example EDA software products from Synopsys, Inc. that can be used at this step include Model Architect, Saber, System Studio, and DesignWare® products.

Logic design and functional verification (step 114): At this stage, the VHDL or Verilog code for modules in the system is written and the design is checked for functional accuracy. More specifically, the design is checked to ensure that it produces correct outputs in response to particular input stimuli. Example EDA software products from Synopsys, Inc. that can be used at this step include VCS, VERA, DesignWare®, Magellan, Formality, ESP and LEDA products.

Synthesis and design for test (step 116): Here, the VHDL/Verilog is translated to a netlist. The netlist can be optimized for the target technology. Additionally, the design and implementation of tests to permit checking of the finished chip occurs. Example EDA software products from Synopsys, Inc. that can be used at this step include Design Compiler®, Physical Compiler, DFT Compiler, Power Compiler, FPGA Compiler, TetraMAX, and Design Ware® products.

Netlist verification (step 118): At this step, the netlist is checked for compliance with timing constraints and for correspondence with the VHDL/Verilog source code, Example EDA software products from Synopsys, Inc. that can be used at this step include Formality, PrimeTime, and VCS products, Design planning (step 120): Here, an overall floor plan for the chip is constructed and analyzed for timing and top-level routing. Example EDA software products from Synopsys, Inc. that can be used at this step include Astro and Custom Designer products.

Physical implementation (step 122): The placement (positioning of circuit elements) and routing (connection of the same) occurs at this step. Example EDA software products from Synopsys, Inc. that can be used at this step include the Astro, IC Compiler, and Custom Designer products. Aspects of the invention can be performed during this step 122.

Analysis and extraction (step 124): At this step, the circuit function is verified at a transistor level, this in turn permits what-if refinement. Example EDA software products from Synopsys, Inc. that can be used at this step include AstroRail, PrimeRail, PrimeTime, and Star-RCXT products.

Physical verification (step 126): At this step various checking functions are performed to ensure correctness for: manufacturing, electrical issues, lithographic issues, and circuitry. Example EDA software products from Synopsys, Inc. that can be used at this step include the Hercules product. Aspects of the invention can be performed during this step 126 as well.

Tape-out (step 127): This step provides the "tape-out" data to be used (after lithographic enhancements are applied if appropriate) for production of masks for lithographic use to produce finished chips. Example EDA software products from Synopsys, Inc. that can be used at this step include the IC Compiler and Custom Designer families of products.

Resolution enhancement (step 128): This step involves geometric manipulations of the layout to improve manufacturability of the design, Example EDA software products from Synopsys, Inc. that can be used at this step include Proteus, ProteusAF, and PSMGen products.

Mask data preparation (step 130): This step provides mask-making-ready "tape-out" data for production of masks for lithographic use to produce finished chips. Example EDA software products from Synopsys, Inc. that can be used at this step include the CATS(R) family of products, Overview of the Technique While DRC layout rules are becoming more and more complex at smaller and smaller technology nodes, most if not all of them still can be decomposed into a combination of the relationships among the edges, the corners, and the contours of shapes in the layout. Relationships "among" shapes as used herein includes relationships about a single shape as well. In embodiments herein, multiple perpendicular scan lines are used to collect all the required data in one pass, so that the combinatorial checking on the data is virtually free. The pass speed is improved even further by stopping the scan lines only at corner positions. Note that scans in multiple directions can also be combined an a particular embodiment, so that the algorithm effectively jumps from corner to corner, considering each corner only once.

In a Manhattan layout, all edges of all shapes are oriented either horizontally or vertically. In this case two scan lines would be used, one vertical (scanning horizontally) and one horizontal (scanning vertically). In each case the scan line stops only at endpoints that it encounters of the edges that are oriented perpendicularly to the scan line. The vertical scan line, for example, stops only at endpoints of horizontally oriented edges, and the horizontal scan line stops only at endpoints of vertically oriented edges, In 45 degree layouts, edges can also be oriented at a 45 degree angle or a 135 degree angle. in this case four scan lines can be used, each scanning in a direction perpendicular to a respective one of the orientations in which edges are included in the layout. While scanning the layout region in each particular direction, "corner" data structures are populated for each corner, with whatever information is easily obtainable from the edge endpoints at the corner, and from other edges that intersect the same scan line. The combined information collected from all the scan lines as they encounter the corner, is sufficient to fully populate the corner data structure.

For most of the design rules defined on derived layers, the shapes in the derived layers never need to be explicitly derived in embodiments herein. Instead, information about their shape edges is inserted into the corner data structures for physical corners that they intersect. While such information can be said to "describe" the derived shapes, only information at these physical corners need be calculated, since most of the derived layer rules are defined on corners of virtual shapes; and these corners all derive from at least one corner position of an ancestor (parent, grandparent, etc.) physical layer. The X,Y position of a derived corner might not coincide with a single physical corner, but if not, then the X position derives from one physical corner and the Y position derives from another physical corner.

Again, this can occur as part of the scan of the layout region in each particular direction. There need be no limitation on the depth or width of the derived layer graph.

Other data structures are also populated during a scan, such as information about an island (such as its area), and information about vias.

Once all the data is collected into a layout topology database, design rule checking is accomplished merely by comparing the numeric values in the layout topology database with the constraint values in the design rule data set. Unlike geometry engine approaches, the approach described herein can be performed extremely quickly, often within milliseconds, allowing for design rule checking in real time, immediately as the layout designer makes each alteration in the layout.

Moreover, since most if not all of the design rules can be framed in terms of topological relationships among edges and corners, including design rules defined on derived layers, it can be seen that the same basic information, collected during the scan, can be used in checking most if not all of the design rules, including design rules defined on derived layers. in most embodiments, there is no need to re-scan the layout region in order to check different design rules; one scan is sufficient for collecting all the needed data. Still further, since the number of topological relationships that can be involved in checking design rules is itself limited, there is little if any additional data collection needed during the scan in order to check new and ever more complex rules. The time required to perform DRC increases less than linearly with increasing numbers of rules, and tapers off to nearly zero.

For example, if minSpacing is supported already, then minSarneNetSpacing and minNotchSpacing can be supported for free (no runtime overhead). If minArea is supported already, then minRectArea can be supported for free (no runtime overhead). If 1D spacing is supported already, then 1D extension can be supported easily regardless of whether they share the same "width". It can be seen that the more rules that are to be checked, the greater the likelihood that the next "new rule" can be supported for free or with a little extra overhead.

Example Implementation

Figure 2:
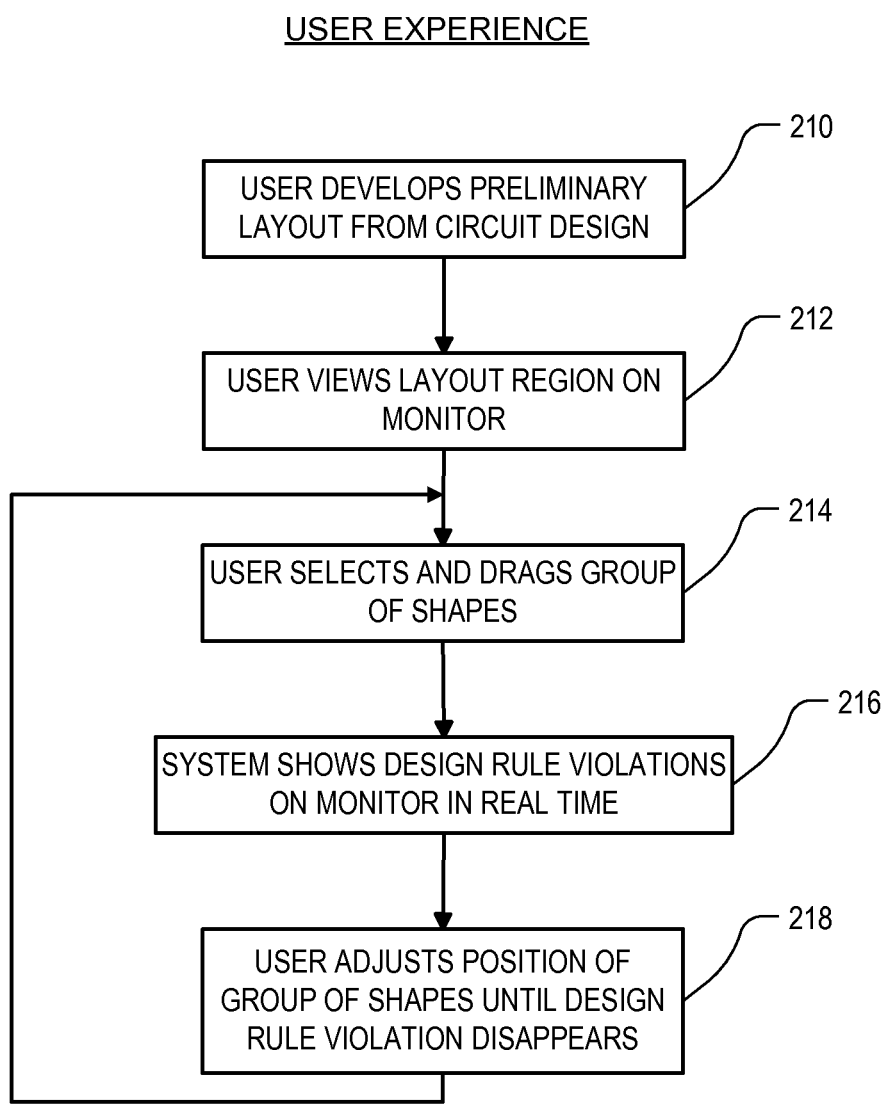
FIG. 2 is a flow chart illustrating an example user experience when using an embodiment of the system as described herein.

FIG. 2 illustrates an example user experience when using an embodiment of the system as described herein. The flow chart. of FIG. 2 occurs within step 122 (FIG. 1).

In step 210, the user develops a preliminary layout from a circuit design. As used herein, the term "circuit design" refers to the gate or transistor level design, before layout. The circuit design is often represented internally to the system in a netlist file. The layout is represented internally to the system in a geometry file which defines, among other things, all the shapes to be formed on each mask that will be used to expose the wafer during fabrication. The geometry file can have any of several standard formats, such as GDSII, OASIS, CREF, and so on, or it can have a non-standard format. The file describes the layout of the circuit design in the form of a mask definition for each of the masks to be generated. Each mask definition defines a plurality of polygons. At the time if FIG. 2, no resolution enhancement (RET) has yet been performed. Thus the layout geometries with which the user is working in FIG. 2 are in a sense idealized, since they do not yet take into account the imperfections of lithographic printing using optical wavelengths comparable or larger in size than the size of the geometries in the layout. For example, rectangles are rectangular, and are not yet pre-corrected for diffractive effects.

In step 212, the user views the layout on a computer monitor. The user typically selects a region of the layout for magnified viewing, so that only that region is visible on the monitor.

In step 214, the user, using a mouse or other pointing device, selects a group of one or more shapes from the visible layout region and drags them to a different location. In step 216, as the user drags the shapes, the system shows on the monitor any design rule violations in real time. In step 218, the user continues to drag the selected shapes until a position is found at which all design rule violations disappear. The user then performs the next desired editing step, which could be another drag-and-drop as in steps 214-218.

It can be seen how useful real time immediate design rule checking, enabled by the system herein, can be in manual layout or layout modification efforts.

Relationship Master

Before discussing the methods used by an implementation of the system, it will be useful to discuss design rules in general, and how they can be represented within the system. Design rules are a set of rules that are provided by a semiconductor manufacturer, which specify minimum or maximum geometric relationships among the features of a layout. A semiconductor manufacturing process always has some variability, and the purpose of design rules is to ensure that sufficient margin is included in the layout geometries to minimize the likelihood that the variability will result in loss of yield. A set of design rules is specific to a particular semiconductor manufacturing process, so new rules are provided to designers or EDA vendors for each new process or significant process change. Despite their specificity to a particular process, there are many design rules which are similar, except for one or more numeric values, across many processes.

Design rules range from very simple to very complex. Most, however, can be framed as a set of one or more constraint parameters, and a set of one or more constraint values for the constraint parameters, (As used herein, a "parameter" is merely a slot or container for one or more values. It is not itself a value.) For example, a simple design rule is minimum edge-to-edge spacing (sometimes called minSpacing). This rule has one parameter (edge-to-edge spacing), and one value which is the minimum spacing allowed by the rule between edges in a single layer (physical or derived) of the layout. Many design rules specify more than one value for a particular parameter, such as an "absolute minimum" value and a "preferred minimum" value. As used herein, a "physical" layer is one for which geometries are specified in the geometry file.

More complex rules can have multiple parameters. An End-of-line spacing rule, for example, specifies the minimum spacing between the end of a line and its neighboring geometry. Again, this rule can be defined on any layer, including a derived layer. The constraint applies only if the width of the wire is less than a specified value, eolWidth. The constraint applies when any geometry occurs within a region defined by the minimum spacing, where the region includes the distance from each side of the wire. This distance is referred to as a lateral verification distance eolWithin. The constraint applies only if one parallel edge is within a specified rectangular region from the corners of the wire, or it applies only if two parallel edges are within a specified rectangular region from the corners of the wire. These parameters are referred to as parWithin and parSpace. The constraint applies when no parallel edges occur within the region defined by the minimum spacing, or one parallel edge occurs within the region defined by the minimum spacing, or two parallel edges. This rule has the spacing parameter itself, eolSpacing, as well as the following parameters: eolWidth, eolWithin, parWithin and parSpace.

Design rules can also specify constraints on edges in different layers. The MinDualExtension layer pair constraint, for example, specifies the minimum distance a shape on one layer must extend past a shape on a second layer. The first or second layer or both or neither can be derived layers. This rule has one parameter for extensions in the horizontal direction and another parameter for extensions in the vertical directions. This rule can also specify additional pairs of parameters, keyed by wire width. Other more complex parameters are also available for this rule, including optional parameters to qualify when the rule applies.

Design rule sets also often include area rules, such as the minimum area of an island or a hole in a layer. They can also include via rules, which specify constraints on geometric dimensions in the "cut" layer (also sometimes called the via layer), the island in the "cover" layer above the via, and the island in the "cover" layer below the via. These rules, too, can be defined on derived layers.

Derived layers are defined in the design rule sets. A derived layer can be defined by specifying a name for the derived layer, a layer number, the parent layers for the particular derived layer, and an operator for calculating the derived layer as a function of the parent layers. in one embodiment, only one or two parent layers can be specified, meaning a derived layer must have no more than two parent layers. In another embodiment, more than two parent layers can be specified. The derived layer operator can in one embodiment be a simple Boolean logic function (And, Or, XOR, or NOT). In another embodiment, the derived layer operator can be a more complex Boolean logic expression such as 'Layer 1 AND (Layer 2 OR Layer 3)'. Also, the parent(s) of a derived layer need not be physical (layout) layers; one or more of them can be other derived layers, thereby allowing a nesting of derived layers. As used herein, a "parent" layer refers to an immediate parent layer. Grandparents and other ancestors (including parents) are referred to herein as "ancestor" layers.

Ultimately, each derived layer has one or more ultimate ancestor which is a physical layer, though the number of derived layers in between the particular layer and the ancestor physical layer on one side of the family tree may be different from the number on another side of the family tree. For example, a first derived layer D1 may be dependent upon physical layers P1 and P2, and a second derived layer D2 may be dependent upon D1 and physical layer P3. Then one ancestor physical layer P3 of derived layer D2 has zero derived layers in between, whereas ancestor physical layers P1 and P2 each have one derived layer in between the layer D2 and the respective physical layer P1 or P2. As used herein, the "rank" of a particular derived layer is equal to the maximum of the number of derived layers to and including the particular derived layer from each of its ancestor physical layers. The rank of a physical layer is considered to be zero, and the rank of a particular derived layer can be calculated as one plus the maximum rank of all its parent layers.

The design rules that reference derived layers are of many of the same kinds as those that reference only physical layers, and are expressed in the design rule set in the same way. For example, they can be framed as a set of one or more constraint parameters and one or more constraint values for the constraint parameters. They can include rules that apply to shapes on the particular derived layer (such as minimum edge-toedge spacing and end-of-line spacing), as well as rules that specify constraints among different layers (such as MinDualExtension). Rules that reference more than one layer are not restricted to referencing only physical layers or only derived layers; then can also reference layers of both kinds, such as the minimum extension of a shape in a derived layer relative to a shape in a physical layer.

As a simplified example, a design rule set may include a rule that sets a minimum longitudinal spacing between transistor gate conductors. In many fabrication processes, a transistor gate conductor can be identified as the geometric intersection where a polysilicon line crosses a diffusion region. In order to establish this design rule, the design rule set may specify a derived layer G defined as L1 AND L2, where L1 is layer defining the polysilicon lines, and L2 is the layer defining the diffusion implants. In this case the derivation operator for derived layer G is "L1 AND L2". The design rule set then specifies a design rule that references layer G, recites a parameter for specifying the minimum spacing between shapes on layer G, and recites a value for that parameter.

As used herein, a design rule "references" a particular derived layer typically by identifying the derived layer. For example, a minimum extension rule, which specifies the minimum distance by which a shape in a derived layer must extend beyond the edge of a shape in a physical layer, or vice-versa, references both layers that the rule constrains (including the derived layer) by explicitly identifying both layers (including the derived layer). Also as used. herein, a derivation operator "references" a particular layer by identifying it as one of its parent layers. In the simplified example above, the derivation operator for layer G "references" both layers L1 and L2.

In an embodiment of the invention, all of the values specified by the design rules are provided to the system in the form of a design rule data set. As used herein, the term "data set" does not imply any particular organization. For example, it includes maps, multimaps, trees, as well as ordinary tables, and other data organizations as well. The term also does not necessarily imply any unity or regularity of structure. For example, two or more separate data sets, when considered together, still constitute a "data set" as that term is used herein. The terms "database" and "data structure" are also intended to have the same meaning as "data set".

In the present embodiment, the design rule data set is sometimes referred to herein as the relationship master. A class definition for an example relationship master, in pseudo-C++, is as follows. In order to simplify the discussion, only some of the parameters are shown. A relationship_master object exists for each layer on which design rules are defined, including derived layers.

```
class relationship_master
{
    layer_number m_layer; // layer number for this instantiation
    std::set<layer_number> m_layers_above; // identification of layers above current layer
    std::set<layer_number> m_layers_below; // identification of layers below current layer
    // the worst case value for spacing relationship on the
    // same layer, 0 if there is no design rule asking for
    // min_spacing relationship
    int m_spacing;
    // the worst case value for dimension relationship on the
    // same layer, 0 if not applicable (minimum line width)
    int m_dimension;
    // the worst case value for neighbor_spacing relationship on
    // the same layer, 0 if not applicable
    // (also called parallel spacing)
    int m_neighbor_spacing;
    // the worst case value for neighbor_within relationship on
    // the same layer, 0 if not applicable
    int m_neighbor_within;
    // the worst case value for neighbor_dimension relationship on
    // the same layer
    int m_neighbor_width;
    int m_area; // minimum island area
    int hole_area;
    int m_common_run_length;
    std::map<layer_number, int>
    m_common_run_clearance_vector_map;
    // extensions from this layer to other layers
    std::map<layer_number, int> m_cover_layers;
    // extensions from other layers to this layer
    std::map<layer_number, int> m_cut_layers;
    // worst case different layer clearance, from this layer to other layers
    std::map<layer_number, int> m_clearance_layers;
    // for via rules
    std::set<layer_number> m_overlap_layers;
    std::set<layer_number> m_dual_cover_layers;
};
```

Design Rule Checking Flow

Figure 3:
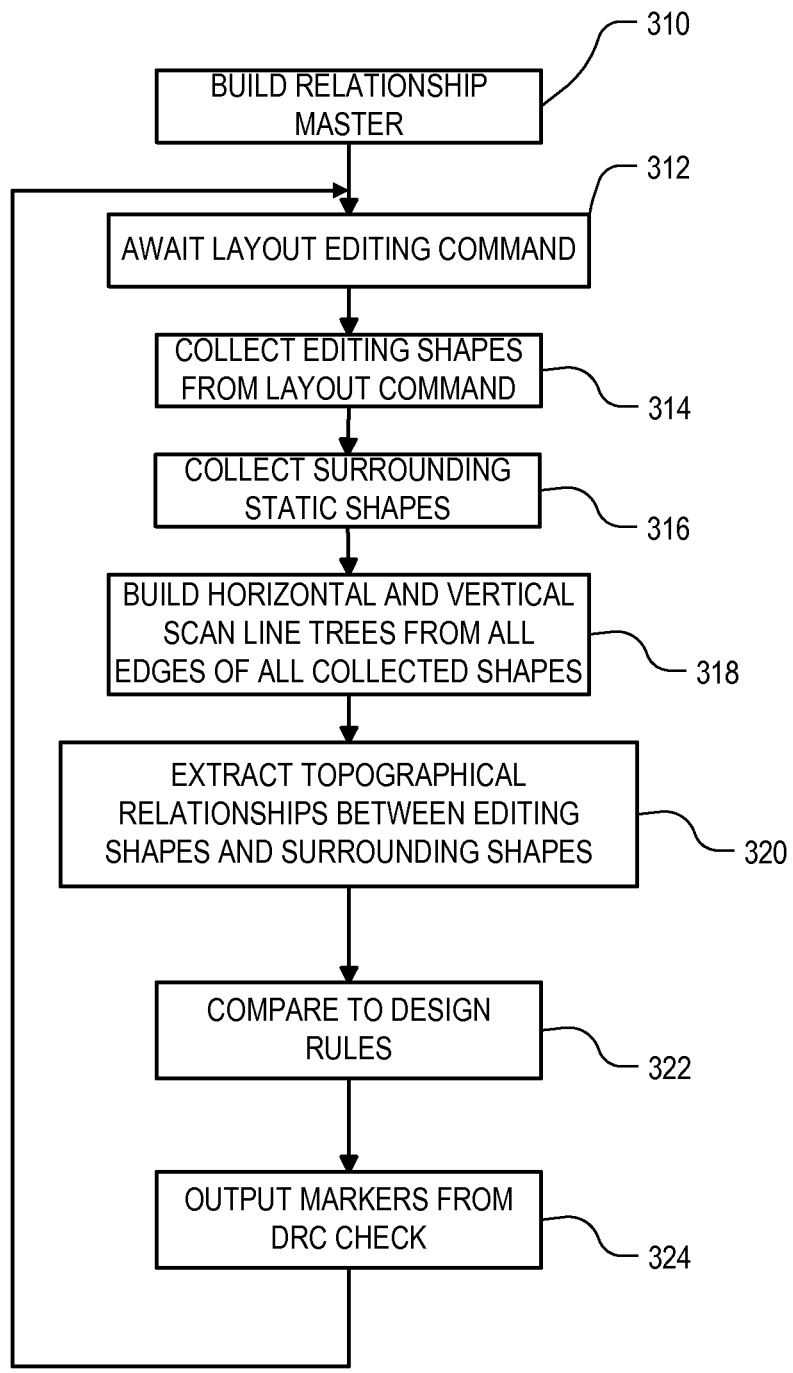
FIG. 3 is a flow chart of the overall system flow for an embodiment of the invention.

FIG. 3 is a flow chart of the overall system flow for real time visual layout design rule checking. The reader will recognize that the flow can be easily modified for use as a batch job instead. As with all flowcharts herein, it will be appreciated that many of the steps in FIG. 3 can be combined, performed in parallel or performed in a different sequence without affecting the functions achieved. In some cases a re-arrangement of steps will achieve the same results only if certain other changes are made as well, and in other cases a re-arrangement of steps will achieve the same results only if certain conditions are satisfied. However, as described in detail hereinafter, there are certain steps which are performed prior to other steps, in order to obtain benefits of the invention.

In step 310, the relationship master data set is built from a set of design rules for the target fabrication process. This can be done manually, or in some embodiments it can be automated. It is provided to the DRC system either electronically or via a computer readable medium, and it is stored accessibly to the system on a computer readable medium. As used herein, a computer readable medium is one on which information can be stored and read by a computer system. Examples include a floppy disk, a hard disk drive, a RAM, a CD, a DVD, flash memory, a USB drive, and so on. The computer readable medium may store information in coded formats that are decoded for actual use in a particular data processing system. A single computer readable medium, as the term is used herein, may also include more than one physical item, such as a plurality of CD ROMs or a plurality of segments of RAM, or a combination of several different kinds of media.

In step 312, the system displays on a monitor the layout or layout region selected by the user. As used herein, the term "region" refers to a portion as viewed from above, including whatever layers are pertinent. As a degenerate case, the entire layout is also a "region". The user can manipulate (edit) objects in the layout using familiar editing commands, such as keyboard- or mouse-based behaviors recognized by the system. For example, the user can select a group of objects by clicking and dragging the mouse pointer to form a rectangle around them. Only objects on physical layers can be selected; derived layers are created only to facilitate the specification of certain error checking rules and are not visible to the user editing a layout. The user can then move the objects as a group by clicking within the rectangle and dragging it. Editing commands are recognized by the operating system and delivered to the application program by way of events in a well known manner. For example, user dragging of a group of objects might cause a series of events to be delivered to the application program, one after each movement by some number of pixels, or some number of milliseconds. The application program receives these events and determines for itself what the event represents. Step 312 can include a conventional event loop, whereby the application program repeatedly checks for new events. When it receives an event, step 312 determines that it represents a layout editing command such as user dragging of a group of shapes across the layout.

In step 314, the system collects all the editing shapes, which are the ones that are being edited by the user. For a click-and-drag command, the editing shapes are the ones that are being moved to a different position in the layout. For a shape re-sizing command, the editing shape is the one being resized.

In step 316, the system collects all the surrounding shapes, which in a click-and-drag command, are the shapes near the new position of the editing shapes. Again, only real shapes, not those on derived layers, are included. A selection algorithm is used here which errs on the side of collecting more shapes than necessary, since while inclusion of additional shapes could impact performance, the exclusion of relevant shapes will impact accuracy. One efficient way to collect appropriate shapes is to create a bounding box around the editing shapes in their new position, then extend the box in all four directions by 1.5 times the worst case minimum spacing or the worst case minimum inter-layer clearance, whichever is larger. All shapes at least partially overlapping with the expanded bounding box, in any layer, are then included in the result. A conventional range search engine can be used for this step. Geometry processing is not needed.

In step 318, horizontal and vertical scan line trees sweep_x and sweep_y are built from all of the collected shapes, including both the editing shapes and the static shapes. The horizontal scan line tree sweep_x is a map of particular vertical scan lines, and will be scanned horizontally across the selected layout region, from left to right. The vertical scan line tree sweep_y is a map of particular horizontal scan lines, and will be scanned vertically across the selected layout region, from bottom to top.

Figure 4:
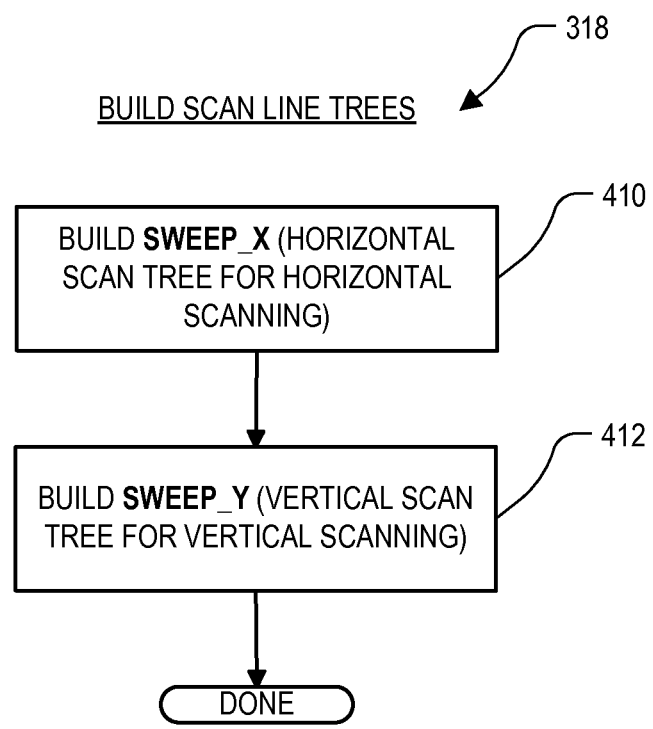
FIGS. 4, 7-10, 12-18, 20 and 23-27 are flow chart details of the overall system flow in FIG. 3.

FIG. 4 is a flow chart of step 318, and as can be seen, it includes a step 410 of building sweep_x and another step 412 of building sweep_y.

Figure 5:
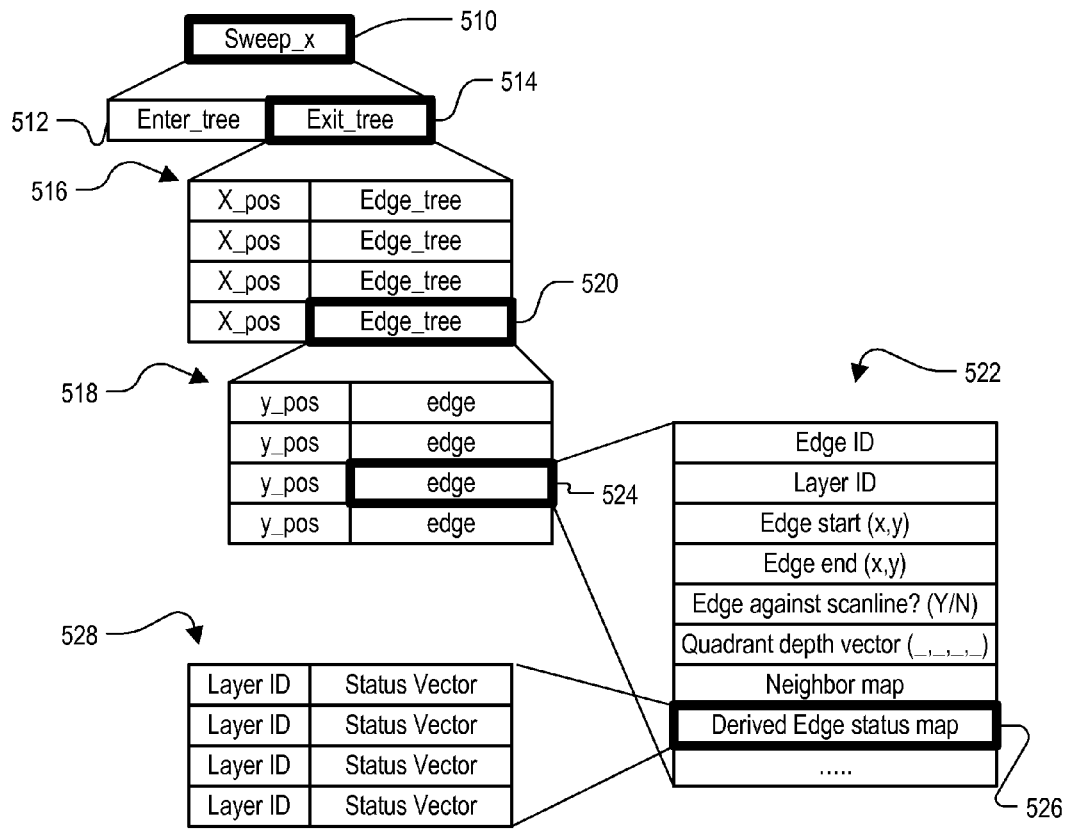
FIG. 5 illustrates part of a sweep_x data structure referred to in FIG. 4.

FIG. 5 illustrates pertinent parts of the sweep_x data. structure 510. It contains two tree data structures, called enter_tree 512 and exit_tree 514. Enter-tree is a map of the vertical scan lines, and the vertical position on such scan lines, of the left-hand endpoints of the horizontal edges. Exit_tree is a map of the vertical scan lines, and the vertical position on such scan lines, of the right-hand endpoints of the horizontal edges. No additional entries are provided in the map to account for endpoints of edges on derived layers, because the great majority of the derived layer rules operate on corners of shapes on the derived layers whose x/y positions coincide with at least one corner position of ancestor physical layers, and information regarding the derived edges can be stored in conjunction with the coincident corner position(s) on the ancestor physical layers. Any rules that require additional information are handled separately. (As used herein, the "corner position", or the "location" of a corner, refers to the (x,y) location of the corner and is not specific to layer number or depth within the ultimate integrated circuit chip.)

Map 516 is an expansion of exit_tree 514; enter_tree 512 has the same structure and is therefore not shown in FIG. 5. It comprises key-value pairs, in which all the keys indicate horizontal positions and all the values are structures of class 'edge-tree', and represent vertical scan lines. A "map" is a standard structure which allows only one entry for each unique key. Thus exit_tree organizes all the vertical scan lines, and there is one vertical scan line for each horizontal position included. Note that by representing only specific vertical scan lines, the horizontal scanning algorithm will be able to jump over all horizontal positions that do not contain any corners.

Multimap 518 is an expansion of one of the edge_tree structures 520. The other edge_trees have the same structure and therefore are not shown in FIG. 5. Edge_tree 520 also comprises key-value pairs, except that as a "multimap", multiple entries are allowed having the same key. In edge_tree 520 the keys indicate vertical positions, and all the values are structures of class 'edge', representing an edge having an endpoint on the current vertical scan line. Since this is part of the exit_tree 514, only those horizontal edges having right-hand endpoints at this horizontal position are included in edge_tree 520. (In the enter_tree 512, only edges having left-hand endpoints at a given horizontal position are included in the edge_tree for the vertical scan line at the given horizontal position.) A multimap is used here rather than a map, in order to accommodate multiple edges having a right-hand endpoint at the same x and y position in the layout region. Multiple edges are possible because some could be on different layers in the layout, or some could even be superimposed on each other in a single layer. Again, these are physical edges only; edges located in derived layers do not have their own entries. In another embodiment, however, derived layer edges can be given their own edge entries in multimap 518.

Block 522 is an expansion of one of the edge structures 524. The other edges have the same structure and therefore are not shown in FIG. 5. Edge 524 contains information about a particular horizontal edge of one of the shapes in the layout region, and also acts as a holding area for certain information developed during the scan as described hereinafter. At least the following information is included:

edge ID: an identifying value for the edge;
  layer ID: an indication of the layer number on which the edge lies;
  edge start (x,y): the x and y coordinates of the left-hand endpoint of the edge;
  edge end (x,y): the x and y coordinates of the right-hand endpoint of the edge;
  edge against scan line? (T/F): a Boolean indicating whether the edge is the bottom edge of a shape (True if it is a bottom edge. False otherwise);
  quadrant depth vector: four slots indicating how many shapes overlap each other in the current layer at the right-hand endpoint of the edge (for exiting edges) or the left-hand endpoint (for entering edges) or the intersection point of the edge and the vertical scan line (for all other edges in the current scan line), in each of the four quadrants centered at that point (for an embodiment that supports 45 degree geometries, this is an octant depth vector containing eight slots);
  neighbor map: a map of neighboring edges;
  derived edge status map 526: a map of edge status at the current X_pos, y_pos for various derived layers.

Block 528 is an expansion of derived edge status map 526. It contains information about horizontal edges in some of the derived layers, which edges terminate at or pass through the current vertical scan line at the current vertical position on that scan line. Each entry contains the derived layer ID, in association with a status vector for the edge. The status vector for a derived edge is similar to a quadrant depth vector (discussed later), in that it contains four values indicating status in the four respective quadrants centered at the current x- and y-position. It differs from a quadrant depth vector in that each entry of the vector can contain only a 1 or a 0: a 1 indicates that the current derived layer does have an island in that quadrant, and a 0 indicates that it does not (or vice-versa). There is no need to indicate the number of superimposed shapes in the quadrant within a derived layer, because the shapes are defined in a Boolean operation: in a given location a shape is either present or absent.

Figure 5A:
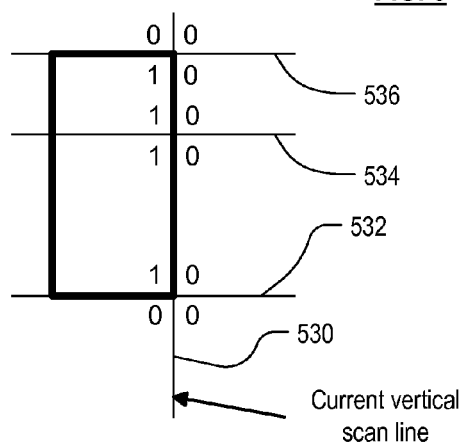
FIG. 5A illustrates a simple portion of a layout.

FIG. 5A illustrates the functioning of a derived layer status vector. The figure illustrates a vertical scan line 530 and three vertical positions numbered, from bottom to top, 532, 534 and 536. A derived shape 538 has its right-hand edge aligned with vertical scan line 530, and its bottom and top edges located at vertical positions 532 and 536, respectively. As with quadrant depth vectors, the quadrants in a derived layer status vector are numbered counter-clockwise beginning in the top-right quadrant. The status vector at vertical position 532 is (0,1,0, 0), indicating that the y-position 532 on the vertical scan line 530 is the lower-right corner of a shape. Similarly, the status vector at vertical position 536 is (0,0,1,0), indicating that the y-position 536 on the vertical scan line 530 is the upper-right corner of a shape. The status vector at vertical position 534 is (0,1,1,0), indicating that the shape extends to the left and above and below the y-position 532 on the vertical scan line 530, It can be seen that a status vector having one '1' and three '0's indicates a convex corner of the derived shape, whereas a status vector having one '0' and three '1's indicates a concave corner of a derived shape. A status vector of (0,0,1,1), (0,1,1, 0), (1,1,0,0) or (1,0,0,1) indicates a non-corner edge of a derived shape. A status vector of (0,1,0,1) or (1,0,1,0) indicates two derived shapes meeting at a common corner; a situation that will usually violate design rules, Note that only edges and corners of a derived shape appear in derived edge status maps. If the status vector at a particular x/y position for a derived layer is (0,0,0,0), then this derived layer has no shape at that position. if it is (1,1,1,1), then the current x/y position is inside a derived shape. In either case, no entry is made for the current derived layer in the derived edge status map 526, It wilt be appreciated that each x/y position of corners on physical layers may be represented numerous times in the Sweep_x data structure. It may be represented in both Enter_tree 512 and Exit_tree 514. It might also be represented at multiple physical layers (multiple entries in block 518 all having a common y_pos key), Because many of the derived edges at a particular x/y position can be stored in a single map 526, there may be multiple edge data structures 522 which would serve as an appropriate place to store each derived edge status map 526. Different embodiments can implement different conventions on this point. In one embodiment, the status vectors for all the derived edges on a particular derived layer are inserted into an edge data structure for the "first" physical layer that is one of its physical ancestors. Preferably the "first" physical layer is defined as whichever layer is used to break a tie when vertical positions of edges are the same in the current vertical scan line. In the embodiment of FIG. 5, it is the physical layer with the smallest layer number.

Figure 6:
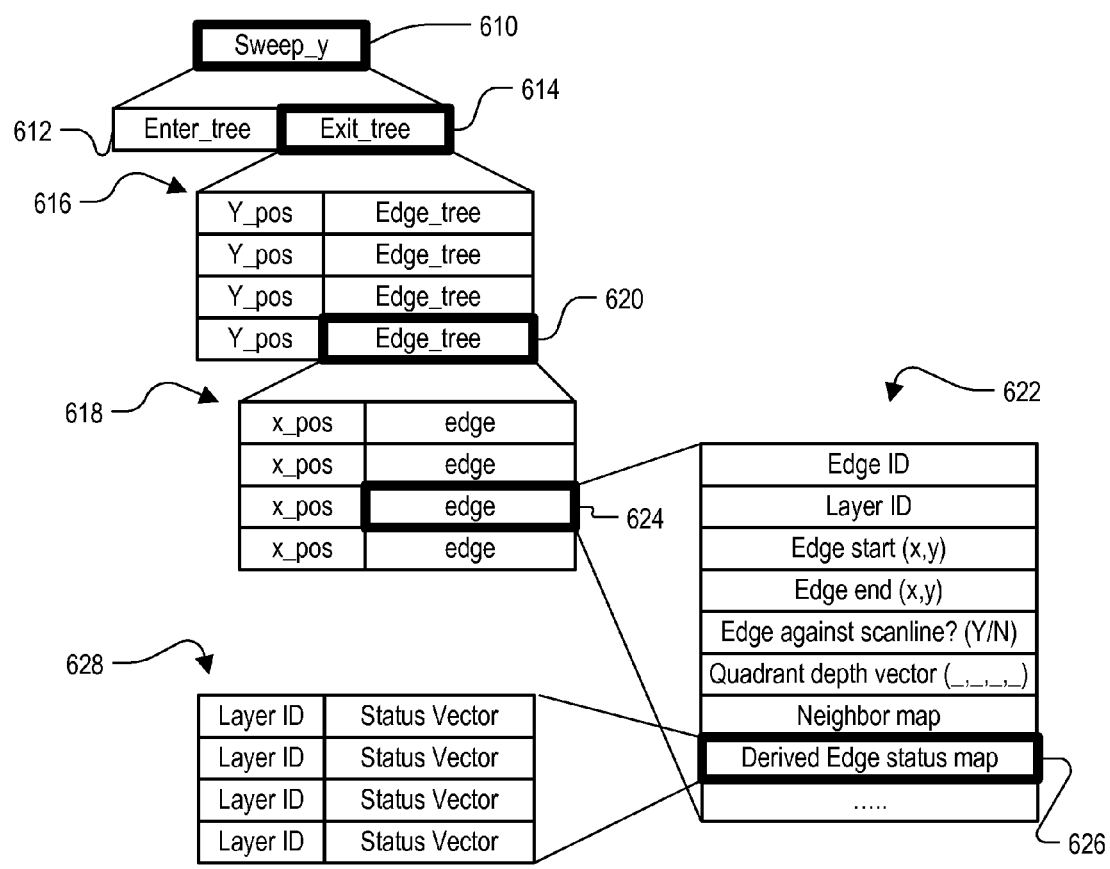
FIG. 6 illustrates part of a sweep_y data structure referred to in FIG. 4.

FIG. 6 illustrates pertinent parts of the sweep_y data structure 610, Like sweep_x, sweep_y contains two tree data structures, called enter_tree 612 and exit_tree 614. In sweep_y, enter-tree is a map of the horizontal scan lines, and the horizontal position on such scan lines, of the lower endpoints of the vertical edges. Exit_tree is a map of the horizontal scan lines, and the horizontal position on such scan lines, of the upper endpoints of the vertical edges. Like sweep_x, no additional entries are provided in the map to account for endpoints of edges on derived layers.

Map 616 is an expansion of exit_tree 614; enter_tree 612 has the same structure and is therefore not shown in FIG. 6. It comprises key-value pairs, in which all the keys indicate vertical positions and all the values are structures of class 'edge-tree', and represent horizontal scan lines. Thus exit_tree organizes all the vertical scan lines, and since exit_tree is a map, there is only one horizontal scan line for each vertical position included. Note that by representing only specific horizontal scan lines, the vertical scanning algorithm, like the horizontal scanning algorithm, will be able to jump over all vertical positions that do not contain any corners.

Multimap 618 is an expansion of one of the edge_tree structures 620. The other edge_trees have the same structure and therefore are not shown in FIG. 6. Edge_tree 620 also comprises key-value pairs, except that as a "muitimap", multiple entries are allowed having the same key. In edge_tree 620 the keys indicate horizontal positions, and all the values are structures of class 'edge', representing an edge having an endpoint on the current horizontal scan line. Since this is part of the exit_tree 614, only those vertical edges having upper endpoints at this vertical position are included in edge_tree 620, On the enter_tree 612, only edges having lower endpoints at a given vertical position are included in the edge_tree for the horizontal scan line at the given vertical position.) Again, these are physical edges only; edges located in derived layers do not have their own entries. In another embodiment, however, derived layer edges can be given their own edge entries in multimap 618.

Block 622 is an expansion of one of the edge structures 624. The other edges have the same structure and therefore are not shown in FIG. 6. Edge 624 contains information about a particular vertical edge of one of the shapes in the layout region, and also acts as a holding area for certain information developed during the scan as described hereinafter. At least the following information is included:
  edge ID: an identifying value for the edge;
  layer ID: an indication of the layer number on which the edge lies;
  edge start (x,y): the x and y coordinates of the lower endpoint of the edge;
  edge end (x,y): the x and y coordinates of the upper endpoint of the edge;
  edge against scan line? (T/F): a Boolean indicating whether the edge is the left edge of a shape (it will be True if it is a left edge, False otherwise);
  quadrant depth vector: four slots indicating how many shapes overlap each other in the current layer at the lower endpoint of the edge (for exiting edges) or the upper endpoint (for entering edges) or the intersection point of the edge and the horizontal scan line (for all other edges in the current scan line), in each of the four quadrants centered at that point (for an embodiment that supports 45 degree geometries, this is an octant depth vector containing eight slots);
  neighbor map: a map of neighboring edges;
  derived edge status map 626: a map of edge status at the current X_pos, y_pos for various derived layers.

Block 628 is an expansion of derived edge status map 626. It contains information about vertical edges in some of the derived layers, which edges terminate at or pass through the current horizontal scan line at the current horizontal position on that scan line. Each entry contains the derived layer II), in association with a status vector for the edge. Like for derived edge information stored in the Sweep_x data structure, the status vectors for all the vertical derived edges on a particular derived layer are inserted into an edge data structure 624 for the smallest numbered physical layer that is one of the ancestors of the particular derived layer.

As can be seen, sweep_x contains only horizontal edges (physical and derived) and sweep_y contains only vertical edges (physical and derived). Thus the scan lines in each data structure are perpendicular to the edges that will be encountered during a traversal of the structure. In an embodiment supporting diagonal edges as well, two more sweep data structures are present as well: one containing scan lines oriented parallel to one diagonal and the other containing scan lines oriented parallel to the other diagonal. Each data structure includes only edges oriented perpendicularly to its scan lines, no again, a scan line sweep of the scan lines in each structure will encounter only those edges oriented perpendicularly to the scan line.

Figure 7:
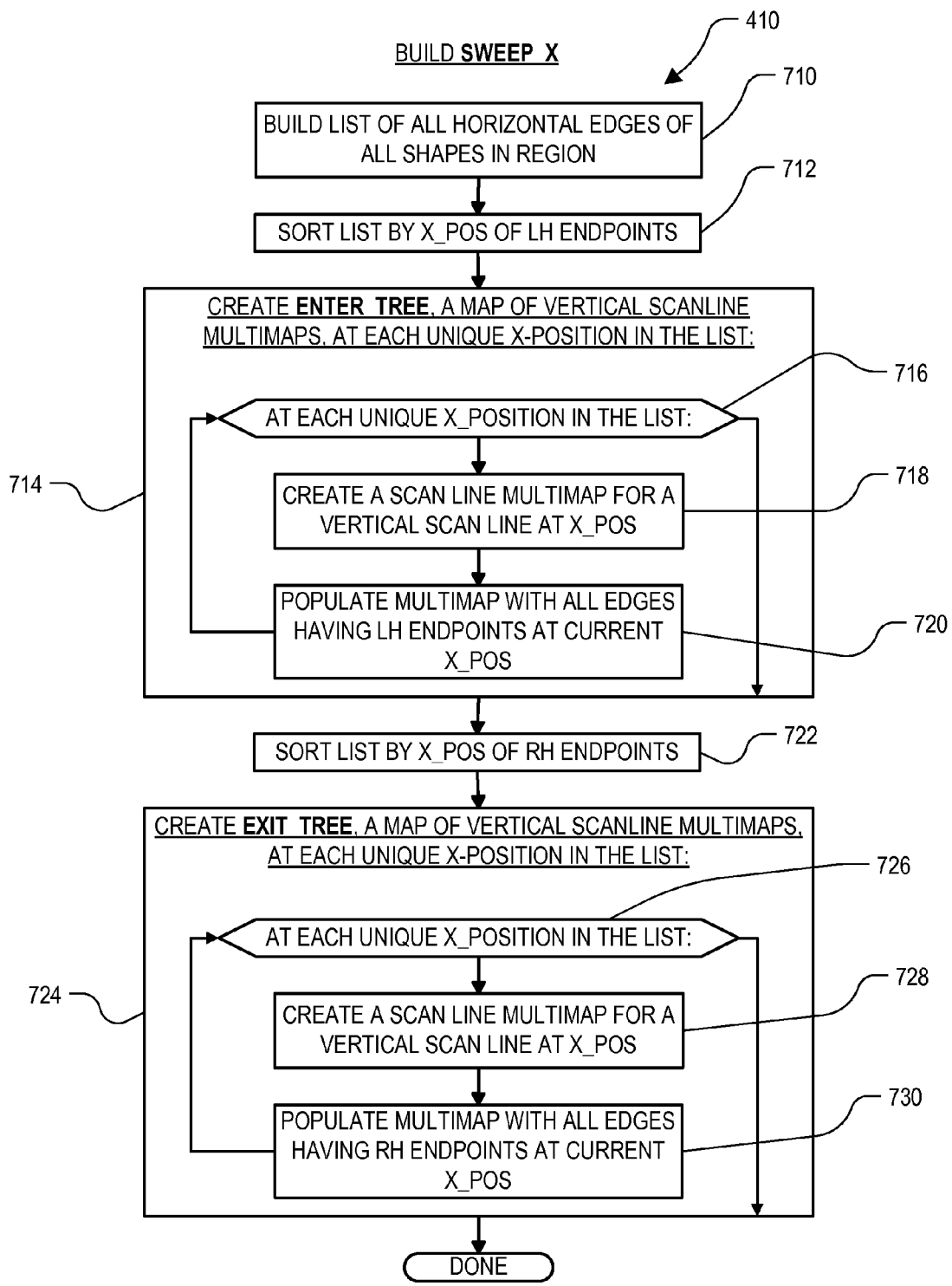

FIG. 7 is a flow chart detail of a method 410 for building the horizontal scan line tree sweep_x. In step 710, a list is formed of all the horizontal edges of all shapes in the selected region, including editing shapes. Only shapes on physical layers are considered in FIG. 7; derived layer information is not yet inserted. In step 712, the list is sorted by the horizontal position of all the left-hand endpoints of the edges. There may be multiple edges whose left-hand endpoints have the same horizontal position, and these would be grouped together in the sort, In step 714, enter_tree is created for sweep_x. This is accomplished by, at each unique horizontal position represented in the sorted list (step 716), creating a scan line multimap (of class 'edge_tree') for a vertical scan line at that horizontal position (step 718). In step 720, the scan line multimap at that horizontal position is populated with all the edges (structures of class 'edge') in the list having loft-hand endpoints at the current horizontal position.

After enter_tree has been created and populated for sweep_x, the list from step 710 is re-sorted by horizontal position of all the right-hand endpoints of the edges. Again, there may be multiple edges whose right-hand endpoints have the same horizontal position. In step 724, exit_tree is created for sweep_x, Similarly to the creation of enter_tree, this is accomplished by, at each unique horizontal position represented in the sorted list (step 726), creating a scan line multimap (of class 'edge_tree') for a vertical scan line at that horizontal position (step 718' In step 720, the scan line multimap at that horizontal position is populated with all the edges (structures of class 'edge') in the list having right-hand endpoints at the current horizontal position.

Figure 8:
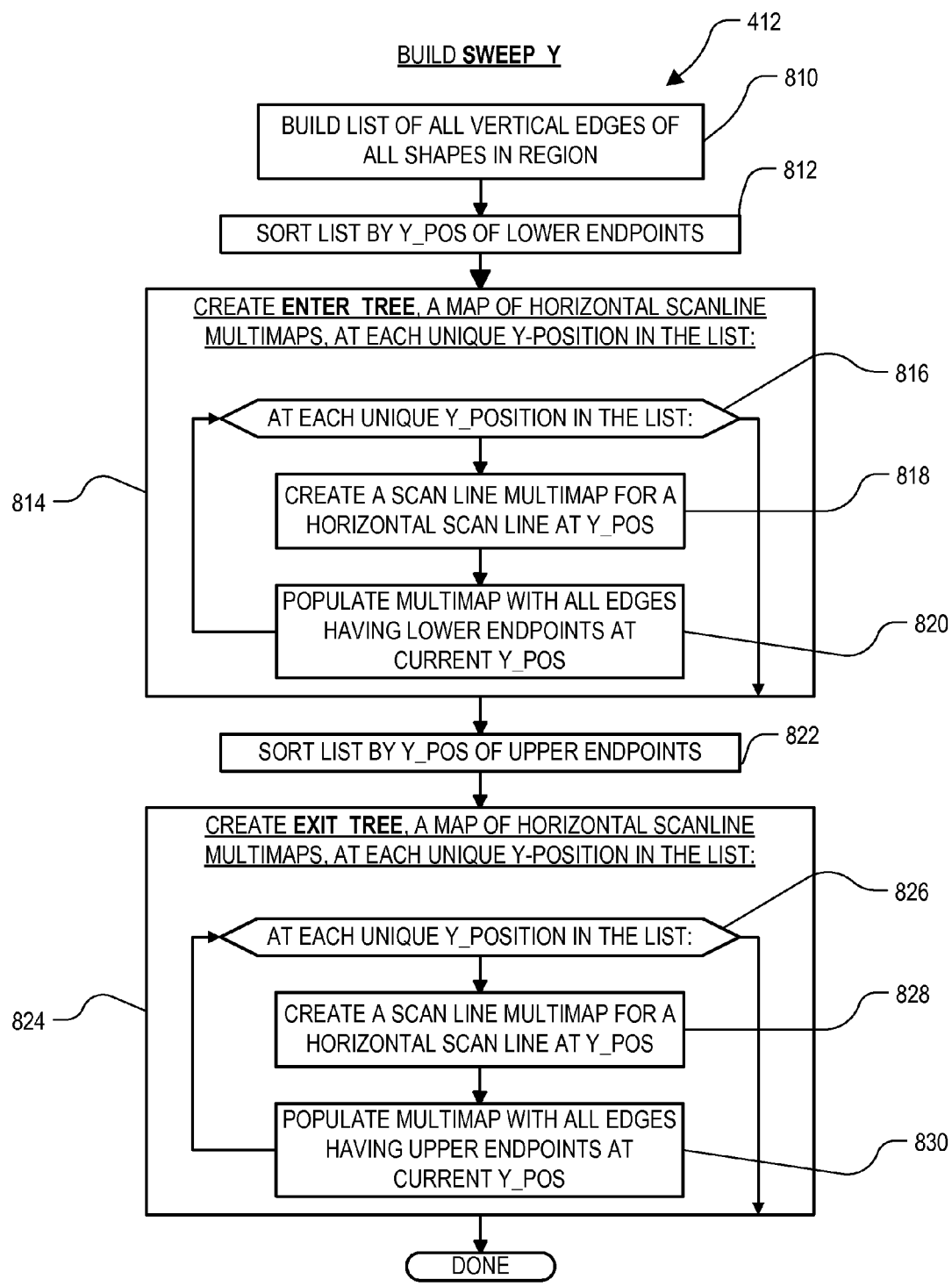

FIG. 8 is a flow chart detail of a method 412 for building the horizontal scan line tree sweep_y. In step 810, a list is formed of all the vertical edges of all shapes in the selected region, including editing shapes. In step 812, the list is sorted by the vertical position of all the lower endpoints of the edges. Again, there may be multiple edges whose lower endpoints have the same vertical position, and these would be grouped together in the sort.

In step 814, enter_tree is created for sweep_y. This is accomplished by, at each unique vertical position represented in the sorted list (step 812), creating a scan line multimap (of class 'edge_tree') for a horizontal scan line at that vertical position (step 818). In step 820, the scan line multimap at that vertical position is populated with all the edges (structures of class 'edge') in the list having lower endpoints at the current vertical position.

After enter_tree has been created and populated for sweep_y, the list from step 810 is re-sorted by horizontal position of all the upper endpoints of the edges. Again, there may be multiple edges whose upper endpoints have the same vertical position. In step 824, exit_tree is created for sweep_y. As before, this is accomplished by, at each unique vertical position represented in the sorted list (step 822), creating a scan line multimap (of class 'edge_tree') for a horizontal scan line at that vertical position (step 818). In step 820, the scan line multimap at that vertical position is populated with all the edges (structures of class 'edge') in the list having upper endpoints at the current vertical position.

Returning now to FIG. 3, after the horizontal and vertical scan line trees have been built (step 318), all of the required topographical relationships among the shapes in the layout region are now extracted (step 320).

Figure 9:
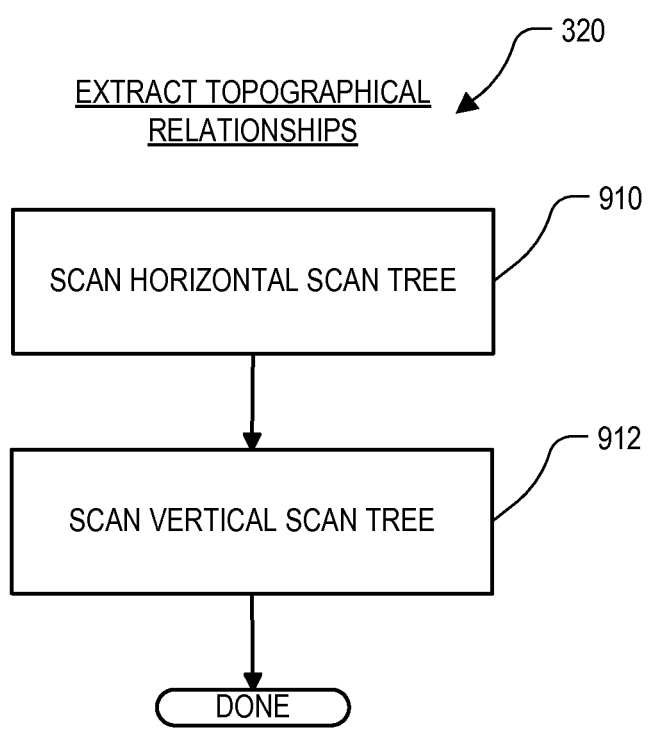

FIG. 9 is a flow chart of step 320, and as can be seen, it includes a step 910 of scanning the horizontal scan tree sweep_x and another step 912 of scanning the vertical scan tree sweep_y. Note that in another embodiment the vertical scan can be performed first and the horizontal scan thereafter. In yet another embodiment, the two scans can be performed in an alternating manner. In a particularly advantageous embodiment, since the two scans are independent of each other, and discover different items of information for populating the corner data structures, the two scans are performed simultaneously on two different processor cores. In yet another embodiment, the two scans are coordinated with each other so that they proceed from corner to corner, with all data for a given corner populated before jumping to the next corner. As used herein, the two scans are said to be performed "concurrently" with each other if they overlap in time in such a way that corner data is extracted from at least one endpoint of at least one horizontal edge before corner data is extracted from at least one endpoint of at least one vertical edge, and corner data is extracted from at least one endpoint of at least one vertical edge before corner data is extracted from at least one endpoint of at least one horizontal edge.

Figure 10:
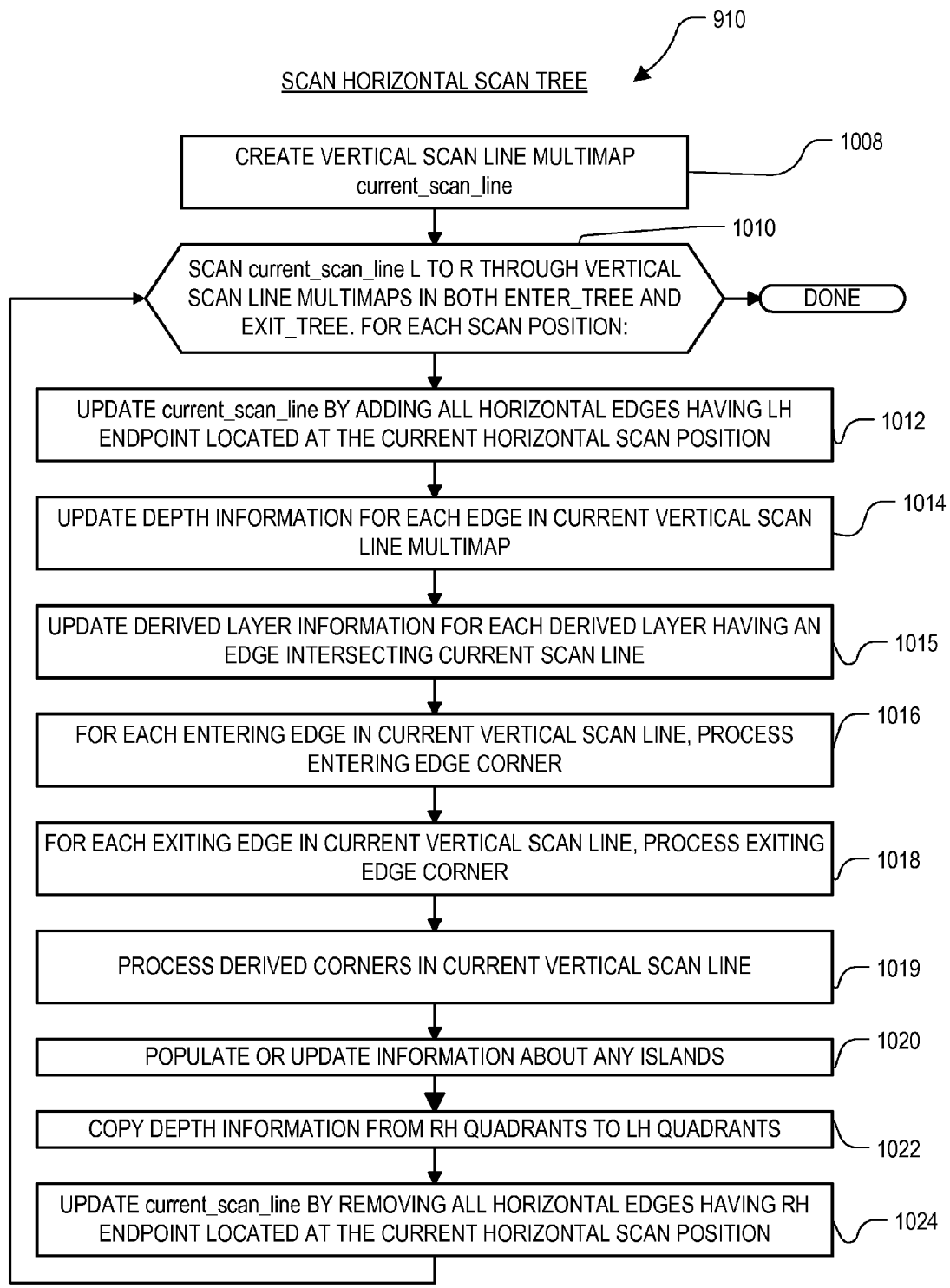

FIG. 10 is a flow chart of step 910, for scanning the horizontal scan tree sweep_x. In step 1008, the vertical scan line edge-tree multimap object current_scan_line is created. In step 1010, current_scan_line traverses both enter_tree and the exit_tree together so that the vertical scan lines from both trees are considered in monotonically varying sequence, left to right. Since these two trees contain only those vertical scan lines on which an endpoint of a horizontal physical edge lies, intervening vertical scan lines are skipped during this scan. The existence of derived edges does not alter this plan since it is assumed for this part of the algorithm that all derived edge endpoints are co-located with (coincident with) at least one physical edge endpoint. The current vertical scan line is maintained in a multimap object of class edge_tree, having the structure of edge_tree 520 (FIG. 5). 111. has a current horizontal scanning position, and stores the information shown in block 522 for each horizontal edge that intersects a vertical line at the current horizontal scanning position.

Figure 11A:
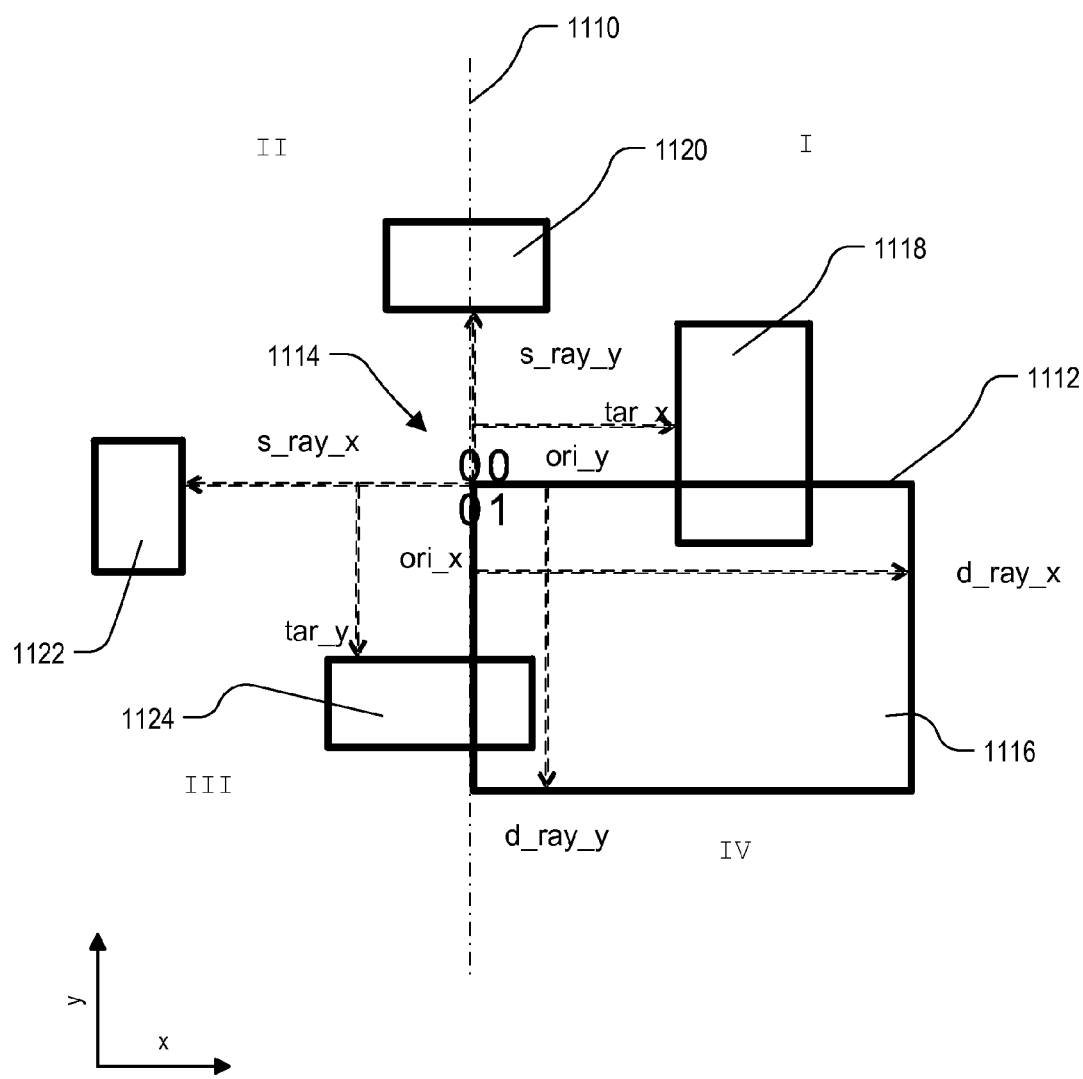
FIGS. 11A and 11B illustrate simple portions of a layout, highlighting convex and concave corners of a layout shape, respectively.
Figure 11B:
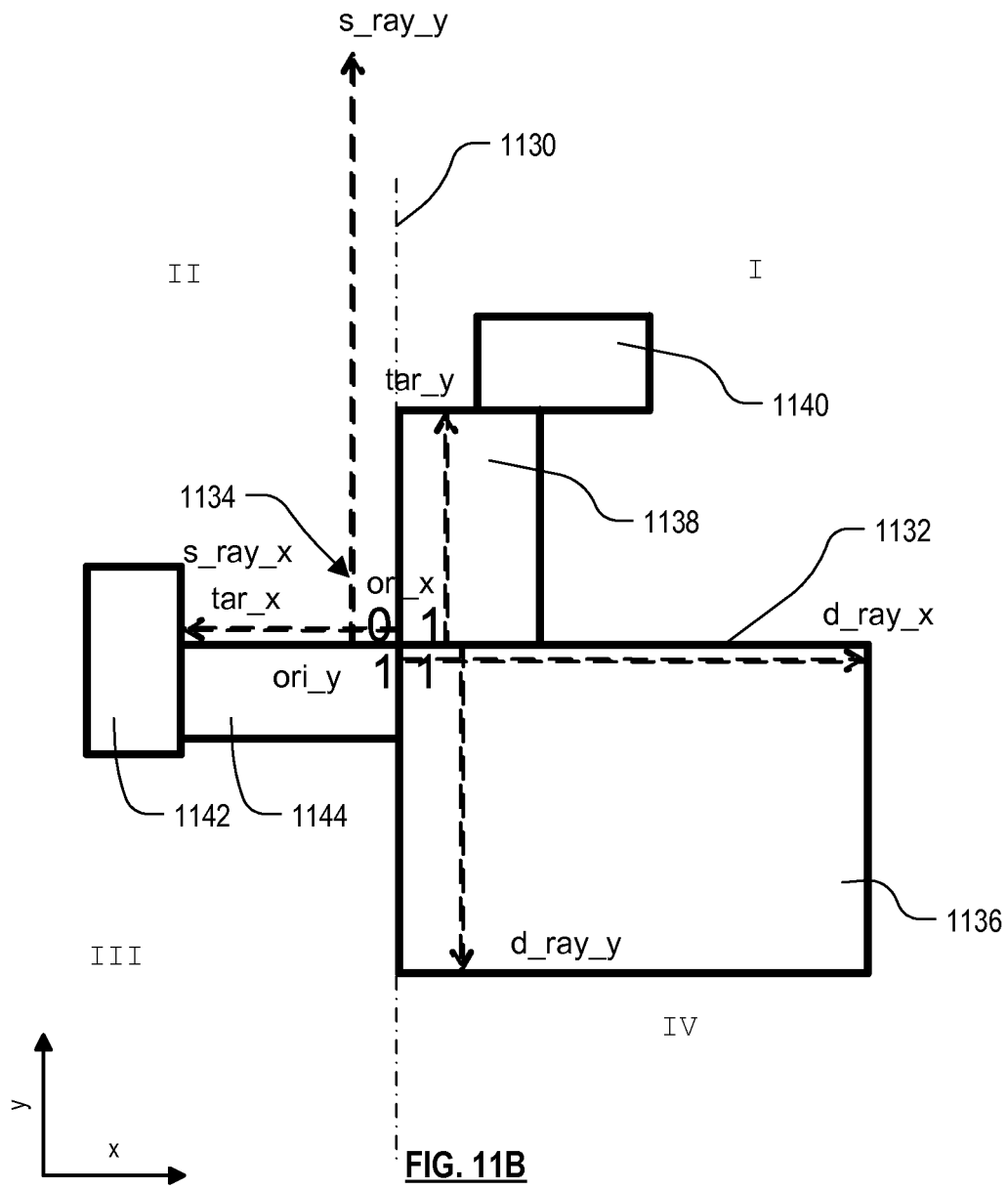

In step 1012, current_scan_line is updated by adding all horizontal edges having a left-hand endpoint located at the current horizontal scan position, In step 1014, the quadrant depth vector (FIG. 5) for each edge in the current vertical scan line multimap is updated. In order to illustrate this step, reference is made to FIGS. 11A and 11B, which illustrate simple portions of a layout. FIG. 11A highlights a convex corner 1114, whereas FIG. 11B highlights a concave corner 1134. In FIG. 11A, 1110 is the current vertical scan line and 1112 is a particular edge being considered. Edge 1112 is represented in the enter_tree and in current_scan_line, and has a left-hand endpoint 1114 located on vertical scan line 1110. Edge 1112 also forms the upper edge of a rectangle 1116. Four other rectangles are also shown in the figure, 1118, 1120, 1122 and 1124. Four quadrants, centered at endpoint 1114 and numbered I, II, III and IV for purposes of the present discussion, are also shown in FIG. 11A. Similarly, in FIG. 11B, 1130 is the current vertical scan line and 1132 is a particular edge being considered. Edge 1132 is represented in the enter_tree, and has a left-hand endpoint 1134 located on vertical scan line 1110. Edge 1132 also forms the upper edge of a rectangle 1136. Four other rectangles are also shown in the figure, 1138, 1140, 1142 and 1144. The four quadrants I, II, III and IV, centered at endpoint 1134, are also shown in FIG. 11B.

The quadrant depth vector indicates the number of shapes in a particular layer that border a particular edge endpoint in each of the four quadrants centered at that endpoint. In FIG. 11A, quadrants I, II and III contain no shapes that border endpoint 1114, and quadrant IV contains one such shape 1116. Thus the quadrant depth vector at endpoint 1114 is (0,0,0,1). On the other hand, in FIG. 11B, quadrant II contains no shapes that border endpoint 1134, whereas quadrants I, III and IV each contain one such shape. Thus the quadrant depth vector at endpoint 1134 is (1,0,1,1). It can be seen that if exactly one quadrant depth is zero, then the point represents a concave corner of an island, as in FIG. 11B. If exactly two values are zero, and they are in adjacent quadrants, then the endpoint is not on a corner of an island. If the two zeros are in diagonally opposite quadrants, then the endpoint is a corner of two diagonally adjacent islands, sharing the one corner. If exactly three values are zero, as in FIG. 11A, then the endpoint represents a convex corner of an island, island 1116 in FIG. 11A. if none of the values are zero, then the endpoint is inside an island and does not represent a corner of an island. The quadrant depth vector is used in later steps, as described hereinafter.

In step 1014, the updating of the quadrant depth vector for an edge in the enter_tree (i.e. an edge whose left-hand endpoint ties on the current vertical scan line), involves incrementing the value for either quadrant I or quadrant IV by one. The value for quadrant I is incremented if the "edge against scan line?" Boolean for the edge 1112 indicates True (i.e. the edge is the bottom edge of a shape), or the value for quadrant IV is incremented if the "edge against scan line?" Boolean for the edge 1112 indicates False (i.e. the edge is the top edge of a shape). Similarly, the updating of the quadrant depth vector for an edge in the exit_tree (i.e. an edge whose right-hand endpoint lies on the current vertical scan line), involves decrementing the value for either quadrant I or quadrant IV by one. The value for quadrant is decremented if the "edge against scan line?" Boolean for the exiting edge indicates True (i.e. the edge is the bottom edge of a shape), or the value for quadrant IV is decremented if the "edge against scan line?" Boolean for the exiting edge indicates False (i.e. the edge is the top edge of a shape). It can be seen that the quadrant depth vector increments quantities as the vertical scan line encounters shapes while moving left-to-right across the region. It decrements quantities as the scan line moves past shapes.

Figure 24:
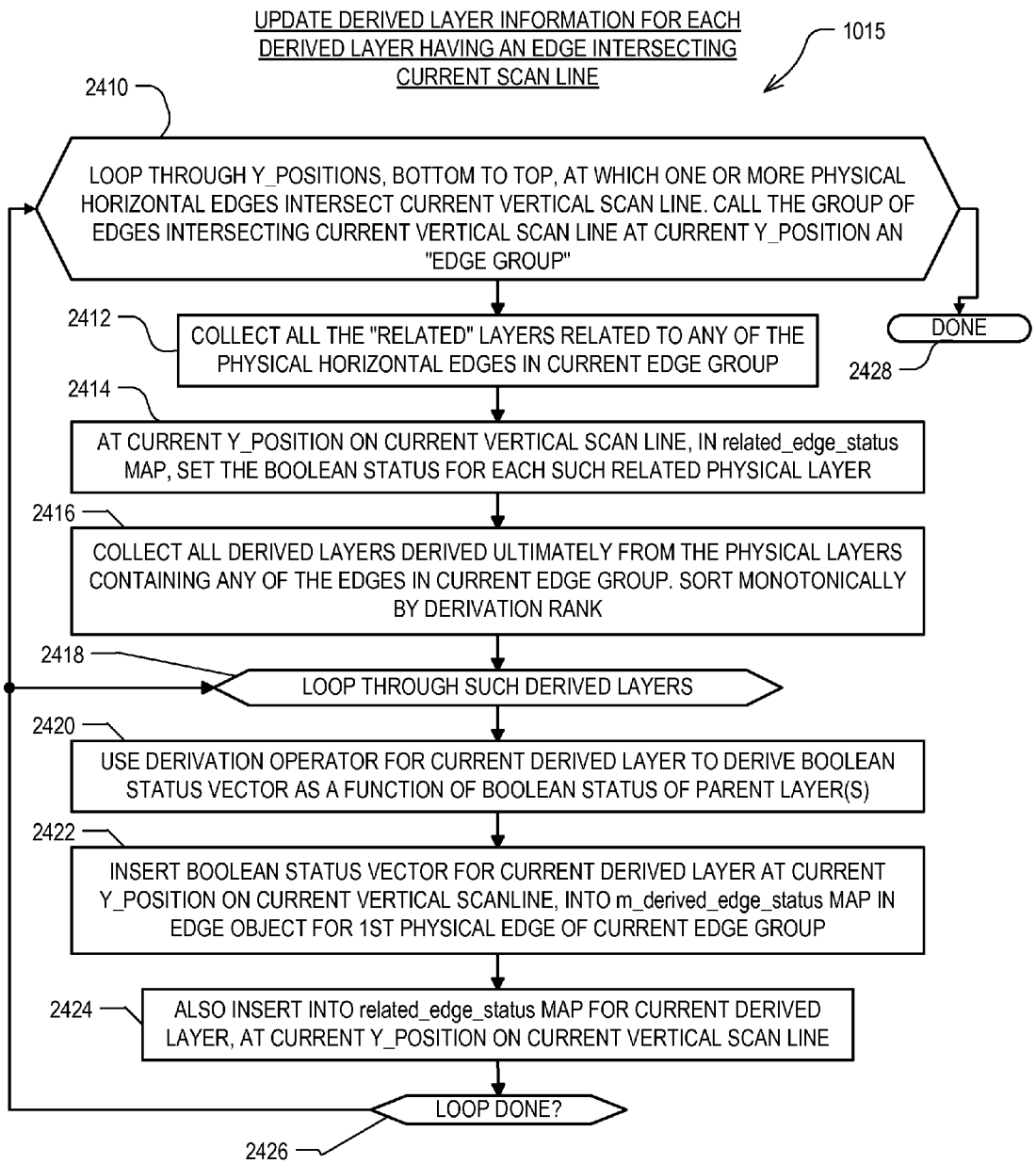

In step 1015, the derived layer information is populated for each derived layer having an edge intersecting the current scan line. FIG. 24 is a flow chart detail of step 1015. Referring to FIG. 24, in step 2410, a loop is begun to traverse through all the y_positions, bottom to top, at which one or more physical horizontal edges intersect the current vertical scan line. These edges are collinear, with each other, in plan view. Some may be on different layers, and some may occupy the same layer and be superimposed on each other. This group of collinear edges intersecting the current vertical scan line at current y_position is sometimes referred to herein as an "edge group".

In step 2412, the system collects all the "related" physical layers related to any of the physical horizontal edges in current edge group. As used in FIG. 24, two physical layers are considered "related" if they are both ancestors of a common derived layer. Preferably, the collections of "related" layers have been precompiled and cached for easy retrieval in this step 2'412.

In step 2414, at the current y_position on current vertical scan line, the Boolean status vector for each related physical layer is determined and written into a map object referred to herein as a related_edge_status map. At this step, the related_edge_status map is populated only for physical layers.

In step 2416, all the derived layers derived ultimately from physical layers containing any of the edges in current edge group are collected. The system sorts these monotonically according to their rank. Thus derived layers that involve fewer derivation steps appear earlier in this collection than those that involve more derivation steps. This arrangement ensures that during a traversal of the collection in sorted order to calculate derived layer information, those derived layers which are ancestors of a child derived layer will already have been calculated by the time the child derived layer is reached.

In step 2418, a loop is begun through the derived layers in the collection, in sorted order. in step 2420, the derivation operator for the current derived layer is used to derive the Boolean status vector for the derived edge on the current derived layer at the current xrly position. The four elements of the Boolean status vector are calculated simply by applying the derivation operator for the current derived layer separately to each of the four elements of the Boolean status of the parent layer(s) referred to by the derivation operator for the current derived layer. For example, if the derivation operator for derived layer D1 is "P1 AND P2", where P1 and P2 are physical layers, and the Boolean status vectors for P1 and P2 at the current x/y position are (a,b,c,d) and (e,f,g,h), respectively, then the Boolean status vector for the derived edge on the current derived layer at the current x/y position is calculated as (a·e, b·f, c·g, d·h).

In step 2422, the Boolean status vector just calculated for current derived layer at current y_position on current vertical scan line is inserted into the m_derived_edge_status map in the edge object 524 for the first physical edge of current edge group. In step 2424, the Boolean status vector just calculated is also inserted into the related_edge_status map for the current derived layer, at the current y_position on the current vertical scan line. This prepares the related_edge_status map in case a subsequent derived layer of higher rank refers to the current derived layer in its derivation operator.

In step 2426, it is determined whether there are any more derived layers in the collection prepared in step 2416. If so, then the system returns to step 2418 to derive the Boolean status vector for the next such derived layer. If not, then the system returns to step 2410 to address the edge group intersecting the current vertical scan line at the next y-position. If there are no more such y-positions, then step 1015 for populating the derived layer information for derived layers having an edge intersecting the current vertical scan line is complete (step 2428). It can be seen that in the embodiment of FIG. 24, no shapes are actually calculated for the derived layers. Only certain information about the derived edges are calculated and stored at positions where they intersect the specific vertical scan lines that correspond to endpoints of horizontal physical edges in the layout. As used herein, any information about the location or shape of derived shapes is considered to constitute "shape information". In addition, it will be seen that the shape information that the system derives in step 1015 about derived shapes includes, among other things, sufficient information to indicate the locations of the corners of the derived shape, Returning to FIG. 10, in step 1016, each of the edges whose left-hand endpoint lies on the current scan line are processed. These are the edges represented in enter_tree. As they are processed, a "corner" data structure for the endpoint is populated. The corner data structure, which is used for both physical and derived corners, stores the information illustrated in FIGS. 11A and 11B. It can be described in a C++ like pseudocode class definition as follows:

```
class corner
{
    edge* m_origin_x;        // ori_x vertical edge meeting at the
                              corner. Of the edge endpoints, only the x-
                              coordinates are populated.
    edge* m_origin_y;        // ori_y horizontal edge meeting at the
                              corner. Of the edge endpoints, only the y-
                              coordinates are populated.
    edge* m_target_x;        // tar_x nearest vertical edge, walking
                              horizontally along shape contour from corner
    edge* m_target_y;        // tar_y nearest horizontal edge, walking
                              vertically along shape contour from corner
    edge*
    m_space_ray_x;           // s_ray_x nearest vertical facing edge,
                              walking horizontally from corner, away from
                              shape
    edge*
    m_space_ray_y;           // s_ray_y nearest horizontal facing edge,
                              walking vertically from corner, away from
                              shape
    edge*                    // d_ray_x last vertical edge walking
    m_dimension_ray_x;       horizontally into shape, before exiting
                              shape
    edge*                    // d_ray y last horizontal edge walking
    m_dimension_ray_y;       vertically into shape, before exiting shape
    std::list<corner*> m_neighbor_list; // list of nearest neighbor
                              corners
    bool m_is_convex;        // whether the corner is convex or concave
    ray* create_space_ray_x( ) {
        ray* p_ray = new ray(this);
        // the first point is the corner position, i.e., the tail of the arrow
        p_ray->m_p1.x = m_origin_x->m_point1.x;
        p_ray->m_p1.y = m_origin_y->m_point1.y;
        // the second point is the x position of the m_space_ray_x, i.e., the
            head of the arrow
        p_ray->m_p2.x = m_space_ray_x->m_point1.x;
        p_ray->m_p2.y = m_origin_y->m_point1.y;
        return p_ray;
    };
    ray* create_space_ray_y( ) {
        ray* p_ray = new ray(this);
        // the first point is the corner position, i.e., the tail of the arrow
        p_ray->m_p1.x = m_origin_x->m_point1.x
        p_ray->m_p1.y = m_origin_y->m_point1.y;
        // the second point is the y position of the m_space_ray_y, i.e., the
            head of the arrow
        p_ray->m_p2.x = m_origin_x->m_point1.x;
        p_ray->m_p2.y = m_space_ray_y->m_point1.y;
        return p_ray;
    };
    ray* create_dimension_ray_x( ) {
        ray* p_ray = new ray(this);
        // the first point is the corner position, i.e., the tail of the arrow
        p_ray->m_p1.x = m_origin_x->m_point1.x;
        p_ray->m_p1.y = m_origin_y->m_point1.y;
        // the second point is the x position of the m_dimension_ray_x, i.e.,
            the head of the arrow
        p_ray->m_p2.x = m_space_dimension_x->m_point1.x;
        p_ray->m_p2.y = m_origin_y->m_point1.y;
        return p_ray;
    };
    ray* create_dimension_ray_y( ) {
        ray* p_ray = new ray(this);
        // the first point is the corner position, i.e., the tail of the arrow
        p_ray->m_p1.x = m_origin_x->m_point1.x;
        p_ray->m_p1.y = m_origin_y->m_point1.y;
        // the second point is the y position of the m_dimension_ray_y, i.e.,
            the head of the arrow
        p_ray->m_p2.x = m_origin_x->m_point1.x;
        p_ray->m_p2.y = m_space_dimension_y->m_point1.y;
        return p_ray;
    };
};
```

Note that for derived corners, the edge* objects in the above class all represent physical edges. Only the position of the edge* are useful (borrowed) for derived edges.

A ray object represents essentially an arrow with a head point and tail point. All the tail points coincide with the current corner. For Manhattan layouts the rays are either horizontal or vertical, though in 45 degree layouts it can also have either of the two diagonal orientations. The 'ray' class is described in a C++ like pseudocode class definition as follows:

```
class ray
{
    corner* m_parent_corner;
    bool is_s_ray;
    point m_p1;
    point m_p2;
}
```

The corner data structures developed during the scan are maintained as entries in a synchronized_corner_map structure. This structure is a map, in which the keys identify a physical or derived layer number and an x and y position on that layer, and the values are objects of class 'corner'. Only edges on physical layers are handled in this step 1016; derived layer edges are processed in step 1019.

Figure 12:
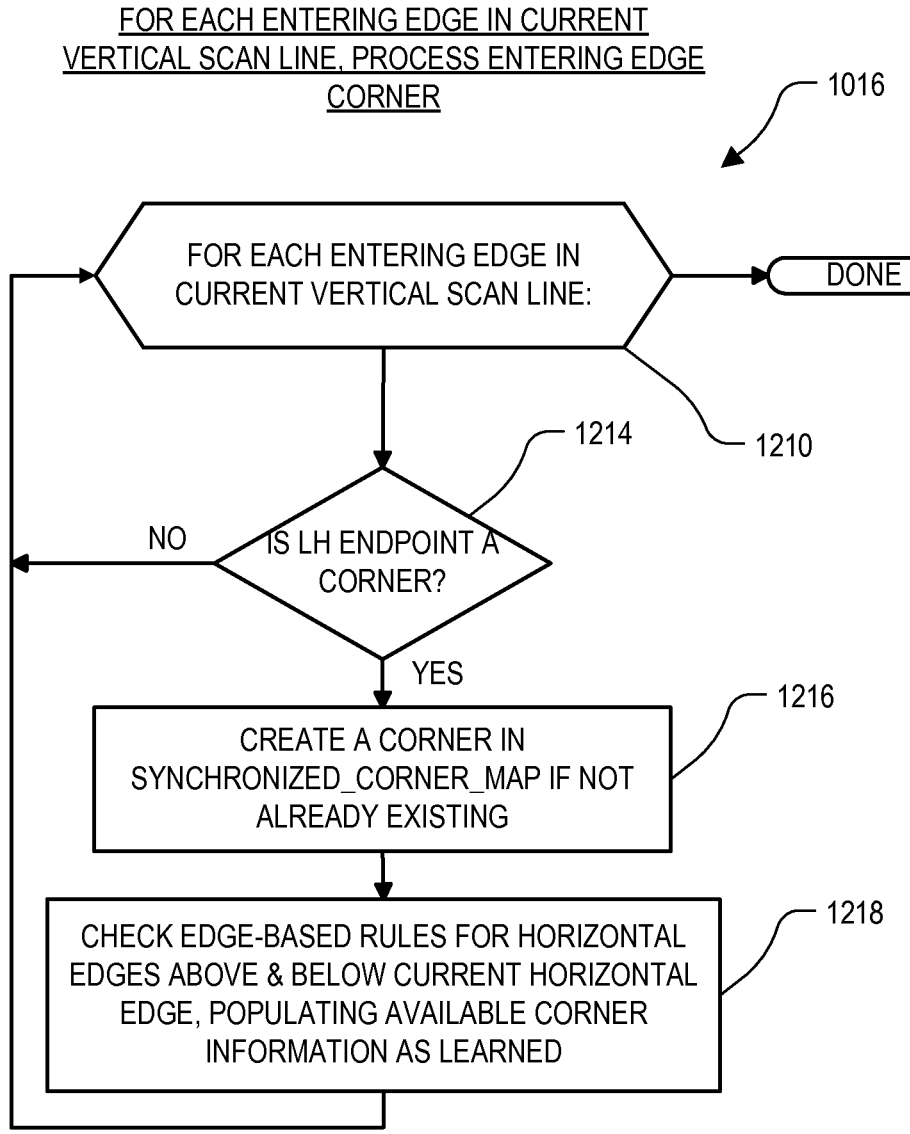

FIG. 12 is a flow chart detail of step 1016, for processing the entering edges. in step 1210, each of the physical entering edges represented in the current vertical scan line are considered. In FIG. 11A, this will be only edge 1112. In FIG. 11B, this will be edge 1132, as well as the top and bottom edges of rectangle 1138. In step 1214, it is determined whether the left-hand endpoint of the current edge is a corner of an island. This is determined by reference to the current quadrant vector, as described previously. If it is not a corner of an island, then the edge is skipped.

In step 1216, a corner data structure for the left-hand endpoint of the current edge is instantiated in synchronized_corner_map if it does not already exist. The corner data structure might already exist in synchronized_corner_map if, for example, the corner had already been encountered because of a different horizontal edge on the same layer that starts at the same point (such as the bottom edge of rectangle 1138 in FIG. 11B), or as part of the vertical scan in an embodiment in which the vertical scan precedes or operates concurrently with the horizontal scan. In step 1218, the system walks upward and downward along the current vertical scan line from the current horizontal edge, populating the available corner information as it is learned. In particular, referring to the corner data structure definition above and the illustrations in FIGS. 11A and 11B, the edges s_ray_y, tar_y and d_ray_y, as well as any others required by the design rules, are populated. Note that these values identify the shape edges at the head of the respective ray. The ray itself is identified separately in the corner data structure, as previously mentioned.

In one embodiment, all design rule checks are performed only after all scans are complete. However, the present embodiment incorporates a feature in which the system performs certain simple edge-based rule checks as part of step 1218. For example, if the current edge is a top edge and the walk upwards along the current vertical scan line meets the bottom edge of a shape in the same layer, then s_ray_y is populated in the corner data structure and the minimum spacing rule is checked as well. This check involves comparing the length of s_ray_y with the minimum spacing value in the relationship_master. If the current edge is a top edge and the walk upwards along the current vertical scan line meets the top edge of a shape in a different layer, then the minimum extension rule is checked by comparing the distance walked to the minimum extension value for the appropriate layer pair in the relationship_master. If the current edge is a bottom edge and the walk upwards along the current vertical scan line meets the top edge of a shape in the same layer, then d_ray_y is populated, and also the minimum dimension rule is checked. This check involves comparing the value of d_ray_y with the minimum dimension value in the relationship_master. If the current edge is a bottom edge and the walk upwards along the current vertical scan line meets the top edge of a shape in a different layer, then the minimum overlap rule is checked. Similar checks are performed during the walk downward from the current edge. If during the walks up and down the current vertical scan line, the distance walked exceeds the worst case limit from the relationship master, there is no design rule violation encountered and it is not necessary to populate further items in the corner data structure that would be encountered in the current walking direction.

After the available corner structure information items have been populated, then the system returns to step 1210 to consider the next entering edge in the current vertical scan line.

Figure 13:
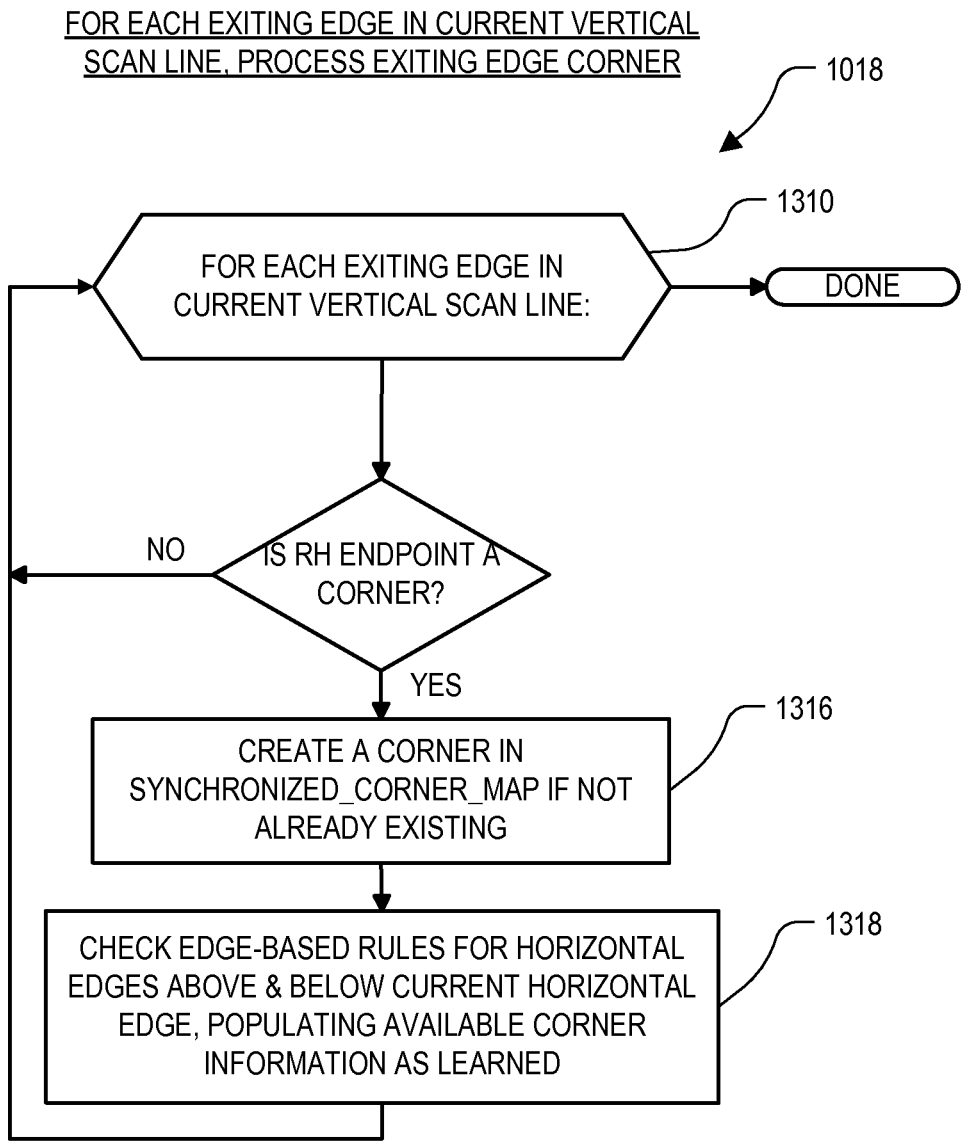

FIG. 13 is a flow chart detail of step 1018 for processing exiting edge corners, Again, only physical edges are addressed in step 1018. In step 1310; each of the exiting physical edges represented in the current vertical scan line are considered. In step 1314, it is determined whether the right-hand endpoint of the current edge is a corner of an island. This is determined by reference to the current quadrant vector, as described previously. If it is not a corner of an island, then the edge is skipped.

In step 1316, a corner data structure for the right-hand endpoint of the current edge is instantiated in synchronized_corner_map if it does not already exist. Again, the corner data structure might already exist in synchronized_corner_map if, for example, the corner had already been encountered because of a different horizontal edge on the same layer that ends at the same point, or as part of the vertical scan in an embodiment in which the vertical scan precedes or operates concurrently with the horizontal scan. In step 1318, the system walks upward and downward along the current vertical scan line from the current horizontal edge, populating the available corner information as it is learned. In particular, referring to the corner data structure definition above and the illustration in FIGS. 11A and 1113, the edges s_ray_y, tar_y and d_ray_y, as well as any others required by the design rules, are populated.

In addition, preferably but not essentially, the system also in step 1318 performs the same edge-based rule checks for the exiting edges as performed and described above with respect to step 1218 for entering edges.

After the available corner structure information items have been populated, then the system returns to step 1310 to consider the next exiting edge in the current vertical scan line.

Figure 25:
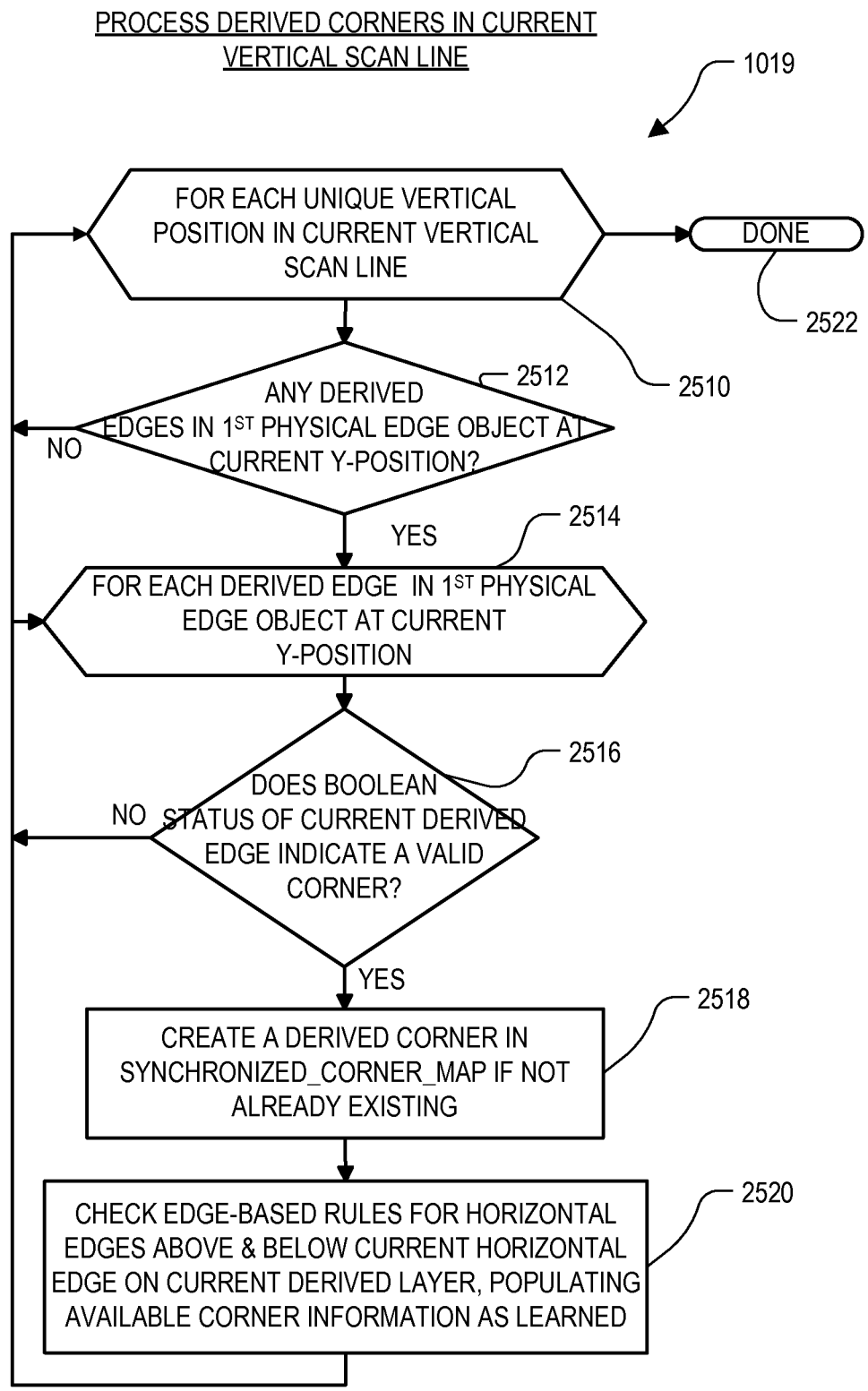

Returning to FIG. 10, after both the entering and exiting physical edges having an endpoint on the current vertical scan line are processed, the system processes all the derived corners in the current vertical scan line (step 1019). FIG. 25 is a flow chart detail of step 1019. Because derived edge status vectors are by convention kept on the first physical edge of each unique position in the current scan line in the present embodiment, it is not useful to loop separately through edges in Enter_tree separately from edges in Exit_tree. Instead, one loop is performed vertically along the current vertical scan line, from bottom to top, stopping at each unique vertical position at which there is an edge object. Thus referring to FIG. 25, in step 2510, the current vertical scan line is walked from bottom to top, stopping at each unique vertical position at which an edge object exists. In step 2512, it is determined whether the first physical edge object at the current vertical position contains any derived edge status vectors. Only the first physical edge object need be checked at each vertical position, because by convention in the present embodiment, that is where the derived edge status map for all horizontal derived edges at the current x/y position are kept. If it is determined that there are no derived edges in the first physical edge object at the current vertical position, then the system returns to step 2510 to consider the next unique vertical position in the current vertical scan line.

If there are derived edges, then in step 2514 the system begins another loop through all the derived edges in the derived edge status map in the first physical edge object at the current vertical position. In step 2516, it is determined whether the Boolean status of the current derived edge indicates a valid corner. As previously explained, on long as the Boolean status is neither all zeros nor all ones, the corner is valid. If the current derived edge is not a corner, then the edge is skipped, If the current derived edge is a valid corner, then in step 2518, a corner data structure for the current derived edge is instantiated in synchronized_corner_map if it does not already exist. In step 2520, the system walks upward and downward along the current vertical scan line from the current derived edge, populating the available derived corner information as it is learned. In particular, as for physical layer edges, s_ray_y, tar_y and d_ray_y, as well as any others required by the design rules, are populated. Also in step 2520, like in step 1218 for physical layer edges, the system performs certain simple edge-based rule checks such as minimum spacing and minimum dimension on the current derived layer, and minimum extension and minimum overlap relative to other layers (physical or derived). All the same design rule checks are performed on the derived layers as set forth above with respect to step 1218. Additionally, like in step 1218, if during the walks up and down the current vertical scan line on the current derived layer, the distance walked exceeds the worst case limit from the relationship master, there is no design rule violation encountered and it is not necessary to populate further items in the corner data structure that would be encountered in the current walking direction.

After the available derived corner structure information items have been populated, then the system returns to step 2514 to consider the next derived edge in the current physical edge object. f there are no more derived edges in the current physical edge object, then the system returns to step 2510 to move to the next unique vertical position in the current vertical scan line. If there are no more vertical positions represented in the current vertical scan line, then step 1019 concludes (step 2522).

Returning to FIG. 10, after both the physical and derived layer edges at the current vertical scan line are processed, the system populates or updates information about islands (step 1020), Islands are represented in objects of class 'island,' and maintained in a map of class 'island_map'. They are instantiated as the vertical scan line encounters them as it scans horizontally, and are updated as the vertical scan line moves across them horizontally, corner to corner. Islands are determined and checked on both physical layers and derived layers. Pertinent parts of the 'island' data structure are described in a C++ like pseudocode class definition as follows:

```
class island
{
    // For horizontal scan, this is the iterator in
    // current_scan_line of the bottom_most_edge of the island
    edge_tree::iterator m_start_iterator;
    // For horizontal scan, this is the iterator in
    // current_scan_line of the top_most_edge of the island
    edge_tree::iterator m_end_iterator;
    // the unique id of the island.
    // Islands are split or merged during the horizontal scan.
    // When an island is split, the island id is not split
    // (i.e., multiple islands will share same id), so we know
    // these islands are actually sub-islands of a larger island;
    // When multiple islands merge together, the smallest island
    // id is used as the shared id for all the islands merged together.
    int m_island_id;
    // accumulating the common run length against the same layer.
    // For efficiency, 2D spacing rules are checked during scan,
    // not after. In another embodiment they could be checked afterwards.
    int m_last_valid_common_run_position;
    // accumulating the common run length against different layers
    std::map<layer_number, int> m_last_valid_top_position_vector;
    std::map<layer_number, int>
    m_last_valid_bottom_position_vector;
    // accumulating the area of this island so far
    int m_area;
    // accumulating the area of the potential hole right above this island.
    int m_hole_area;
    // Horizontal position that current_scan_line stopped last time
    int m_last_position_updated;
};
```

Among other things, the island data structure accumulates the following information about a particular island during the process of the horizontal scan: area of the island, area of a hole just above the island, common run lengths against other islands in the same layer and islands in other layers. For clarity of illustration, the present description will concentrate primarily on the island area as an example of island-based. rule checking Reference will be made to FIG. 19E, which illustrates a sample layout region having three overlapping rectangles 1932, 1934 and 1936, all on a single physical layer. Because they overlap on a single layer, they form a single island 1930.

Roughly described, island area is accumulated during the horizontal scan by using the shape corners to divide the island into non-overlapping "island rectangles", the area of which are easily determined from the horizontal edges represented in the current vertical scan line. In the example of FIG. 19E, the method divides the island 1930 into five island rectangles bounded horizontally by the broken vertical lines 1938. Like for the extraction of corner data, the updating of island data takes place only at those vertical scan lines containing a corner of the island. Horizontal scanning does not stop anywhere between corners. A rectangle (not shown) disposed entirely within rectangle 1932, for example, will not bear on any island design rule and does not become a stopping place during the scan. A high level description of the process is illustrated in the flow chart of FIG. 23.

Figure 23:
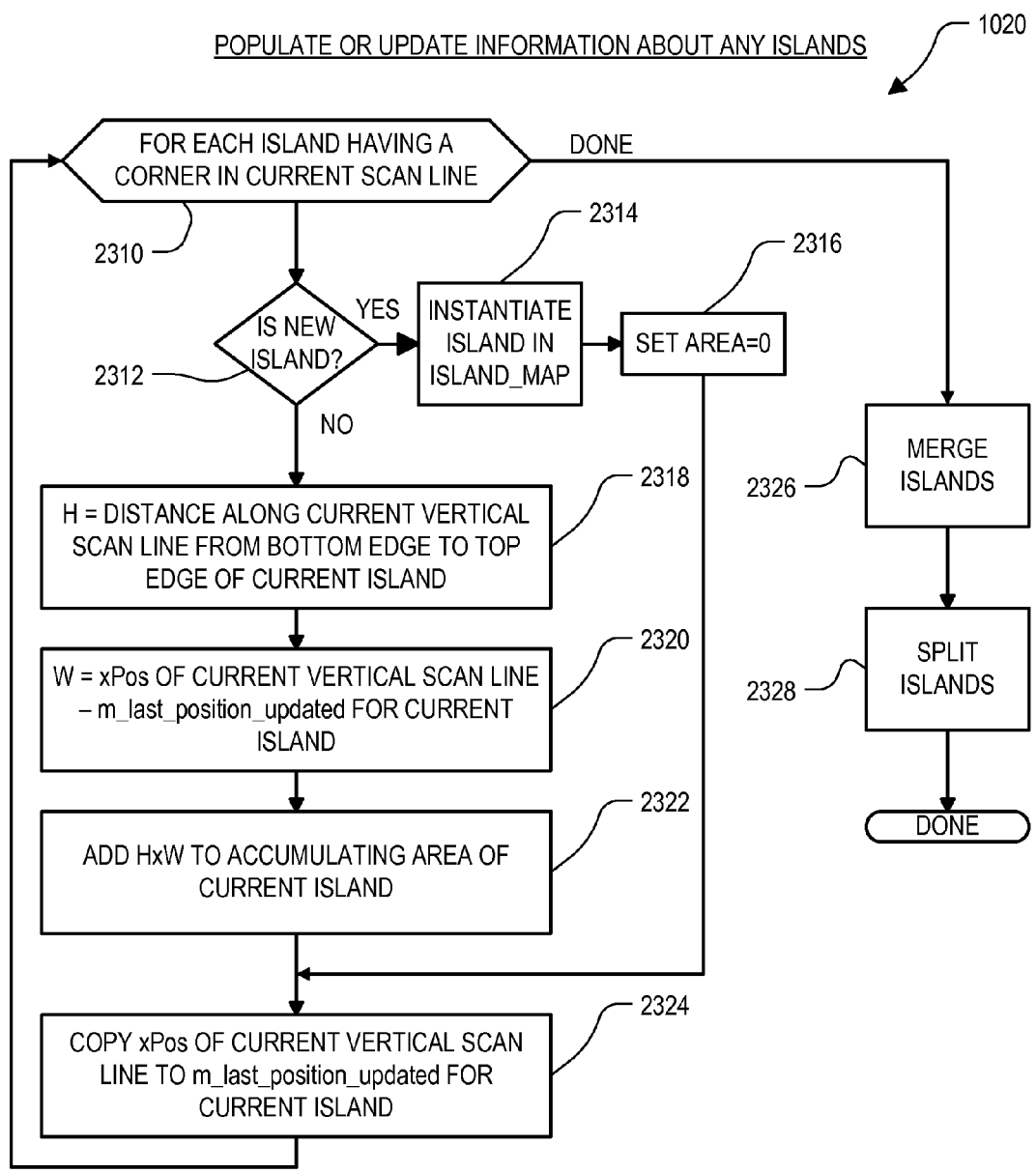

Referring to FIG. 23, as mentioned, the islands are stored in a map called island_map. The keys of island_map identify the lower left corner of a respective island. In step 2310, each island having a corner lying on the current vertical scan line is considered. In step 2312, if the corner represents an island being encountered for the first time during the scan, a new island data structure is instantiated in island_map (step 2314). The area is set to zero (step 2316) and in step 2324, the value of m_last_position_updated for the new island is set equal to the x-position of the current vertical scan line.

If the current island is already represented in island_map, then effectively a vertical slice is made through the current island at the current vertical scan line; and the area of the left-adjacent rectangle is added to the area being accumulated. Accordingly, in step 2318, the height H of the left-adjacent rectangle is calculated as the distance along the current vertical scan line from the bottom edge of the current island to the top edge of the current island. This information is available in current_scan_line, because at least one of the top and bottom edges is a corner, and the y-position of the corner is available as the left- or right-hand endpoint of a horizontal edge in the current vertical scan line. The other of the top and bottom edges may also be a corner, or may be an edge that merely intersects the current vertical scan line. In either case its y-position is available as well in current_scan_line. In step 2320, the width W of the left-adjacent rectangle is calculated as the horizontal position of the current scan line minus the last scan line position at which island information was updated, which is the value in m_last_position_updated. in step 2322 the product of H and W is added to the area value for the current island.

In step 2324, as mentioned above, the value of m_last_position_updated for the new island is set equal to the x-position of the current vertical scan line. The method then returns to step 2310 for consideration of the next island having a corner on the current vertical scan line.

Once all islands having a corner on the current vertical scan line have been considered, then any two or more of such islands that are now vertically-adjacent are merged into a single island in step 2326 and their area values summed. In step 2328, any island that is now split into two, perhaps separated vertically by a newly encountered hole or notch, are split. The details of the merging and splitting operations are not important for an understanding of the invention. Note that whereas island area information is captured during the horizontal scan, it is not compared to the design rule values in the present embodiment until later. Note also that whereas FIG. 19E and the flow chart of FIG. 23 have been described with respect to an island on a physical layer, the process is the same for islands on a derived layer.

Returning to FIG. 10, after the island data has been updated based on the current scan line, in step 1022, as a time saving technique, the quadrant depth vectors for each of the entering horizontal edges in the current vertical scan line are copied from the right-hand quadrants to the corresponding left-hand quadrants. In this manner the left-hand quadrant depth values can be incremented or decremented as the vertical scan line moves rightward, and will contain accurate values when the scan line reaches the right hand endpoint of the edge. No such updating is required for the status vectors for edges on derived layers. In step 1024, all the exiting edges are removed from the current vertical scan line. The routine then returns to step 1010 for the next horizontal scan position.

Figure 14:
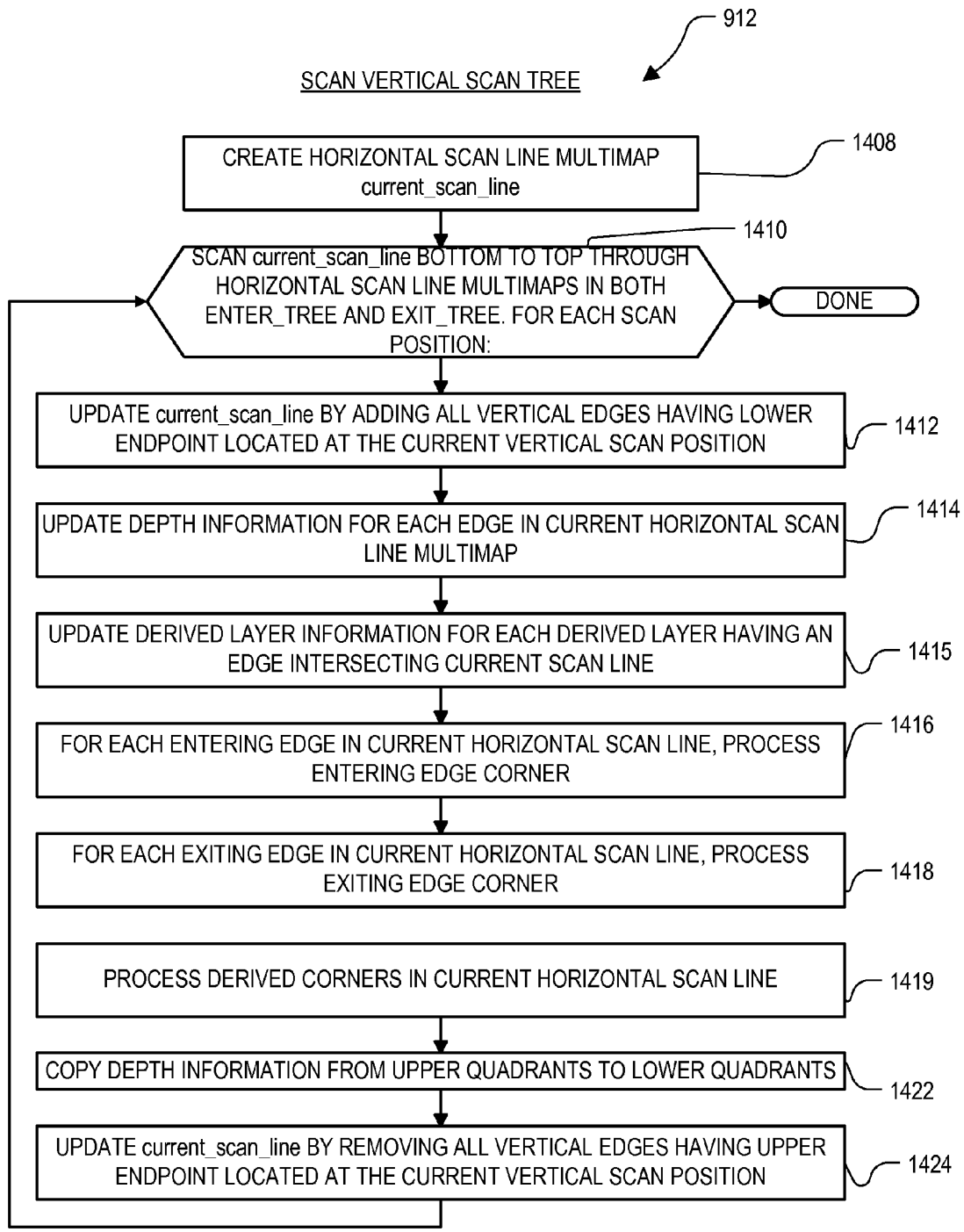

Returning to FIG. 9, after the horizontal scan tree has been scanned, the vertical scan tree is scanned (step 912). FIG. 14 is a flow chart of step 912, for scanning the vertical scan tree sweep_y.

FIG. 14 is a flow chart of step 912, for scanning the vertical scan tree sweep_y. step 1408, the horizontal scan line edge-tree multimap object current_scan_line is created. In step 1410, current_scan_line traverses both enter_tree and the exit_tree together so that the horizontal scan lines from both trees are considered in monotonically varying sequence, bottom to top. Since these two trees contain only those horizontal scan lines on which an endpoint of a vertical edge lies, intervening horizontal scan lines are skipped during this scan. Again, the existence of derived edges does not alter this plan since it is assumed for this part of the algorithm that all derived edge endpoints are co-located with at least one physical edge endpoint. The current horizontal scan line is maintained in a multimap object of class edge_tree, having the structure of edge_tree 620 (FIG. 6). It has a current horizontal scanning position, and stores the information shown in block 622 for each vertical edge that intersects a horizontal line at the current vertical scanning position.

In step 1412, current_scan_line is updated by adding all vertical edges having a lower endpoint located at the current horizontal scan position. In step 1414, the quadrant depth vector (FIG. 6) for each edge in the current horizontal scan line multimap is updated. This step involves, for an edge in the enter_tree (i.e. a vertical edge whose lower endpoint lies on the current horizontal scan line), incrementing the value for either quadrant I or quadrant II by one. The value for quadrant I is incremented if the "edge against scan line?" Boolean for the edge 1112 indicates True (i.e. the edge is the left-hand edge of a shape), or the value for quadrant II is incremented if the "edge against scan line?" Boolean for the edge 1112 indicates False (i.e. the edge is the right-hand edge of a shape). Similarly, the updating of the quadrant depth vector for an edge in the exit_tree (i.e. an edge whose upper endpoint lies on the current horizontal scan involves decrementing the value for either quadrant I or quadrant by one. The value for quadrant I is decremented if the "edge against scan line?" Boolean for the exiting edge indicates True (i.e. the edge is the left-hand edge of a shape), or the value for quadrant II is decremented if the "edge against scan line?" Boolean for the exiting edge indicates False (i.e. the edge is the right-hand edge of a shape). It can be seen that the quadrant depth vector increments quantities as the horizontal scan line encounters shapes while moving upward across the region. It decrements quantities as the scan line moves past shapes.

Figure 26:
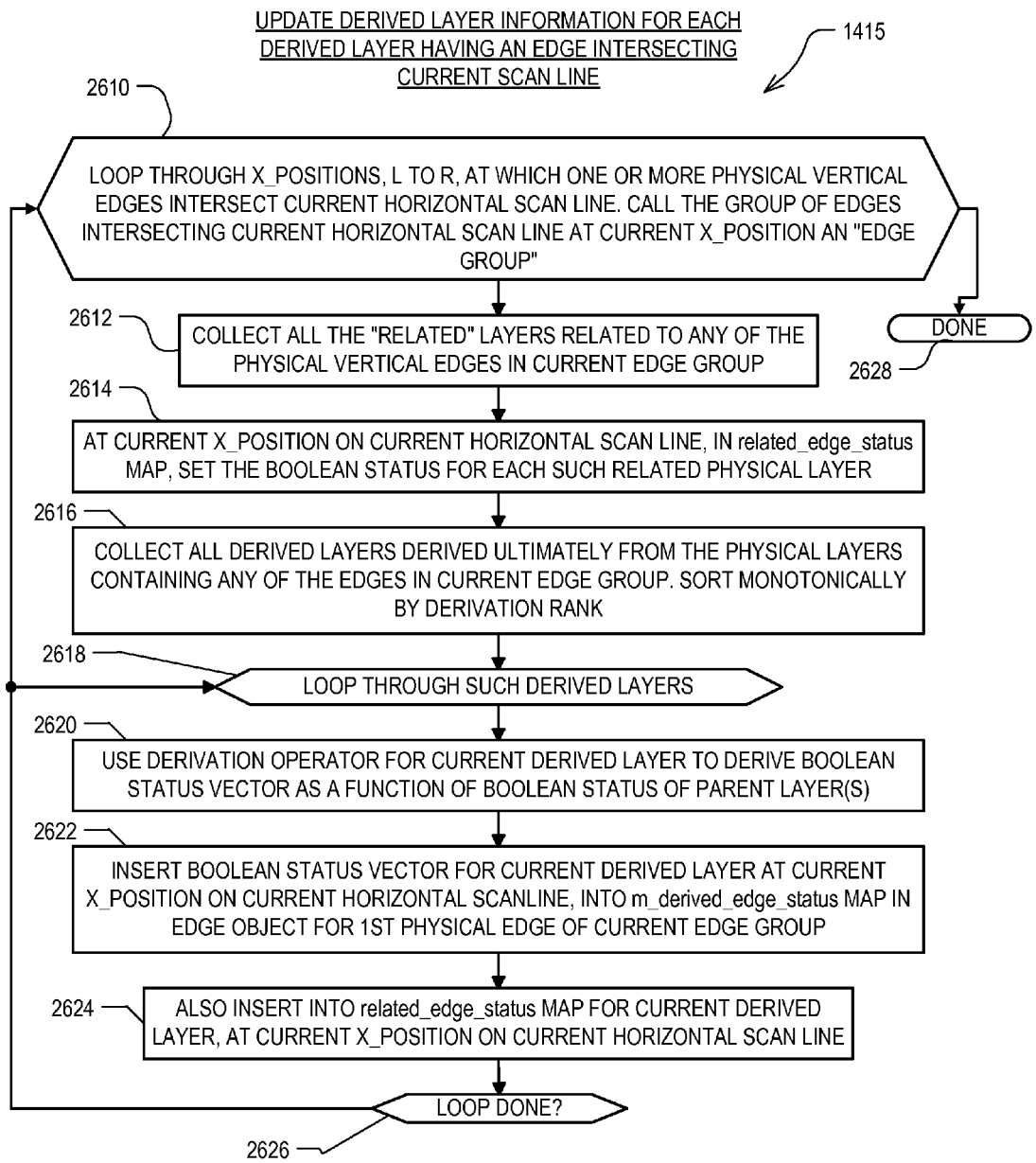

In step 1415, the derived layer information is populated for each derived layer having an edge intersecting the current scan line. FIG. 26 is a flow chart detail of step 1415. Referring to FIG. 26, in step 2610, a loop is begun to traverse through all the x_positions, left-to-right, at which one or more physical vertical edges intersect the current horizontal scan line. These edges are collinear with each other, in plan view. Some may be on different layers, and some may occupy the same layer and be superimposed on each other. Like in FIG. 24, this group of collinear edges intersecting the current horizontal scan line at current x_position is sometimes referred to herein as an "edge group".

In step 2612, the system collects all the "related" physical layers related to any of the physical vertical edges in current edge group. Again, as used in FIG. 26, two physical layers are considered "related" if they are both ancestors of a common derived layer. Preferably, the collections of "related" layers have been precompiled and cached for easy retrieval in this step 2612.

In step 2614, at the current x_position on current horizontal scan line, the Boolean status vector for each related physical layer is determined and written into a related_edge_status map. At this step, the related_edge_status map is populated only for physical layers.

In step 2616, all the derived layers derived ultimately from physical layers containing any of the edges in current edge group are collected. The system sort these monotonically according to their rank, for the same reason as set forth above with respect to step 2416.

In step 2618, a loop is begun through the derived layers in the collection, in sorted order. In step 2620, the derivation operator for the current derived layer is used to derive the Boolean status vector for the derived edge on the current derived layer at the current x/y position. The four elements of the Boolean status vector are calculated by applying the derivation operator for the current derived layer separately to each of the four elements of the Boolean status of the parent layer(s) referred to by the derivation operator for the current derived layer.

In step 2622, the Boolean status vector just calculated for current derived layer at current x_position on current horizontal scan line is inserted into the m_derived_edge_status map in the edge object 524 for the first physical edge of current edge group. In step 2624, the Boolean status vector just calculated is also inserted into the related_edge_status map for the current derived layer, at the current x_position on the current horizontal scan line. This prepares the related_edge_status map in case a subsequent derived layer of higher rank refers to the current derived layer in its derivation operator.

In step 2626, it is determined whether there are any more derived layers in the collection prepared in step 2616. If so, then the system returns to step 2618 to derive the Boolean status vector for the next such derived layer. If not, then the system returns to step 2610 to address the edge group intersecting the current horizontal scan line at the next x-position. If there are no more such x-positions, then step 1415 for populating the derived layer information for derived layers having an edge intersecting the current horizontal scan line is complete (step 2628). It can be seen again that in the embodiment of FIG. 26, no shapes are actually calculated for the derived layers. Only certain information about the derived edges are calculated and stored at positions where they intersect the specific horizontal scan lines that correspond to endpoints of vertical physical edges in the layout.

Returning to FIG. 14, in step 1416, each of the physical edges whose lower endpoint lies on the current scan line are processed. These are the edges represented in enter_tree. As they are processed, the "corner" data structure for the endpoint is populated synchronized_corner_map. As mentioned, the relevant corner data structure may already exist from a previously encountered different vertical edge on the same layer that starts at the same point, or as part of the horizontal scan in an embodiment in which the horizontal vertical scan precedes or operates concurrently with the vertical scan.

Figure 15:
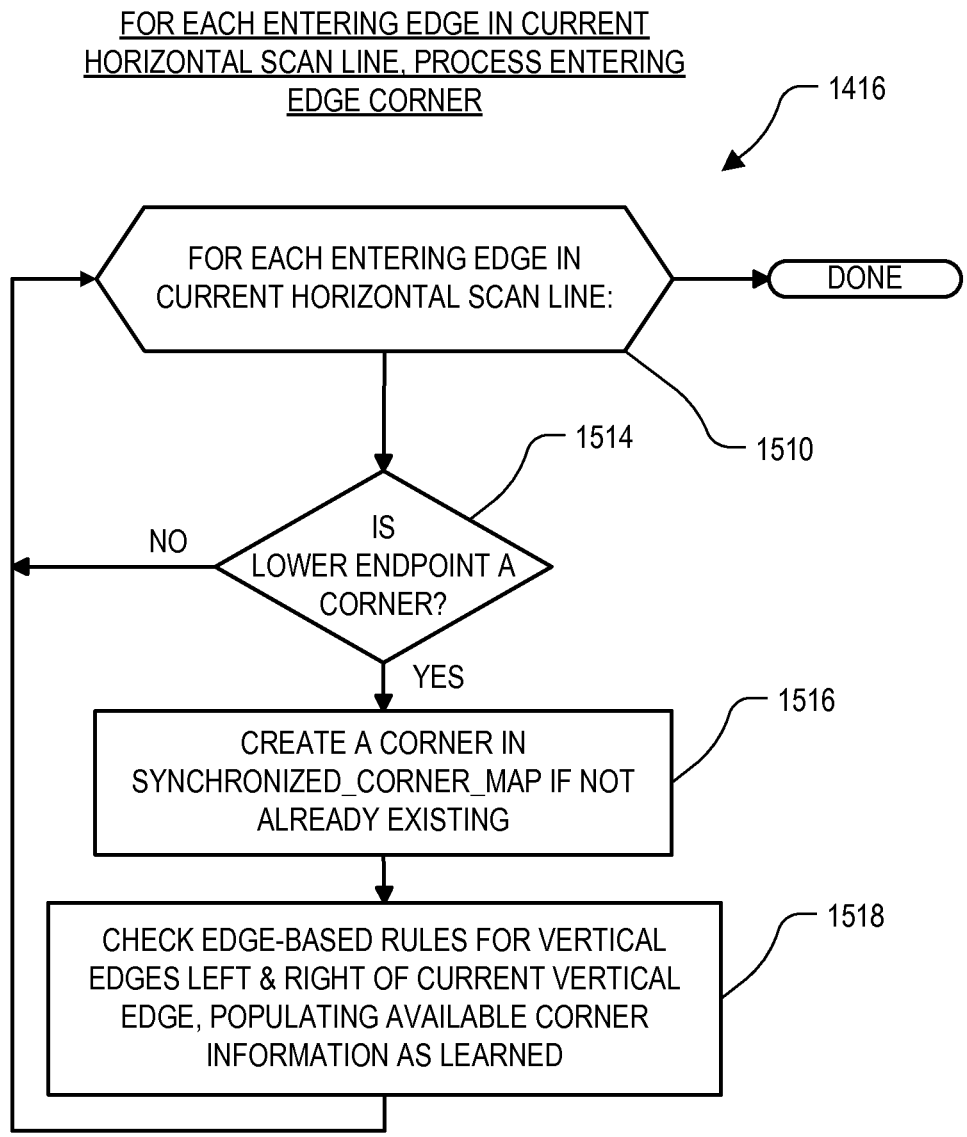

FIG. 15 is a flow chart detail of step 1416, for processing the entering edges. In step 1510, each of the entering physical edges represented in the current horizontal scan line are considered. In step 1514, it is determined whether the lower endpoint of the current edge is a corner of an island. This is determined by reference to the current quadrant vector, as described previously. If it is not a corner of an island, then the edge is skipped.

In step 1516, a corner data structure for the left-hand endpoint of the current edge is instantiated in synchronized_corner_map if it does not already exist. In step 1518, the system walks leftward and rightward along the current horizontal scan line from the Current vertical edge, populating the available corner information as it is learned. In particular, referring to the corner data structure definition above and the illustrations in FIGS. 11A and 11B, the edges s_ray_x, tar_x and d_ray_x, as well as any others required by the design rules, are populated.

In an embodiment, certain edge-based rule checks are also performed as part of step 1518, similar to those performed in step 1218. For example, if the current edge is a right-hand edge and the walk rightward along the current horizontal scan line meets the left-hand edge of a shape in the same layer, then s_ray_x is populated in the corner data structure and the minimum spacing rule is checked as well. This check involves comparing the length of s_ray_x with the minimum spacing value in the relationship_master. If the current edge is a right-hand edge and the walk rightwards along the current horizontal scan line meets the right-hand edge of a shape in a different layer, then the minimum extension rule is checked by comparing the distance walked to the minimum extension value for the appropriate layer pair in the relationship_master. If the current edge is a left-hand edge and the walk rightwards along the current horizontal scan line meets the right-hand edge of a shape in the same layer, then d_ray_x is populated, and also the minimum dimension rule is checked. This check involves comparing the value of d_ray_x with the minimum dimension value in the relationship_master. If the current edge is a left-hand edge and the walk rightwards along the current horizontal scan line meets the right-hand edge of a shape in a different layer, then the minimum overlap rule is checked. Similar checks are performed during the walk leftward from the current edge. If during the walks leftward and rightward along the current horizontal scan line, the distance walked exceeds the worst case limit from the relationship master, there is no design rule violation encountered and it is not necessary to populate further items in the corner data structure that would be encountered in the current walking direction.

After the available corner structure information items have been populated, then the system returns to step 1510 to consider the next entering edge in the current horizontal scan line.

Figure 16:
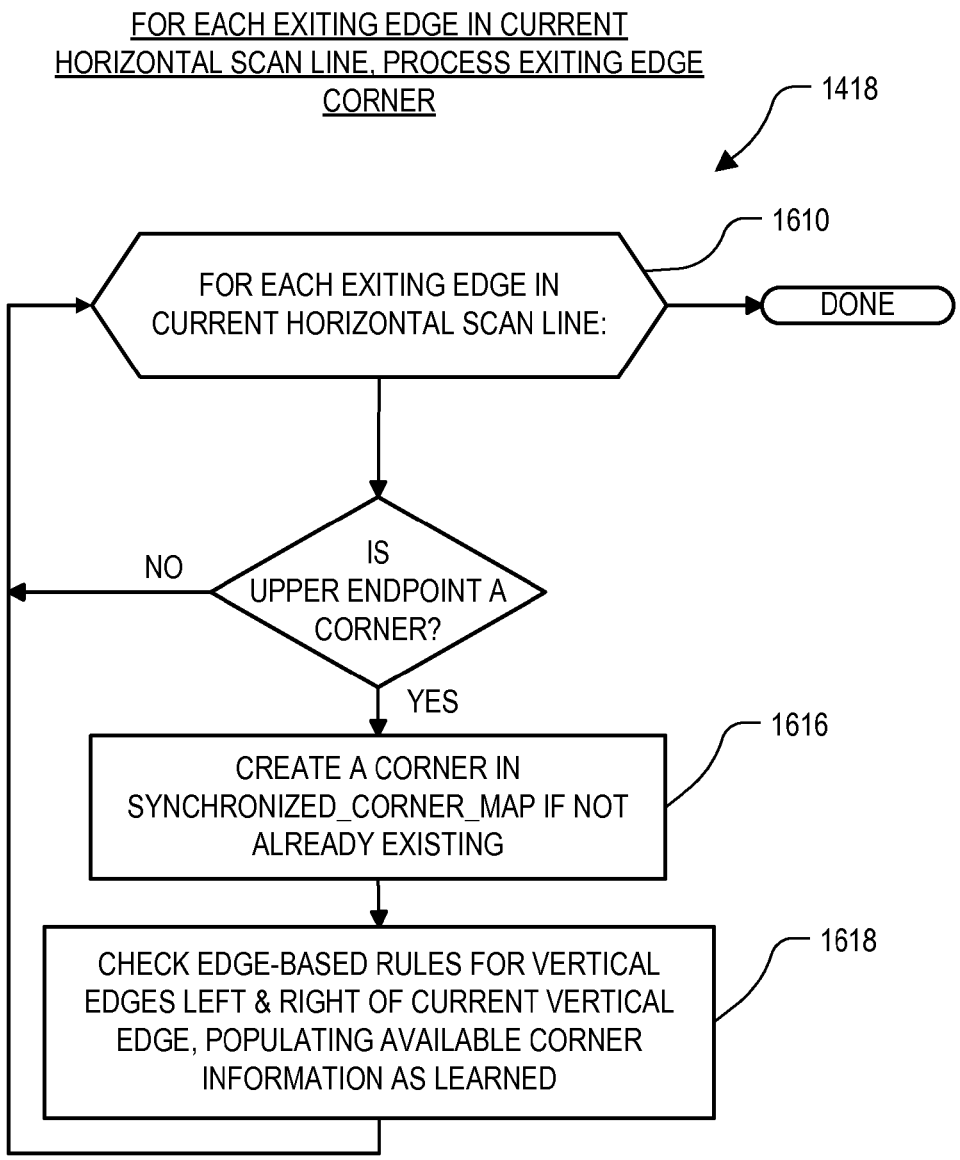

FIG. 16 is a flow chart detail of step 1418 for processing exiting edge corners. Again, only physical edges are addressed in step 1418. In step 1610, each of the exiting edges represented in the current horizontal scan line are considered. In step 1614, it is determined whether the upper endpoint of the current edge is a corner of an island. This is determined by reference to the current quadrant vector, as described previously. If it is not a corner of an island, then the edge is skipped.

In step 1616, a corner data structure for the upper endpoint of the current edge is instantiated in synchronized_corner_map if it does not already exist. Again, the corner data structure might already exist in synchronized_corner_map, in step 1618, the system walks leftward and rightward along the current horizontal scan line from the current vertical edge, populating the available corner information as it is learned. In particular, reaming to the corner data structure definition above and the illustration in FIGS. 11A and 11B, the edges s_ray_x, tar_x and d_ray_x, as well as any others required by the design rules, are populated.

In addition, preferably but not essentially, the system also in step 1618 performs similar edge-based rule checks for the exiting edges as performed and described above with respect to step 1318.

After the available corner structure information items have been populated, then the system returns to step 1610 to consider the next exiting edge in the current horizontal scan line.

Figure 27:
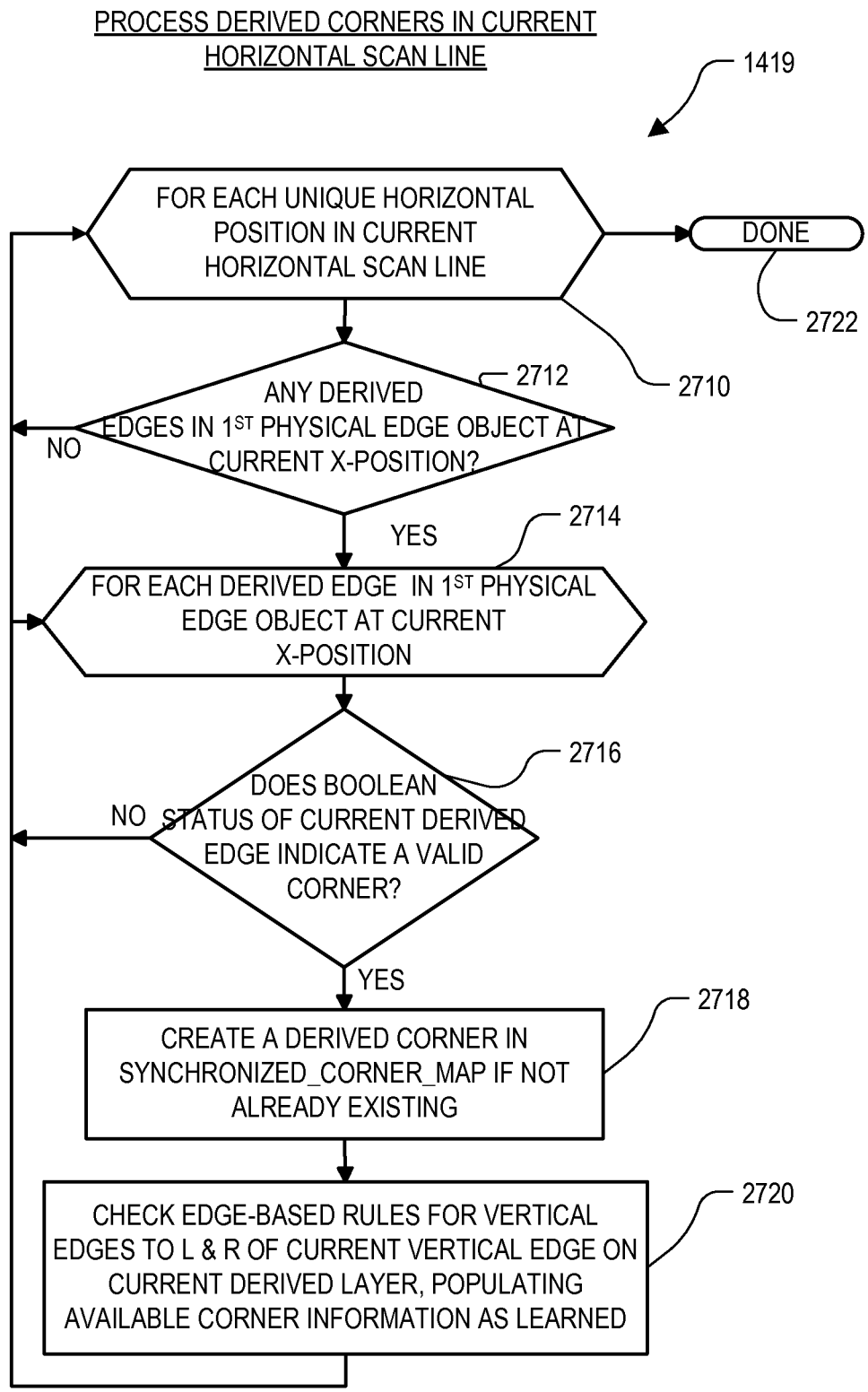

Returning to FIG. 14, after both the entering and exiting physical edges having an endpoint on the current horizontal scan line are processed, the system processes all the derived corners in the current horizontal scan line (step 1419), FIG. 27 is a flow chart detail of step 1419. Because derived edge status vectors are by convention kept on the first physical edge of each unique position in the current scan line in the present embodiment, it is not useful to loop separately through edges in Enter_tree separately from edges in Exit_tree. Instead, one loop is performed horizontally along the current horizontal scan line, from left to right, stopping at each unique horizontal position at which there is an edge object. Thus referring to FIG. 27, in step 2710, the current horizontal scan line is walked from left to right, stopping at each unique horizontal position at which an edge object exists. In step 2712, it is determined whether the first physical edge object at the current horizontal position contains any derived edge status vectors. Only the first physical edge object need be checked at each horizontal position, because by convention in the present embodiment, that is where the derived edge status map for all vertical derived edges at the current x/y position are kept. If it is determined that there are no derived edges in the first physical edge object at the current horizontal position, then the system returns to step 2710 to consider the next unique horizontal position in the current horizontal scan line.

If there are derived edges, then in step 2714 the system begins another loop through all the derived edges in the derived edge status map in the first physical edge object at the current horizontal position. In step 2716, it is determined whether the Boolean status of the current derived edge indicates a valid corner. As previously explained, so long as the Boolean status is neither all zeros nor all ones, the corner is valid. If the current derived edge is not a corner, then the edge is skipped.

If the current derived edge is a valid corner, then in step 2718, a corner data structure for the current derived edge is instantiated in synchronized_corner_map if it does not already exist. In step 2720, the system walks left and right along the current horizontal scan line from the current derived edge, populating the available derived corner information as it is learned. Also in step 2720, like in step 1218 for physical layer edges, the system performs certain simple edge-based rule checks such as minimum spacing and minimum dimension on the current derived layer, and minimum extension and minimum overlap relative to other layers (physical or derived). All the same design rule checks are performed on the derived layers as set forth above with respect to step 1218. Additionally, like in step 1218, if during the walks to the left and right along the current horizontal scan line on the current derived layer, the distance walked exceeds the worst case limit from the relationship master, there is no design rule violation encountered and it is not necessary to populate further items in the corner data structure that would be encountered in the current walking direction.

After the available derived corner structure information items have been populated, then the system returns to step 2714 to consider the next derived edge in the current physical edge object. If there are no more derived edges in the current physical edge object, then the system returns to step 2710 to move to the next unique horizontal position in the current horizontal scan line. If there are no more horizontal positions represented in the current horizontal scan line, then step 1419 concludes (step 2722).

Returning to FIG. 14, after both the physical and derived layer edges at the current horizontal scan line are processed, it is not necessary to populate or update information about islands. This was done during the horizontal scan (step 1020 in FIG. 10), and no additional information will be determined during the vertical scan. For example, the area of an island, determined as a vertical scan line scans across the island horizontally, will not be any different than the area determined as a horizontal scan line scans across the island vertically.

In step 1422, as a time saving technique, the quadrant depth vectors for each of the entering vertical edges in the current horizontal scan line are copied from the upper quadrants to the corresponding lower quadrants. In this manner the lower quadrant depth values can be incremented or decremented as the horizontal scan line moves upward, and will contain accurate values when the scan line reaches the upper endpoint of the edge. It is not necessary to update status vectors for derived edges in the same manner. In step 1424, all the exiting edges are removed from the current horizontal scan line. The routine then returns to step 1410 for the next vertical scan position.

Returning to FIG. 3, after step 320, all the topographical relationships needed to perform the checks in the design rule set have been collected into a layout topology database. This includes all the needed relationships on both physical and derived layers. As mentioned, the term 'database' as used herein does not imply any unity or regularity of structure, and in the present embodiment the layout topology database includes synchronized_corner_map, island_map and via_map, and other collections of data as well. In step 322, the values in the layout topology database are compared to those in the relationship master, in order to check all the design rules. In one embodiment, all design rule violations are reported, whereas in another embodiment, only those violations involving editing shapes are reported.

Figure 17:
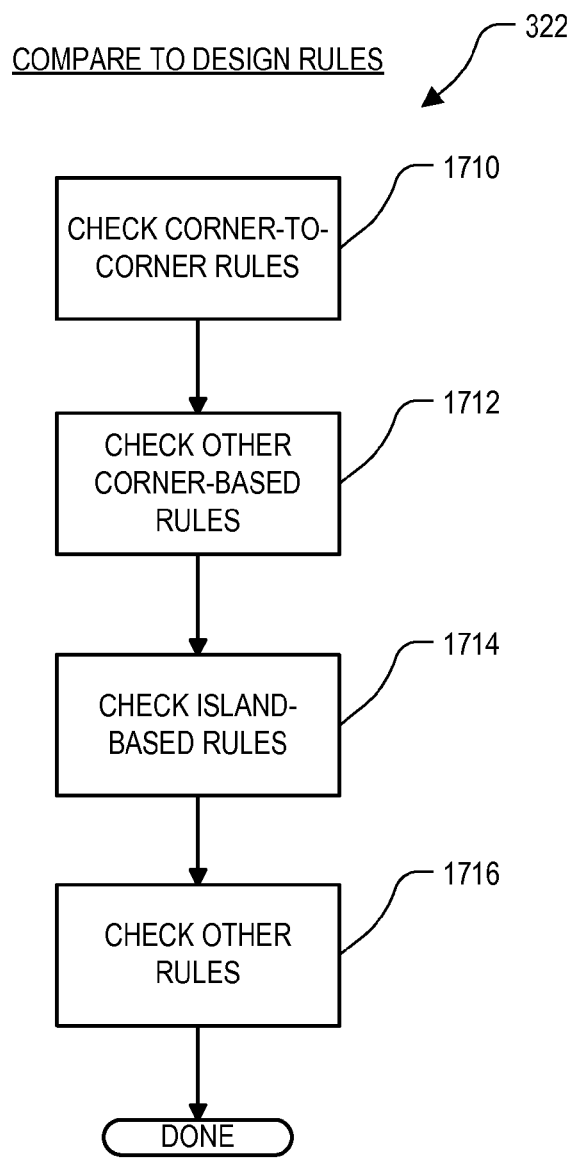

FIG. 17 is a flow chart detail of step 322. These are illustrative examples of design rules that are checked in the present embodiment only after the scans across the layout region have been completed. The grouping of these checks as shown in FIG. 17 is only for convenience of the present description; it may or may not correspond to any grouping in any particular embodiment. For purposes of the present description, the design rules that are checked in FIG. 17 are grouped as follows. Corner-to-corner rules are checked in step 1710, and other corner-based rules are checked in step 1712. Island-based rules are checked in step 1714, and other rules (such as via-based rules) are checked in step 1716. Details are provided herein regarding some of the corner-to-corner rules, some other corner-based rules, and some island-based rules. All of the design rule checks described below with respect to steps 1710-1716 are checked for both physical and derived layer features if they are identified in the design rule set. Design rules that reference derived layers are checked in the steps of FIG. 17, as well as those that reference only physical layers.

Figure 18:
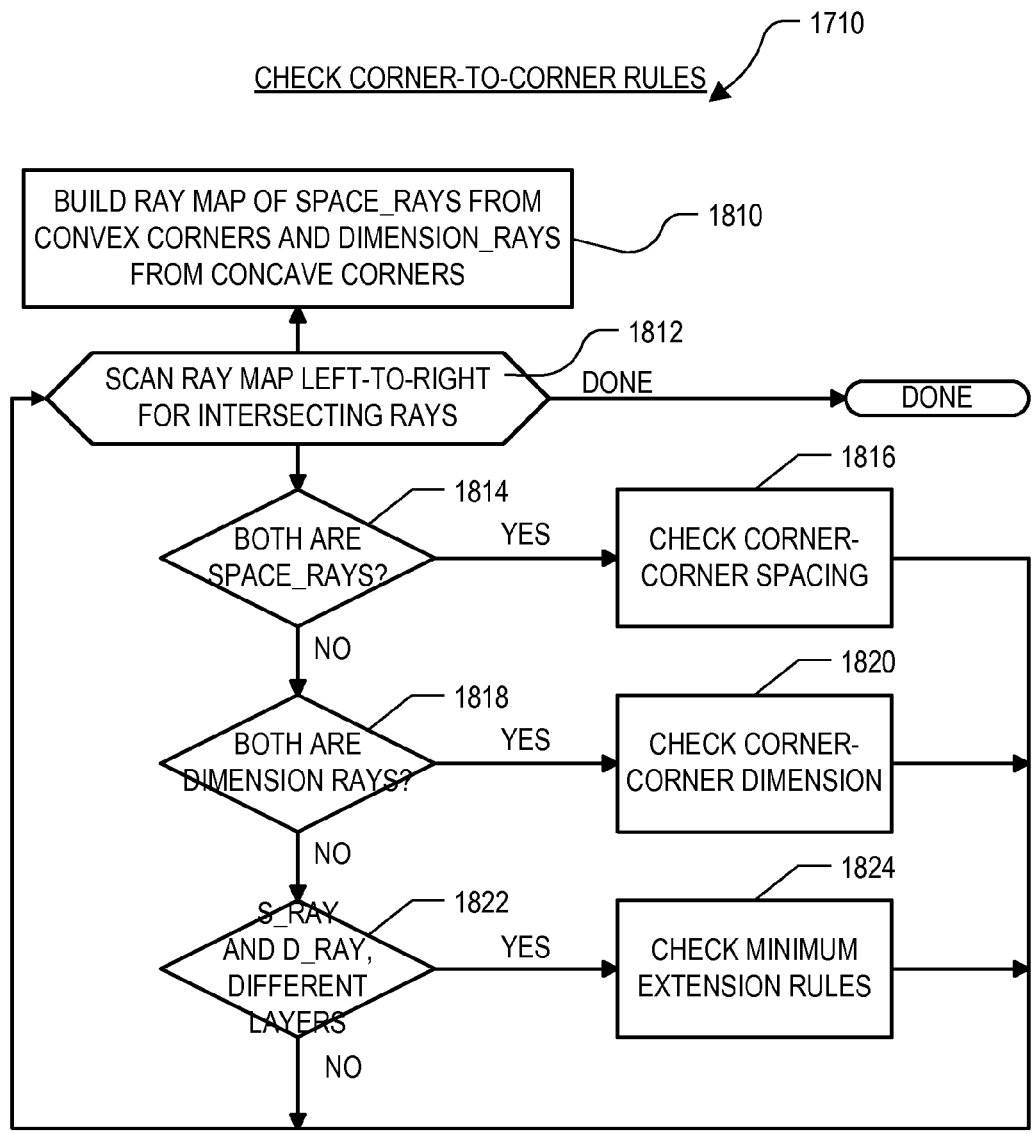

FIG. 18 is a flow chart detail of step 1710, for checking the corner-to-corner rules. In step 1810, the system builds a map of space and dimension rays from the ray information previously populated into the synchronized corner map. Rays from all layers are included, from both physical and derived layers, but only those space_rays that extend from convex corners, and only those dimension_rays that extend from concave corners, are included in this ray map. In addition, instead of the rays representing the shape edges encountered when walking away from the corner, the rays in the ray map formed in step 1810 represent true rays from the corner to the encountered edge.

In step 1812, the ray map is scanned left-to-right to identify intersections of the rays. A conventional scan line algorithm can be used for this purpose.

In step 1814, it is determined whether the current ray intersection is an intersection of two space_rays. The two corners from which these space_rays extend both have to be convex, so the situation is as illustrated in FIG. 19A, where s_rays 1910 and 1912 intersect. this case the corner-to-corner Euclidean spacing 1914 is calculated. If the two shapes are located on the same layer, the spacing 1914 is compared to the minimum corner-to-corner spacing value in relationship_master. If they are on different layers, it is compared to the minimum corner-to-corner clearance in relationship_master (step 1816).

If the intersecting rays are not both space_rays, then in step 1818 it is determined whether they are both dimension_rays in the same layer. The two corners from which these dimension_rays extend both have to be concave, so the situation is as illustrated in FIG. 19B, where d_rays 1916 and 1918 intersect. In this case the corner-to-corner Euclidean dimension 1920 is again calculated and compared to the minimum dimension rule value in relationship_master (step 1820).

If the intersecting rays are not both dimension_rays, then in step 1822 it is determined whether one is a space_ray on one layer, and the other is a dimension_ray on a different layer. Since the corner from which the space_ray extends is convex, and the corner from which the dimension_ray extends in concave, the situation is as illustrated in FIG. 19C. In this figure, s_ray 1922 from a corner of shape 1921 intersects d_ray 1924 from a corner of shape 1923, and the two shapes are on different layers. In this case the distance that the shape on one layer extends past the edge of the shape the other layer is calculated in both dimensions, and compared to the min-Extension or minDualExtension value in relationship_master (step 1824).

Various other corner-based design rule checks can be performed within this loop as well, not shown in FIG. 18. The routine then loops back to step 1812 to continue scanning for more intersecting rays.

Figure 20:
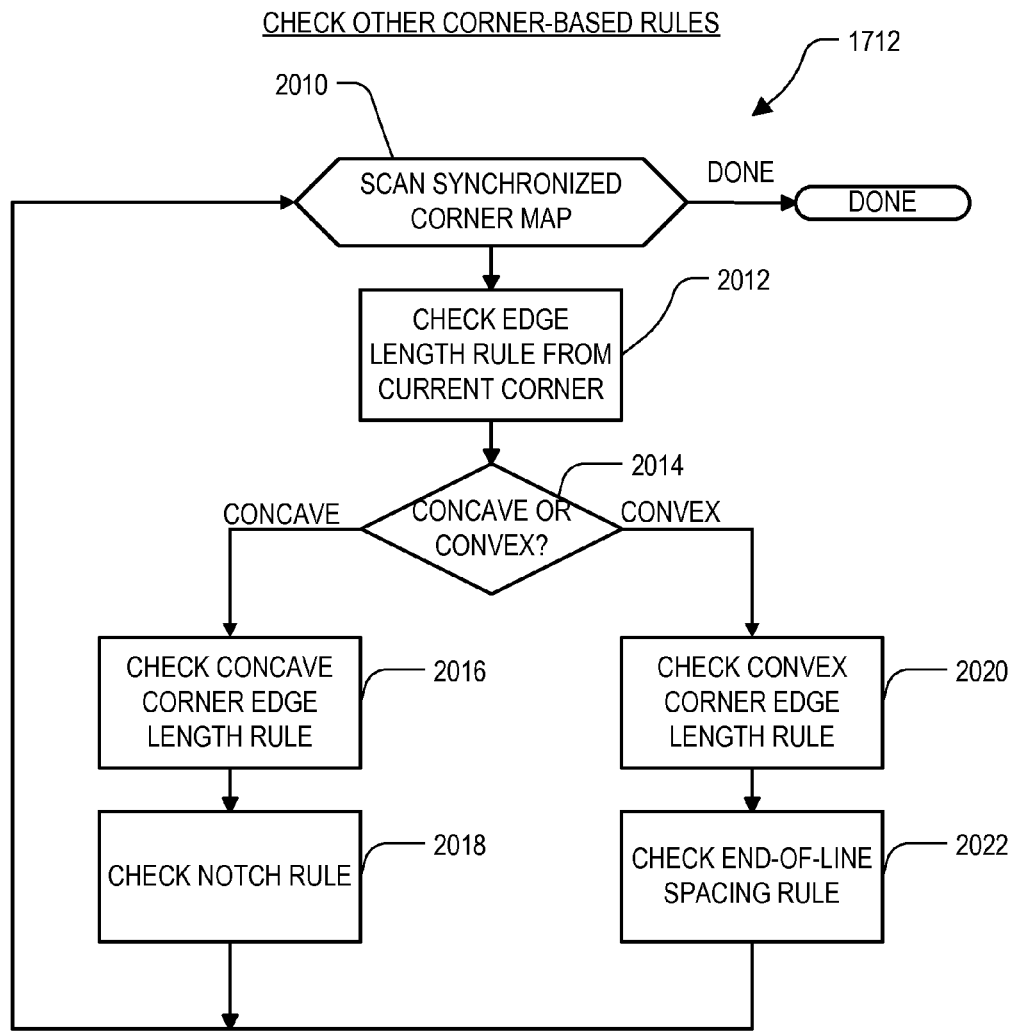

FIG. 20 is a flow chart detail of step 1712, for checking certain other corner-based rules. These rules are checked inside a loop 2010 which traverses the synchronized_corner_map. In step 2012, the edge length rule is checked from the current corner. For the horizontal edge meeting at this corner, this involves subtracting the x-position of the corner (ori_x) from the x-position of the nearest vertical edge, walking horizontally along the shape contour (tar_x) and comparing the absolute value of the difference to the minimum edge length value in the relationship_master. For the vertical edge meeting at this corner, this involves subtracting the y-position of the corner (ori_y) from the y-position of the nearest horizontal edge, walking vertically along the shape contour (tar_y) and comparing the absolute value of the difference to the minimum edge length value in the relationship_master.

In step 2014, it is determined whether the current corner is concave or convex. If it is concave, then in step 2016 the concave corner edge length rule is checked. This rule requires that at least one of the two adjacent edges forming a concave corner have at least a minimum length. This test can be performed using the same values from the corner data structure as used in step 2012 (ori_x, tar_x, ori_y and tar_y). The lengths determined for the two edges are compared to the minimum concave corner edge length value in the relationship_master.

In step 2018, the notch rule is checked. This rule requires that a 'notch' in an island have at least a specified minimum width. Framed in terms of corners, the rule requires that two adjacent concave corners be at least a specified distance apart. This rule need be checked for a. horizontally-adjacent corner only of the horizontally-adjacent corner is concave, and need be checked for a vertically-adjacent corner only of the vertically-adjacent corner is concave. For example, in the illustration of FIG. 11B, only the horizontally-adjacent corner need be checked for violation of the notch rule. The notch rule can be tested by subtracting the x-position of the current corner (ori_x) from the x-position of the nearest vertical facing edge, walking horizontally from corner, away from the shape, which is already available in the current corner data structure as space_ray_x. The absolute value of the difference is then compared to the minimum notch width value in the relationship_master. For a notch formed with a vertically-adjacent concave corner, the y-position of the current corner (ori_y) is subtracted from the y-position of the nearest horizontal facing edge, walking vertically from the current corner, away from the shape, which is already available in the current corner data structure as space_ray_y. The absolute value of the difference is then compared to the minimum notch width value in the relationship_master.

If in step 2014, it is determined that the current corner is convex, then in step 2020 the convex corner edge length rule is checked. This rule requires that at least one of the two adjacent edges forming a convex corner have at least a minimum length. This test can be performed using the same values from the corner data structure as used in step 2012 (ori_x, ori_y and tar_y). The lengths determined for the two edges are compared to the minimum convex corner edge length value in the relationship_master.

In step 2022, an end-of-line spacing rule is checked. In its simplest form, this rule requires that at the end of a line, a specified minimum spacing is required to the neighboring geometry. Referring to FIG. 19D, where the line in question is line 1926, the rule requires that for an end-of-line width eolWidth less than one specified value, the end-of-line spacing eolSpace must be at least another specified value. If the current corner is convex corner 1828, then the width of the line 1926 in the horizontal dimension is easily determined by subtracting the x-position of the current corner (ori_x) from the x-position of the last vertical edge walking horizontally into shape, before exiting shape, which is already available in the current corner data structure as d_ray_x. The spacing to the next neighboring geometry is available in the current corner data structure as s_ray_y. Thus the absolute value of the subtraction is compared to the value for eolWidth in the relationship_master, and if small enough to invoke the rule, s_ray_y is then compared to the value for eolSpace in the relationship_master. For a horizontally-oriented line, the width of the line in the vertical dimension is determined by subtracting the y-position of the current corner (ori_y) from the y-position of the last horizontal edge walking vertically into shape, before exiting shape, which is already available in the current corner data structure as d_ray_y. The spacing to the next neighboring geometry is available in the current corner data structure as s_ray_x. Thus the absolute value of the subtraction is compared to the value for eolWidth in the relationship_master, and if small enough to invoke the rule, s_ray_x is then compared to the value for eolSpace in the relationship_master.

After all the desired rules are checked for the current corner, the routine returns to step 2010 to consider the next corner in synchronized_corner_map.

Returning to FIG. 17, after the corner-based rules have been checked in steps 1711 and 1712, island-based rules are then checked in step 1714. Example island-based design rules that can be checked here include the minimum island area rule, the minimum hole area rule, minimum common run dependent separation against other islands in the same layer, and minimum common run dependent separation against islands in other layers. In an embodiment, these are all checked within a single traversal of island_map, where the values for all required topological relationships in the layout region have already been populated. For example, the area. of each island in istand_map has already been populated during the horizontal scan. The step of checking the minimum island area rule, therefore, is accomplished simply by comparing the stored island area for the current island with the minimum area value in the relationship master. Note that in an embodiment, during the horizontal scan, accumulation of island area is aborted once the accumulated area exceeds the worst case minimum required in the relationship master. The stored area values will still be determined in this step 1714 to satisfy the minimum island area rule.

Other rules, such as via-based rules, are checked in step 1716.

Returning to FIG. 3, step 324 involves reporting any design rule violations to the user or to another entity. If reported to the user, the report can take place promptly (e.g. for real time feedback) or later (e.g. if performed as a batch job). Where the violations are reported to the user promptly, this enables the user to modify the layout to correct for the design rule violations. Whereas any form of reporting can be used, preferably the design rule violations are reported by way of visual indications on the user's monitor, as markers on the layout region itself. in an embodiment, near violations are also indicated. Marker information can be anything that can be used to render a visual indicator of the violation, but preferably it identifies a rectangle for designating the location of the violation within the layout region. In an embodiment, the rectangle is shown in a size which indicates the magnitude of the primary value of the rule being violated. This information can be very useful as it indicates graphically how much is needed to correct the violation. For near-violations, it can be a ruler indicating the current spacing. For example, if the violation is a minimum spacing violation, a rectangle might encompass the (too-small) spacing area, or a ruler disposed across the space might indicate actual spacing if it is larger than the minimum.

AU of the design rule checks output marker information for any violation. The marker information is collected in a map structure. In step 324, the marker information is converted to visible form on the user's monitor or provided to another entity. In addition, as shown in FIG. 3, once the markers have been output, the system returns to step 312 to await the next editing command. This may be as simple as another slight movement of the current editing shapes being dragged across the layout region. This event will result in another traversal through steps 314-324 of FIG. 3, thus causing a change in the visual indicator as seen by the user. Because of the efficiency of the design rule checking techniques described herein, in the embodiment herein the new markings will appear nearly immediately with each drag of the editing shapes.

Figure 21A:
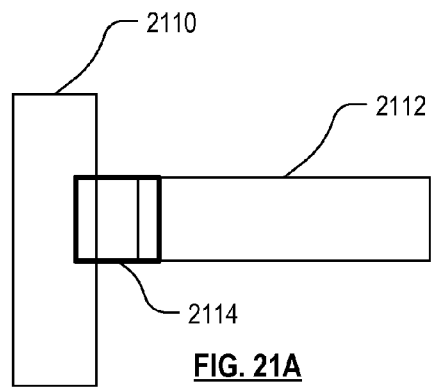
FIGS. 21A-21E illustrate example visual indications of design rule violations and near-violations.
Figure 21B:
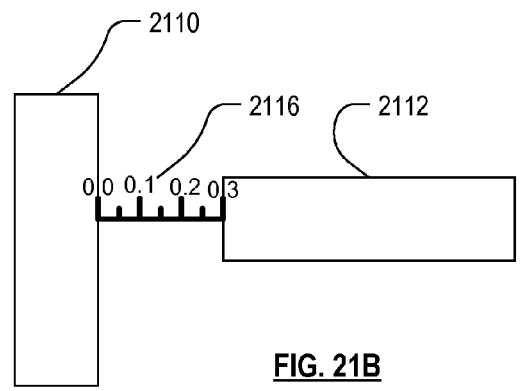

FIG. 21A is an example visual indication of a violation of a minimum spacing rule. In this drawing, editing rectangle 2112 has been moved too close to static rectangle 2110, and a box 2114 appears indicating how much end-of-line spacing is required by the rule. If the minimum spacing value that is being violated is an absolute value, then the box 2114 might appear in one color, whereas if it is a preferred value that is being violated, then the box 2114 might appear in another color. A third color can be used to indicate a most preferred value, and so on. As the user pulls the editing shape 2112 apart from static shape 2110, the box 2114 disappears and a ruler appears, such as ruler 2116 in FIG. 21B. Ruler 2116 indicates the actual distance between the end of editing shape 2112 and the nearest edge of static shape 2110, and thereby indicates how much closer shape 2112 can be brought to shape 2110 before the minimum spacing rule will be violated.

Figure 21C:
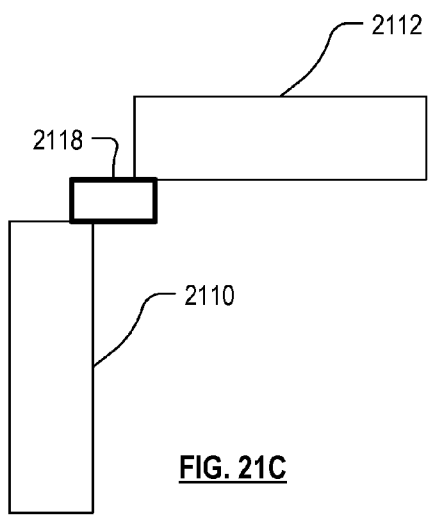
Figure 21D:
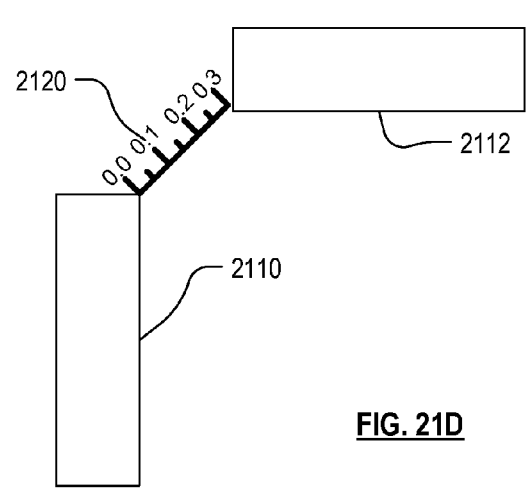

FIG. 21C is an example visual indication of a violation of a corner-to-corner spacing rule. In this drawing, editing rectangle 2112 has been moved too close to a corner of static rectangle 2110, and a box 2118 appears indicating the violation. Again, the box 2118 can appear in either of two colors to indicate violation of an absolute or (prk.fened value for this design rule. As the user pulls the editing shape 2112 apart from static shape 2110, the box 2114 disappears and a ruler appears, such as corner-to-corner ruler 2120 in FIG. 21D, Ruler 2120 indicates the actual corner-to-corner distance between the end of editing shape 2112 and the nearest edge of static shape 2110.

Figure 21E:
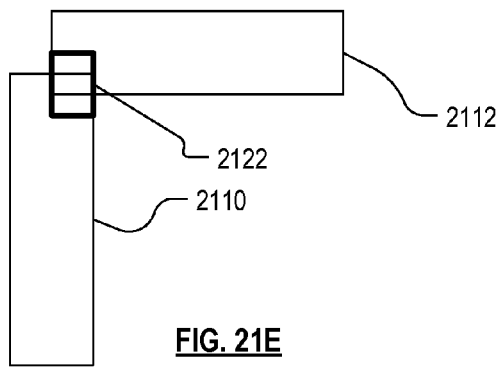

FIG. 21E is an example visual indication of a violation of a corner-to-corner minimum dimension rule. In this drawing, a corner of editing rectangle 2112 overlaps a corner of a same layer static rectangle 2110, but the overlap is too small to satisfy the minimum dimension rule. A box 2122 appears indicating the violation.

Similar visual indicators to indicate violations of other design rules wilt be apparent to the reader. In addition, note that all of the design rule checks indicated in FIGS. 21A-21E can reference derived layers or physical layers or both. It can be seen that the markings provide nearly immediate feedback to the user as the layout is edited, thereby greatly facilitating the manual layout effort. It should be noted that the absence of any visual indication to the user also constitutes a notification to the user that no design rule violation has been detected.

In the embodiments described herein, all the corner data structures are completely populated before the corner-based rules are checked. This is the most advantageous arrangement, but some benefits of the invention can be obtained even if only some (i.e. more than one; preferably more than two) of the corner data structures are completely populated before the corner-based rules are checked. Similarly, all island data structures are completely populated before the island-based rules are checked. Again, while this is the most. advantageous arrangement, some benefits of the invention can be obtained even if only some (i.e. more than one; preferably more than two) of the island data structures are completely populated before the island-based rules are checked.

Hardware

Figure 22:
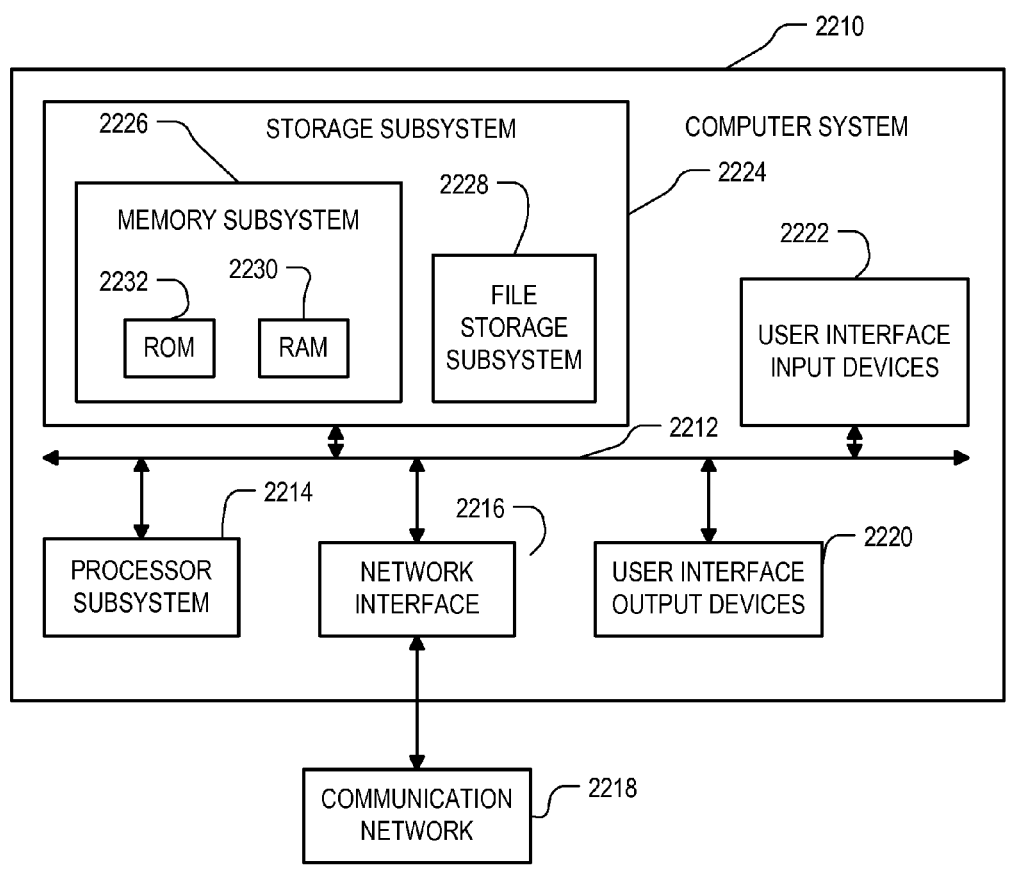
FIG. 22 is a simplified block diagram of a computer system that can be used to implement software incorporating aspects of the present invention.

FIG. 22 is a simplified block diagram of a computer system 2210 that can be used to implement software incorporating aspects of the present invention. Computer system 2210 includes a processor subsystem 2214 which communicates with a number of peripheral devices via bus subsystem 2212. These peripheral devices may include a storage subsystem 2224, comprising a memory subsystem 2226 and a file storage subsystem 2228, user interface input devices 2222, user interface output devices 2220, and a network interface subsystem 2216. The input and output devices allow user interaction with computer system 2210. Network interface subsystem 2216 provides an interface to outside networks, including an interface to communication network 2218, and is coupled via communication network 2218 to corresponding interface devices in other computer systems. Communication network 2218 may comprise many interconnected computer systems and communication links. These communication links may be wireline links, optical links, wireless links, or any other mechanisms for communication of information. White in one embodiment, communication network 2218 is the Internet, in other embodiments, communication network 2218 may be any suitable computer network.

The physical hardware component of network interfaces are sometimes referred to as network interface cards (NICs), although they need not be in the form of cards: for instance they could be in the form of integrated circuits (ICs) and connectors fitted directly onto a motherboard, or in the form of macrocells fabricated on a single integrated circuit chip with other components of the computer system.

User interface input devices 2222 may include a keyboard, pointing devices such as a mouse, trackball, touchpad, or graphics tablet, a scanner, a touch screen incorporated into the display, audio input devices such as voice recognition systems, microphones, and other types of input devices. In general, use of the term "input device" is intended to include all possible types of devices and ways to input information into computer system 2210 or onto computer network 2218.

User interface output devices 2220 may include a display subsystem, a printer, a fax machine, or non-visual displays such as audio output devices. The display subsystem may include a cathode ray tube (CRT), a flat-panel device such as a liquid crystal display (LCD), a projection device, or some other mechanism for creating a visible image. The display subsystem produces the images illustrated in FIGS. 21A-21E, for example. The display subsystem may also provide non-visual display such as via audio output devices. in general, use of the term "output device" is intended to include all possible types of devices and ways to output information from computer system 2210 to the user or to another machine or computer system.

Storage subsystem 2224 stores the basic programming and data constructs that provide the functionality of certain embodiments of the present invention. For example, the various modules implementing the functionality of certain embodiments of the invention may be stored in storage subsystem 2224. These software modules are generally executed by processor subsystem 2214.

Memory subsystem 2226 typically includes a number of memories including a main random access memory (RAM) 2230 for storage of instructions and data during program execution and a read only memory (ROM) 2232 in which fixed instructions are stored, Fite storage subsystem 2228 provides persistent storage for program and data files, and may include a hard disk drive, a floppy disk drive along with associated removable media, a CD-ROM drive, an optical drive, or removable media cartridges. The databases and modules implementing the functionality of certain embodiments of the invention may be stored by file storage subsystem 2228. The host memory 2226 contains, among other things, computer instructions which, when executed by the processor subsystem 2214, cause the computer system to operate or perform functions as described herein. As used herein, processes and software that are said to run in or on "the host" or "the computer system", execute on the processor subsystem 2214 in response to computer instructions and data in the host memory subsystem 2226 including any other local or remote storage for such instructions and data.

Bus subsystem 2212 provides a mechanism for letting the various components and subsystems of computer system 2210 communicate with each other as intended. Although bus subsystem 2212 is shown schematically as a single bus, alternative embodiments of the bus subsystem may use multiple busses.

Computer system 2210 itself can be of varying types including a personal computer, a portable computer, a workstation, a computer terminal, a network computer, a television, a mainframe, or any other data processing system or user device. Due to the ever-changing nature of computers and networks, the description of computer system 2210 depicted in FIG. 22 is intended only as a specific example for purposes of illustrating certain embodiments of the present invention. In another embodiment, the invention can be implemented using multiple computer systems, such as in a server farm.

Many other configurations of computer system 2210 are possible having more or less components than the computer system depicted in FIG. 22.

In an embodiment, the steps set forth in the flow charts and descriptions herein are performed by a computer system having a processor such as processor subsystem 2214 and a memory such as storage subsystem 2224, under the control of software which includes instructions which are executable by the processor subsystem 2214 to perform the steps shown. The software also includes data on which the processor operates. The software is stored on a computer readable medium, which as mentioned above and as used herein, is one on which information can be stored and read by a computer system. Examples include a floppy disk, a hard disk drive, a RAM, a CD, a DVD, flash memory, a USB drive, and so on. The computer readable medium may store information in coded formats that are decoded for actual use in a particular data processing system. A single computer readable medium, as the term is used herein, may also include more than one physical item, such as a plurality of CD-ROMs or a plurality of segments of RAM, or a combination of several different kinds of media. When the computer readable medium storing the software is combined with the computer system of FIG. 22, the combination is a machine which performs the steps set forth herein. Means for performing each step consists of the computer system (or only those parts of it that are needed for the step) in combination with software modules for performing the step. The computer readable medium storing the software is also capable of being distributed separately from the computer system, and forms its own article of manufacture.

Additionally, the geometry file or files storing the layout, the relationship master dataset, and the layout topology database are themselves stored on computer readable media. Such media. can be distributable separately from the computer system, and form their own respective articles of manufacture. When combined with a computer system programmed with software for reading, revising, and writing the geometry files, and for design rule checking, they form yet another machine which performs the steps set forth herein.

As used herein, the "identification" of an item of information does not necessarily require the direct specification of that item of information. information can be "identified" in a field by simply referring to the actual information through one or more layers of indirection, or by identifying one or more items of different information which are together sufficient to determine the actual item of information. In addition, the term "indicate" is used herein to mean the same as "identify", As used herein, a given signal, event or value is "responsive" to a predecessor signal, event or value if the predecessor signal, event or value influenced the given signal, event or value. If there is an intervening processing element, step or time period, the given signal, event or value can still be "responsive" to the predecessor signal, event or value. If the intervening processing element or step combines more than one signal, event or value, the signal output of the processing element or step is considered "responsive" to each of the signal, event or value inputs. If the given signal, event or value is the same as the predecessor signal, event or value, this is merely a degenerate case in which the given signal, event or value is still considered to be "responsive" to the predecessor signal, event or value. "Dependency" of a given signal, event or value upon another signal, event or value is defined similarly.

The foregoing description of preferred embodiments of the present invention has been provided for the purposes of illustration and description. It is not intended to be exhaustive or to limit the invention to the precise forms disclosed. Obviously, many modifications and variations will be apparent to practitioners skilled in this art. In particular, and without limitation, any and all variations described, suggested or incorporated by reference in the Background section of this patent application are specifically incorporated by reference into the description herein of embodiments of the invention. The embodiments described herein were chosen and described in order to best explain the principles of the invention and its practical application, thereby enabling others skilled in the art to understand the invention for various embodiments and with various modifications as are suited to the particular use contemplated. It is intended that the scope of the invention be defined by the following claims and their equivalents.

We claim:

1. A method for checking a set of layout design rules on a region of an integrated circuit layout, the layout including a plurality of physical shapes each specific to a layer of the layout and each having layout corners at respective locations in the layout, for use by a computer system having access to a design rule data set indicating a particular derivation operator for deriving derived shape information for a particular derived layer in dependence upon at least two of the layout layers, the design rule data set further indicating constraint values of design rules in the data set including a particular design rule referencing the particular derived layer, the method comprising the steps of:

the computer system deriving shape information for the particular derived layer in dependence upon the particular derivation operator, the derived shape information indicating at least one derived corner location in the particular derived layer;

the computer system traversing a plurality of shape corners in the region including corners in at least two locations and including the derived corner;

for each corner in at least a subset of at least two of the corners traversed, the computer system populating a layout topology database with values in dependence upon the respective corner location, the subset including corners in at least two locations and including the derived corner;

after the layout topology database has been populated with values in dependence upon the corner locations of all corners in the subset, the computer system comparing values in the layout topology database to values in the particular design rule to detect any violations; and where a design rule violation is detected, reporting it to a user.

2. The method according to claim 1, wherein the particular design rule includes a constraint parameter and an absolute limiting value for the parameter, the value being indicated in the design rule data set.

3. The method according to claim 2, wherein the particular design rule further includes a preferred limiting value for the parameter, the preferred limiting value also being indicated in the design rule data set.

4. The method according to claim 1, wherein each of the shapes in the plurality of physical shapes is specific to a layer, the single layer geometric union of the shapes in the plurality of shapes forming a plurality of islands, the islands having island corners which are also shape corners, and wherein the subset of corners excludes all shape corners which are not also island corners.

5. The method according to claim 1, wherein the step of for each corner in at least a subset of at least two of the corners traversed, the computer system populating a layout topology database with values in dependence upon the respective corner location, comprises the computer system writing values into a data structure associated with the derived corner.

6. The method according to claim 5, wherein the values for the derived corner include an indication of two edges which meet at the derived corner location.

7. The method according to claim 5, wherein the values for the derived corner include an indication of the nearest derived edge oriented in a first dimension, walking perpendicularly to the first dimension in the particular derived layer along a derived shape contour from the derived corner.

8. The method according to claim 5, wherein the values for the derived corner include an indication of the nearest facing derived edge that is oriented in a first dimension, walking perpendicularly to the first dimension in the particular derived layer along a derived shape contour from the derived corner.

9. The method according to claim 5, wherein the derived corner is a corner of a derived shape,
and wherein the values for the derived corner include an indication of the last edge that is oriented in a first dimension, walking perpendicularly to the first dimension in the particular derived layer and into the derived shape from the derived corner, before exiting the derived shape.

10. The method according to claim 1, wherein the shape information derived in the step of the computer system deriving shape information describes a derived island on the particular derived layer, the derived corner being a corner of the derived island, the derived island having a derived island data structure associated therewith,
and wherein the step of for each corner in at least a subset of the corners traversed, the computer system populating a layout topology database with values in dependence upon the respective corner location, comprises, for the derived corner, the computer system writing or updating a value in the derived island data structure in dependence upon the derived corner location.

11. The method according to claim 10, wherein the step of the computer system writing or updating a value in the derived island data structure comprises the step of the computer system accumulating an area value for the derived island.

12. The method according to claim 11, wherein the step of for each corner in at least a subset of the corners traversed, the computer system populating a layout topology database with values in dependence upon the respective corner location, further comprises traversing a plurality of island corners on the particular derived layer monotonically in at least one dimension.

13. The method according to claim 1, wherein the step of the computer system comparing values in the layout topology database to values in the particular design rule comprises the steps of the computer system:
traversing at least a portion of the values in the layout topology database;
calculating layout values in dependence upon the values in the layout topology database; and
comparing the calculated layout values to one or more values in the design rule data set.

14. The method according to claim 1, wherein the step of reporting a design rule violation to a user comprises the step of indicating the design rule violation to the user visually.

15. The method according to claim 1, wherein the step of the computer system traversing is performed in response to a user selecting a set of at least one of the shapes in the plurality of physical shapes, depressing a mouse button and dragging the selected shapes to a modified position in the layout,
and wherein the step of reporting a design rule violation to a user is completed before the user releases the mouse button.

16. The method according to claim 1, wherein the step of for each corner in at least a subset of at least two of the corners traversed, the computer system populating a layout topology database with values in dependence upon the respective corner location, comprises traversing the corners in the subset monotonically in at least a first dimension.

17. The method according to claim 16, wherein all of the shapes in the plurality of physical shapes have edges oriented in the first dimension as well as edges oriented in a second dimension perpendicular to the first dimension,
and wherein the step of for each corner in at least a subset of at least two of the corners traversed, the computer system populating a layout topology database with values in dependence upon the respective corner location, further comprises traversing the corners in the subset monotonically in the second dimension.

18. The method according to claim 1, wherein the shapes in the plurality of physical shapes include physical edges in a plurality of different orientations, each of the edges having endpoints at respective locations in the layout, wherein the steps of the computer system traversing shape corners and the computer system populating the layout topology database collectively comprise the steps of:
the computer system scanning the layout region in a first dimension which is perpendicular to a first one of the edge orientations, so as to encounter first physical endpoints of the physical edges having the first orientation, at least some of the first physical endpoints coinciding with respective first derived endpoints of derived edges on the particular derived layer;
in response to encountering each of the first endpoints which coincide with a first derived endpoint, the computer system populating the layout topology database with values in dependence upon the respective first endpoint location, including values in dependence upon derived edges in the particular derived layer;
the computer system scanning the layout region in a second dimension which is perpendicular to a second one of the edge orientations, so as to encounter second physical endpoints of the physical edges having the second orientation, at least some of the second physical endpoints coinciding with respective second derived endpoints of derived edges on the particular derived layer; and
in response to encountering each of the second endpoints which coincide with a second derived endpoint, the computer system populating the layout topology database with values in dependence upon the respective second endpoint location, including values in dependence upon derived edges in the particular derived layer.

19. The method according to claim 1, further comprising the step of checking an additional layout design rule which references the particular derived layer.

20. The method according to claim 1, wherein a design rule violation is detected in the step of the computer system comparing values.

21. A method for checking a set of layout design rules on a region of an integrated circuit layout, the layout including a plurality of physical shapes each including physical edges in a plurality of different orientations, the physical shapes being disposed on physical layers of the layout, each of the edges having physical endpoints at respective locations in the layout, endpoints of edges in a first one of the orientations being first physical endpoints and endpoints of edges in a second one of the orientations being second physical endpoints, for use by a computer system having access to a design rule data set indicating a particular derivation operator for defining derived shape information for a particular derived layer in dependence upon at least one of the physical layers, the design rule data set further indicating constraint values of design rules in the data set, including a particular design rule referencing the particular derived layer, the method comprising the steps of:

the computer system scanning the layout region in a first dimension which is perpendicular to the first edge orientation, so as to encounter first physical endpoints of the physical edges having the first orientation, at least some of the first physical endpoints coinciding with respective first derived endpoints of derived edges derived for the particular derived layer in dependence upon the particular derivation operator;

in response to encountering each of at least a first subset of at least two of the first physical endpoints which coincide with respective ones of the first derived endpoints, the computer system populating a layout topology database with values in dependence upon the respective first endpoint location, including values in dependence upon derived edges in the particular derived layer;

the computer system scanning the layout region in a second dimension which is perpendicular to the second edge orientation, so as to encounter second physical endpoints of the physical edges having the second orientation, at least some of the second physical endpoints coinciding with respective second derived endpoints of derived edges derived for the particular derived layer in dependence upon the particular derivation operator;

in response to encountering each of at least a second subset of at least two of the second physical endpoints which coincide with respective ones of the second derived endpoints, the computer system populating the layout topology database with values in dependence upon the respective second endpoint location, including values in dependence upon derived edges in the particular derived layer;

after the layout topology database has been populated with values in dependence upon the first endpoint location of all physical endpoints in the first subset of endpoints, and values in dependence upon the second endpoint location of all physical endpoints in the second subset of endpoints, the computer system comparing values in the layout topology database to values in the particular design rule to detect any violations; and where a design rule violation is detected, reporting it to a user.

22. The method according to claim 21, wherein the step of the computer system scanning the layout region in a first dimension comprises the step of the computer system scanning the layout region so as to encounter the first physical endpoints in a monotonically varying position in the first dimension.

23. The method according to claim 22, wherein the step of the computer system scanning the layout region in a second dimension comprises the step of the computer system scanning the layout region so as to encounter the second physical endpoints in a monotonically varying position in the second dimension.

24. The method according to claim 21, wherein each of the first physical endpoints has a position in the first dimension, and wherein the step of the computer system scanning the layout region in a first dimension comprises the step of the computer system jumping only among positions in the first dimension which match positions in the first dimension of first physical endpoints.

25. The method according to claim 24, wherein the single layer geometric union of the shapes in the plurality of physical shapes form a plurality of islands, the islands each having a contour, wherein the first subset of first physical endpoints includes all endpoints of the first physical edges which endpoints coincide with corners of the islands.

26. The method according to claim 24, wherein the second physical endpoints each have a position in the second dimension, and wherein the step of the computer system scanning the layout region in a second dimension comprises the step of the computer system jumping only among positions in the second dimension which match positions in the second dimension of second physical endpoints.

27. The method according to claim 26, wherein the single layer geometric union of the shapes in the plurality of shapes form a plurality of islands, the islands each having a contour, wherein the first subset of first physical endpoints includes all endpoints of the first physical edges which endpoints coincide with corners of the islands and wherein the second subset of second endpoints includes all endpoints of the second physical edges which endpoints coincide with corners of the islands.

28. The method according to claim 21, wherein the single layer geometric union of the shapes in the plurality of physical shapes form a plurality of islands, the islands each having a contour, and wherein the step of the computer system scanning the layout region in a first dimension avoids first physical endpoints which do not lie on an island contour.

29. The method according to claim 21, wherein a design rule violation is detected in the step of the computer system comparing values.

30. A system for checking a set of layout design rules on a region of an integrated circuit layout, the layout including a plurality of physical shapes each specific to a layer of the layout and each having layout corners at respective locations in the layout, comprising:

a computer system having access to a design rule data set indicating a particular derivation operator for deriving derived shape information for a particular derived layer in dependence upon at least two of the layout layers, the design rule data set further indicating constraint values of design rules in the data set including a particular design rule referencing the particular derived layer, the computer system further having access to computer instructions and data which, when applied to the computer system, perform the steps of:

deriving shape information for the particular derived layer in dependence upon the particular derivation operator, the derived shape information indicating at least one derived corner location in the particular derived layer;

traversing a plurality of shape corners in the region including corners in at least two locations and including the derived corner;

for each corner in at least a subset of at least two of the corners traversed, populating a layout topology database with values in dependence upon the respective corner location, the subset including corners in at least two locations and including the derived corner; and after the layout topology database has been populated with values in dependence upon the corner locations of all corners in the subset, comparing values in the layout topology database to values in the particular design rule to detect any violations.

31. The system according to claim 30, wherein the particular design rule includes a constraint parameter and an absolute limiting value for the parameter, the value being indicated in the design rule data set.

32. The system according to claim 31, wherein the particular design rule further includes a preferred limiting value for the parameter, the preferred limiting value also being indicated in the design rule data set.

33. The system according to claim 30, wherein each of the shapes in the plurality of physical shapes is specific to a layer, the single layer geometric union of the shapes in the plurality of shapes forming a plurality of islands, the islands having island corners which are also shape corners, and wherein the subset of corners excludes all shape corners which are not also island corners.

34. The system according to claim 30, wherein the step of for each corner in at least a subset of at least two of the corners traversed, populating a layout topology database with values in dependence upon the respective corner location, comprises writing values into a data structure associated with the derived corner.

35. The system according to claim 34, wherein the values for the derived corner include an indication of two edges which meet at the derived corner location.

36. The system according to claim 34, wherein the values for the derived corner include an indication of the nearest derived edge oriented in a first dimension, walking perpendicularly to the first dimension in the particular derived layer along a derived shape contour from the derived corner.

37. The system according to claim 34, wherein the values for the derived corner include an indication of the nearest facing derived edge that is oriented in a first dimension, walking perpendicularly to the first dimension in the particular derived layer along a derived shape contour from the derived corner.

38. The system according to claim 34, wherein the derived corner is a corner of a derived shape, and wherein the values for the derived corner include an indication of the last edge that is oriented in a first dimension, walking perpendicularly to the first dimension in the particular derived layer and into the derived shape from the derived corner, before exiting the derived shape.

39. The system according to claim 30, wherein the shape information derived in the step of deriving shape information describes a derived island on the particular derived layer, the derived corner being a corner of the derived island, the derived island having a derived island data structure associated therewith, and wherein the step of for each corner in at least a subset of the corners traversed, populating a layout topology database with values in dependence upon the respective corner location, comprises, for the derived corner, writing or updating a value in the derived island data structure in dependence upon the derived corner location.

40. The system according to claim 39, wherein the step of writing or updating a value in the derived island data structure comprises the step of accumulating an area value for the derived island.

41. The system according to claim 40, wherein the step of for each corner in at least a subset of the corners traversed, populating a layout topology database with values in dependence upon the respective corner location, further comprises traversing a plurality of island corners on the particular derived layer monotonically in at least one dimension.

42. The system according to claim 30, wherein the step of comparing values in the layout topology database to values in the particular design rule comprises the steps of:

traversing at least a portion of the values in the layout topology database;

calculating layout values in dependence upon the values in the layout topology database; and comparing the calculated layout values to one or more values in the design rule data set.

43. The system according to claim 30, wherein the step of reporting a design rule violation to a user comprises indicating the design rule violation to the user visually.

44. The system according to claim 30, wherein the step of traversing is performed in response to a user selecting a set of at least one of the shapes in the plurality of physical shapes, depressing a mouse button and dragging the selected shapes to a modified position in the layout, and wherein the step of reporting a design rule violation to a user is completed before the user releases the mouse button.

45. The system according to claim 30, wherein the step of for each corner in at least a subset of at least two of the corners traversed, populating a layout topology database with values in dependence upon the respective corner location, comprises traversing the corners in the subset monotonically in at least a first dimension.

46. The system according to claim 45, wherein all of the shapes in the plurality of physical shapes have edges oriented in the first dimension as well as edges oriented in a second dimension perpendicular to the first dimension, and wherein the step of for each corner in at least a subset of at least two of the corners traversed, populating a layout topology database with values in dependence upon the respective corner location, further comprises traversing the corners in the subset monotonically in the second dimension.

47. The system according to claim 30, wherein the shapes in the plurality of physical shapes include physical edges in a plurality of different orientations, each of the edges having endpoints at respective locations in the layout, wherein the steps of traversing shape corners and populating the layout topology database collectively comprise the steps of:

scanning the layout region in a first dimension which is perpendicular to a first one of the edge orientations, so as to encounter first physical endpoints of the physical edges having the first orientation, at least some of the first physical endpoints coinciding with respective first derived endpoints of derived edges on the particular derived layer;

in response to encountering each of the first endpoints which coincide with a first derived endpoint, populating the layout topology database with values in dependence upon the respective first endpoint location, including values in dependence upon derived edges in the particular derived layer;

scanning the layout region in a second dimension which is perpendicular to a second one of the edge orientations, so as to encounter second physical endpoints of the physical edges having the second orientation, at least some of the second physical endpoints coinciding with respective second derived endpoints of derived edges on the particular derived layer; and in response to encountering each of the second endpoints which coincide with a second derived endpoint, populating the layout topology database with values in dependence upon the respective second endpoint location, including values in dependence upon derived edges in the particular derived layer.

48. The system according to claim 30, wherein the computer instructions and data, when applied to the computer system, further check an additional layout design rule which references the particular derived layer.

49. The system according to claim 30, wherein a design rule violation is detected in the step of comparing values.

50. A system for checking a set of layout design rules on a region of an integrated circuit layout, the layout including a plurality of physical shapes each including physical edges in a plurality of different orientations, the physical shapes being disposed on physical layers of the layout, each of the edges having physical endpoints at respective locations in the layout, endpoints of edges in a first one of the orientations being first physical endpoints and endpoints of edges in a second one of the orientations being second physical endpoints, the system comprising:
a computer system having access to a design rule data set indicating a particular derivation operator for defining derived shape information for a particular derived layer in dependence upon at least one of the physical layers, the design rule data set further indicating constraint values of design rules in the data set, including a particular design rule referencing the particular derived layer,
the computer system further having access to computer instructions and data which, when applied to the computer system, perform the steps of:
scanning the layout region in a first dimension which is perpendicular to the first edge orientation, so as to encounter first physical endpoints of the physical edges having the first orientation, at least some of the first physical endpoints coinciding with respective first derived endpoints of derived edges derived for the particular derived layer in dependence upon the particular derivation operator;
in response to encountering each of at least a first subset of at least two of the first physical endpoints which coincide with respective ones of the first derived endpoints, populating a layout topology database with values in dependence upon the respective first endpoint location, including values in dependence upon derived edges in the particular derived layer;
scanning the layout region in a second dimension which is perpendicular to the second edge orientation, so as to encounter second physical endpoints of the physical edges having the second orientation, at least some of the second physical endpoints coinciding with respective second derived endpoints of derived edges derived for the particular derived layer in dependence upon the particular derivation operator;
in response to encountering each of at least a second subset of at least two of the second physical endpoints which coincide with respective ones of the second derived endpoints, populating the layout topology database with values in dependence upon the respective second endpoint location, including values in dependence upon derived edges in the particular derived layer; and
after the layout topology database has been populated with values in dependence upon the first endpoint location of all physical endpoints in the first subset of endpoints, and values in dependence upon the second endpoint location of all physical endpoints in the second subset of endpoints, comparing values in the layout topology database to values in the particular design rule to detect any violations.

51. The system according to claim 50, wherein the step of scanning the layout region in a first dimension comprises scanning the layout region so as to encounter the first physical endpoints in a monotonically varying position in the first dimension.

52. The system according to claim 51, wherein the step of scanning the layout region in a second dimension comprises scanning the layout region so as to encounter the second physical endpoints in a monotonically varying position in the second dimension.

53. The system according to claim 50, wherein each of the first physical endpoints has a position in the first dimension,
and wherein the step of scanning the layout region in a first dimension comprises jumping only among positions in the first dimension which match positions in the first dimension of first physical endpoints.

54. The system according to claim 53, wherein the single layer geometric union of the shapes in the plurality of physical shapes form a plurality of islands, the islands each having a contour,
wherein the first subset of first physical endpoints includes all endpoints of the first physical edges which endpoints coincide with corners of the islands.

55. The system according to claim 53, wherein the second physical endpoints each have a position in the second dimension,
and wherein the step of scanning the layout region in a second dimension comprises jumping only among positions in the second dimension which match positions in the second dimension of second physical endpoints.

56. The system according to claim 55, wherein the single layer geometric union of the shapes in the plurality of shapes form a plurality of islands, the islands each having a contour,
wherein the first subset of first physical endpoints includes all endpoints of the first physical edges which endpoints coincide with corners of the islands
and wherein the second subset of second endpoints includes all endpoints of the second physical edges which endpoints coincide with corners of the islands.

57. The system according to claim 50, wherein the single layer geometric union of the shapes in the plurality of physical shapes form a plurality of islands, the islands each having a contour,
and wherein the step of scanning the layout region in a first dimension avoids first physical endpoints which do not lie on an island contour.

58. The system according to claim 50, wherein a design rule violation is detected in the step of comparing values.

59. A computer program product for checking a set of layout design rules on a region of an integrated circuit layout, the layout including a plurality of physical shapes each specific to a layer of the layout and each having layout corners at respective locations in the layout, for use by a computer system having access to a design rule data set indicating a particular derivation operator for deriving derived shape information for a particular derived layer in dependence upon at least two of the layout layers,
the design rule data set further indicating constraint values of design rules in the data set including a particular design rule referencing the particular derived layer, the computer program product comprising
a non-transient computer readable medium having stored thereon a plurality of software code portions and data which when executed by the computer system perform the steps of:
deriving shape information for the particular derived layer in dependence upon the particular derivation operator, the derived shape information indicating at least one derived corner location in the particular derived layer;
traversing a plurality of shape corners in the region including corners in at least two locations and including the derived corner;
for each corner in at least a subset of at least two of the corners traversed, populating a layout topology database with values in dependence upon the respective corner location, the subset including corners in at least two locations and including the derived corner;
after the layout topology database has been populated with values in dependence upon the corner locations of all corners in the subset, comparing values in the layout topology database to values in the particular design rule to detect any violations; and
where a design rule violation is detected, reporting it to a user.

60. A computer program product for checking a set of layout design rules on a region of an integrated circuit layout, the layout including a plurality of physical shapes each including physical edges in a plurality of different orientations, the physical shapes being disposed on physical layers of the layout, each of the edges having physical endpoints at respective locations in the layout, endpoints of edges in a first one of the orientations being first physical endpoints and endpoints of edges in a second one of the orientations being second physical endpoints,
for use by a computer system having access to a design rule data set indicating a particular derivation operator for defining derived shape information for a particular derived layer in dependence upon at least one of the physical layers,
the design rule data set further indicating constraint values of design rules in the data set, including a particular design rule referencing the particular derived layer,
the computer program product comprising
a non-transient computer readable medium having stored thereon a plurality of software code portions and data which when executed by the computer system perform the steps of:
scanning the layout region in a first dimension which is perpendicular to the first edge orientation, so as to encounter first physical endpoints of the physical edges having the first orientation, at least some of the first physical endpoints coinciding with respective first derived endpoints of derived edges derived for the particular derived layer in dependence upon the particular derivation operator;
in response to encountering each of at least a first subset of at least two of the first physical endpoints which coincide with respective ones of the first derived endpoints, populating a layout topology database with values in dependence upon the respective first endpoint location, including values in dependence upon derived edges in the particular derived layer;
scanning the layout region in a second dimension which is perpendicular to the second edge orientation, so as to encounter second physical endpoints of the physical edges having the second orientation, at least some of the second physical endpoints coinciding with respective second derived endpoints of derived edges derived for the particular derived layer in dependence upon the particular derivation operator;
in response to encountering each of at least a second subset of at least two of the second physical endpoints which coincide with respective ones of the second derived endpoints, populating the layout topology database with values in dependence upon the respective second endpoint location, including values in dependence upon derived edges in the particular derived layer; and
after the layout topology database has been populated with values in dependence upon the first endpoint location of all physical endpoints in the first subset of endpoints, and values in dependence upon the second endpoint location of all physical endpoints in the second subset of endpoints, comparing values in the layout topology database to values in the particular design rule to detect any violations; and
where a design rule violation is detected, reporting it to a user.

61. A system for checking a set of layout design rules on a region of an integrated circuit layout, the layout including a plurality of physical shapes each specific to a layer of the layout and each having layout corners at respective locations in the layout, comprising:
a computer system having access to a design rule data set indicating a particular derivation operator for deriving derived shape information for a particular derived layer in dependence upon at least two of the layout layers,
the design rule data set further indicating constraint values of design rules in the data set including a particular design rule referencing the particular derived layer,
the computer system further having access to computer instructions and data which, when applied to the computer system, perform the steps of:
deriving shape information for the particular derived layer in dependence upon the particular derivation operator, the derived shape information indicating a plurality of derived corner locations in the particular derived layer;
traversing a plurality of shape corners in the region including the plurality of derived corners;
for each given corner in at least a subset of the derived corners traversed, populating a layout topology database with values in dependence upon the respective corner location, including writing values into a data structure associated with the respective given derived corner; and
comparing values in the layout topology database to values in the particular design rule to detect any violations.

62. A system according to claim 61, wherein the subset of derived corners traversed includes at least two derived corners.

63. A system according to claim 61, wherein the plurality of shape corners traversed includes at least one shape corner that is not a derived corner,
and wherein the computer instructions and data, when applied to the computer system, further perform the step of:
for each particular corner in at least a subset of the corners traversed which are not derived corners, populating the layout topology database with values in dependence upon the respective corner location, including writing values into a data structure associated with the respective particular corner.

64. The system according to claim 61, wherein the values for the derived corner include an indication of two edges which meet at the derived corner location.

65. The system according to claim 61, wherein the values for the given derived corner include an indication of the nearest derived edge oriented in a first dimension, walking perpendicularly to the first dimension in the particular derived layer along a derived shape contour from the given derived corner.

66. The system according to claim 61, wherein the values for the given derived corner include an indication of the nearest facing derived edge that is oriented in a first dimension, walking perpendicularly to the first dimension in the particular derived layer along a derived shape contour from the given derived corner.

67. The system according to claim 61, wherein the given derived corner is a corner of a derived shape, and wherein the values for the given derived corner include an indication of the last edge that is oriented in a first dimension, walking perpendicularly to the first dimension in the particular derived layer and into the derived shape from the given derived corner, before exiting the derived shape.

68. The system according to claim 61, wherein comparing values in the layout topology database to values in the particular design rule comprises:

traversing at least a portion of the values in the layout topology database;

calculating layout values in dependence upon the values in the layout topology database; and comparing the calculated layout values to one or more values in the design rule data set.

69. The system according to claim 61, wherein the traversing is performed in response to a user selecting a set of at least one of the shapes in the plurality of physical shapes, and with a pointing device indicating a drag operation of the selected shapes to a modified position in the layout, and wherein the computer instructions and data, when applied to the computer system, further report a design rule violation to a user before the user terminates the drag operation.

70. The system according to claim 69, wherein the computer instructions and data, when applied to the computer system, report the design rule violation to the user visually.

71. The system according to claim 61, wherein the computer instructions and data, when applied to the computer system, further check an additional layout design rule which references the particular derived layer.

72. A system for checking a set of layout design rules on a region of an integrated circuit layout, the layout including a plurality of physical shapes each specific to a layer of the layout and each having layout corners at respective locations in the layout, comprising:

a computer system having access to a design rule data set indicating a particular derivation operator for deriving derived shape information for a particular derived layer in dependence upon at least two of the layout layers, the design rule data set further indicating constraint values of design rules in the data set including a particular design rule referencing the particular derived layer, the computer system further having access to computer instructions and data which, when applied to the computer system, perform the steps of:

deriving shape information for the particular derived layer in dependence upon the particular derivation operator, the derived shape information describing a derived island on the particular derived layer and indicating at least one derived corner location of the derived island, the derived island having a derived island data structure associated therewith;

traversing a plurality of shape corners in the region including the derived corner;

for each corner in at least a subset of the corners traversed, populating a layout topology database with values in dependence upon the respective corner location, including, for the derived corner, writing or updating a value in the derived island data structure in dependence upon the derived corner location; and comparing values in the layout topology database to values in the particular design rule to detect any violations.

73. The system according to claim 72, wherein writing or updating a value in the derived island data structure comprises accumulating an area value for the derived island.

74. The system according to claim 73, wherein the step of for each corner in at least a subset of the corners traversed, populating a layout topology database with values in dependence upon the respective corner location, further comprises traversing a plurality of island corners on the particular derived layer monotonically in at least one dimension.

75. The system according to claim 72, wherein the traversing is performed in response to a user selecting a set of at least one of the shapes in the plurality of physical shapes, and with a pointing device indicating a drag operation of the selected shapes to a modified position in the layout, and wherein the computer instructions and data, when applied to the computer system, further report a design rule violation to a user before the user terminates the drag operation.

76. The system according to claim 75, wherein the computer instructions and data, when applied to the computer system, report the design rule violation to the user visually.

77. The system according to claim 72, wherein the computer instructions and data, when applied to the computer system, further check an additional layout design rule which references the particular derived layer.

* * * * *